US012811578B2

(12) United States Patent
Saegusa et al.

(10) Patent No.: US 12,811,578 B2
(45) Date of Patent: Nov. 24, 2026

(54) POWER SUPPLY CIRCUIT, SIGNAL TRANSMISSION DEVICE, ELECTRONIC DEVICE AND VEHICLE

(71) Applicant: ROHM CO., LTD., Kyoto (JP)

(72) Inventors: Yuji Saegusa, Kyoto (JP); Masahiko Arimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 19/236,296

(22) Filed: Jun. 12, 2025

(65) Prior Publication Data

US 2025/0309885 A1 Oct. 2, 2025

Related U.S. Application Data

(63) Continuation of application No. PCT/JP2023/041492, filed on Nov. 17, 2023.

(30) Foreign Application Priority Data

Dec. 19, 2022 (JP) ................................ 2022-201957

(51) Int. Cl.

*H03K 17/082* (2006.01)
*H10D 1/20* (2025.01)
*H10D 80/30* (2025.01)
*H10D 84/00* (2025.01)

(52) U.S. Cl.

CPC ............. *H03K 17/082* (2013.01); *H10D 1/20* (2025.01); *H10D 80/30* (2025.01); *H10D 84/201* (2025.01); *H03K 2217/0027* (2013.01)

(58) Field of Classification Search

CPC .... H03K 17/082; H10D 80/30; H10D 84/201; H10D 1/20

USPC ........................................................ 327/190

See application file for complete search history.

(56) References Cited

U.S. PATENT DOCUMENTS

2023/0327662 A1 10/2023 Kikuchi et al.
2023/0353144 A1 * 11/2023 Yanagishima ....... H03K 17/691

FOREIGN PATENT DOCUMENTS

WO 2022018959 A1 1/2022
WO 2022070944 A1 4/2022

OTHER PUBLICATIONS

International Search Report for International Application No. PCT/JP2023/041492; mailed Jan. 30, 2023.
PCT Written Opinion of the International Searching Authority for International Application No. PCT/JP2023/041492; mailed Jan. 30, 2023.

* cited by examiner

*Primary Examiner* — Tomi Skibinski
(74) *Attorney, Agent, or Firm* — CANTOR COLBURN LLP

(57) ABSTRACT

A power supply circuit includes: a feedback control circuit configured to control a switch output stage for generating an output voltage of a secondary circuit system from an input voltage of a primary circuit system while isolating between the primary circuit system and the secondary circuit system; and an overcurrent protection circuit configured to restrict a sense voltage corresponding to a primary current of the switch output stage to a predetermined overcurrent detection value or less. The overcurrent protection circuit stepwise increases the overcurrent detection value over a soft start period when a second power supply voltage is started or restarted.

10 Claims, 21 Drawing Sheets

POWER SUPPLY CIRCUIT, SIGNAL TRANSMISSION DEVICE, ELECTRONIC DEVICE AND VEHICLE

CROSS-REFERENCE TO RELATED APPLICATIONS

This application is a continuation under 35 U.S.C. § 120 of PCT/JP2023/041492 filed on Nov. 17, 2023, which is incorporated herein by reference, and which claimed priority to Japanese Patent Application No. 2022-201957 filed on Dec. 19, 2022. The present application likewise claims priority under 35 U.S.C. § 119 to Japanese Patent Application No. 2022-201957 filed on Dec. 19, 2022, the entire contents of which is also incorporated herein by reference.

TECHNICAL FIELD

The present disclosure relates to a power supply circuit, a signal transmission device, an electronic device and a vehicle.

BACKGROUND ART

Conventionally, a signal transmission device which transmits signals between a primary circuit system and a secondary circuit system while electrically isolating between the primary circuit system and the secondary circuit system is used in various applications (such as a power supply device and a motor driving device).

As an example of conventional technology related to the technique described above, Patent Document 1 disclosed by the present applicant can be mentioned.

CITATION LIST

Patent Literature

Patent Document 1: International Publication No. 2022/070944

DESCRIPTION OF EMBODIMENTS

<Signal Transmission Device (Basic Configuration)>

Figure 1:
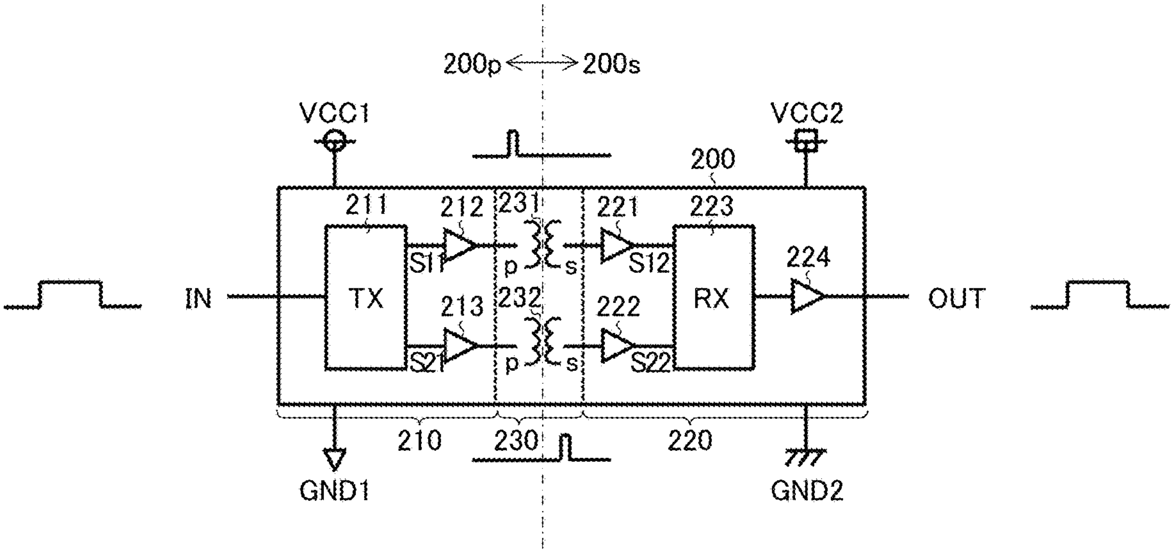
FIG. 1 is a diagram illustrating the basic configuration of a signal transmission device.

FIG. 1 is a diagram illustrating the basic configuration of a signal transmission device. The signal transmission device 200 of this configuration example is a semiconductor integrated circuit device (what is generally called an isolated gate driver IC) that, while isolating between a primary circuit system 200*p* (VCC1-GND1 system) and a secondary circuit system 200*s* (VCC2-GND2 system), transmits a pulse signal from the primary circuit system 200*p* to the secondary circuit system 200*s* to drive the gate of a switching device (unillustrated) provided in the secondary circuit system 200*s*. The signal transmission device 200 has, for example, a controller chip 210, a driver chip 220, and a transformer chip 230 sealed in a single package.

The controller chip 210 is a semiconductor chip that operates by being supplied with a supply voltage VCC1 (e.g., seven volts at the maximum with respect to GND1). The controller chip 210 has, for example, a pulse transmission circuit 211 and buffers 212 and 213 integrated in it.

The pulse transmission circuit 211 is a pulse generator that generates transmission pulse signals S11 and S21 according to an input pulse signal IN. More specifically, when indicating that the input pulse signal IN is at high level, the pulse transmission circuit 211 pulse-drives (outputs a single or a plurality of pulses in) the transmission pulse signal S11; when indicating that the input pulse signal IN is at low level, the pulse transmission circuit 211 pulse-drives the transmission pulse signal S21. That is, the pulse transmission circuit 211 pulse-drives either the transmission pulse signal S11 or S21 according to the logic level of the input pulse signal IN.

The buffer 212 receives the transmission pulse signal S11 from the pulse transmission circuit 211, and pulse-drives the transformer chip 230 (more specifically, a transformer 231).

The buffer 213 receives the transmission pulse signal S21 from the pulse transmission circuit 211, and pulse-drives the transformer chip 230 (more specifically, a transformer 232).

The driver chip 220 is a semiconductor chip that operates by being supplied with a supply voltage VCC2 (e.g., 30 volts at the maximum with respect to GND2). The driver chip 220 has, for example, buffers 221 and 222, a pulse reception circuit 223, and a driver 224 integrated in it.

The buffer 221 performs waveform shaping on a reception pulse signal S12 induced in the transformer chip 230 (specifically, the transformer 231), and outputs the result to the pulse reception circuit 223.

The buffer 222 performs waveform shaping on a reception pulse signal S22 induced in the transformer chip 230 (specifically, the transformer 232), and outputs the result to the pulse reception circuit 223.

According to the reception pulse signals S12 and S22 fed to it via the buffers 221 and 222, the pulse reception circuit 223 drives the driver 224 to generate an output pulse signal OUT. More specifically, the pulse reception circuit 223 drives the driver 224 to raise the output pulse signal OUT to high level in response to the reception pulse signal S12 being pulse-driven and to drop the output pulse signal OUT to low level in response to the reception pulse signal S22 being pulse-driven. That is, the pulse reception circuit 223 switches the logic level of the output pulse signal OUT according to the logic level of the input pulse signal IN. As the pulse reception circuit 223, for example, an RS flip-flop can be suitably used.

The driver 224 generates the output pulse signal OUT under the driving and control of the pulse reception circuit 223.

The transformer chip 230, while isolating between the controller chip 210 and the driver chip 220 on a direct-current basis using the transformers 231 and 232, outputs the transmission pulse signals S11 and S21 fed to the transformer chip 230 from the pulse transmission circuit 211 to, as the reception pulse signals S12 and S22, the pulse reception circuit 223. In the present description, "isolating on a direct-current basis" means leaving two elements to be isolated from each other unconnected by a conductor.

More specifically, the transformer 231 outputs, according to the transmission pulse signal S11 fed to the primary coil 231*p*, the reception pulse signal S12 from the secondary coil 231*s*. Likewise, the transformer 232 outputs, according to the transmission pulse signal S21 fed to the primary coil 232*p*, the reception pulse signal S22 from the secondary coil 232*s*.

In this way, owing to the characteristics of spiral coils used in isolated communication, the input pulse signal IN is split into two transmission pulse signals S11 and S21 (corresponding to a rise signal and a fall signal) to be transmitted via the two transformers 231 and 232 from the primary circuit system 200*p* to the secondary circuit system 200*s*.

Note that the signal transmission device 200 of this configuration example has, separately from the controller chip 210 and the driver chip 220, the transformer chip 230 that incorporates the transformers 231 and 232 alone, and those three chips are sealed in a single package.

With this configuration, the controller chip 210 and the driver chip 220 can each be formed by a common low- to middle-withstand-voltage process (with a withstand voltage of several volts to several tens of volts). This eliminates the need for a dedicated high-withstand-voltage process (with a withstand voltage of several kilovolts) and helps reduce manufacturing costs.

The signal transmission device 200 can be employed suitably, for example, in a power supply device or motor driving device in a vehicle-mounted device incorporated in a vehicle. Such a vehicle can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

<Transformer Chip (Basic Structure)>

Figure 2:
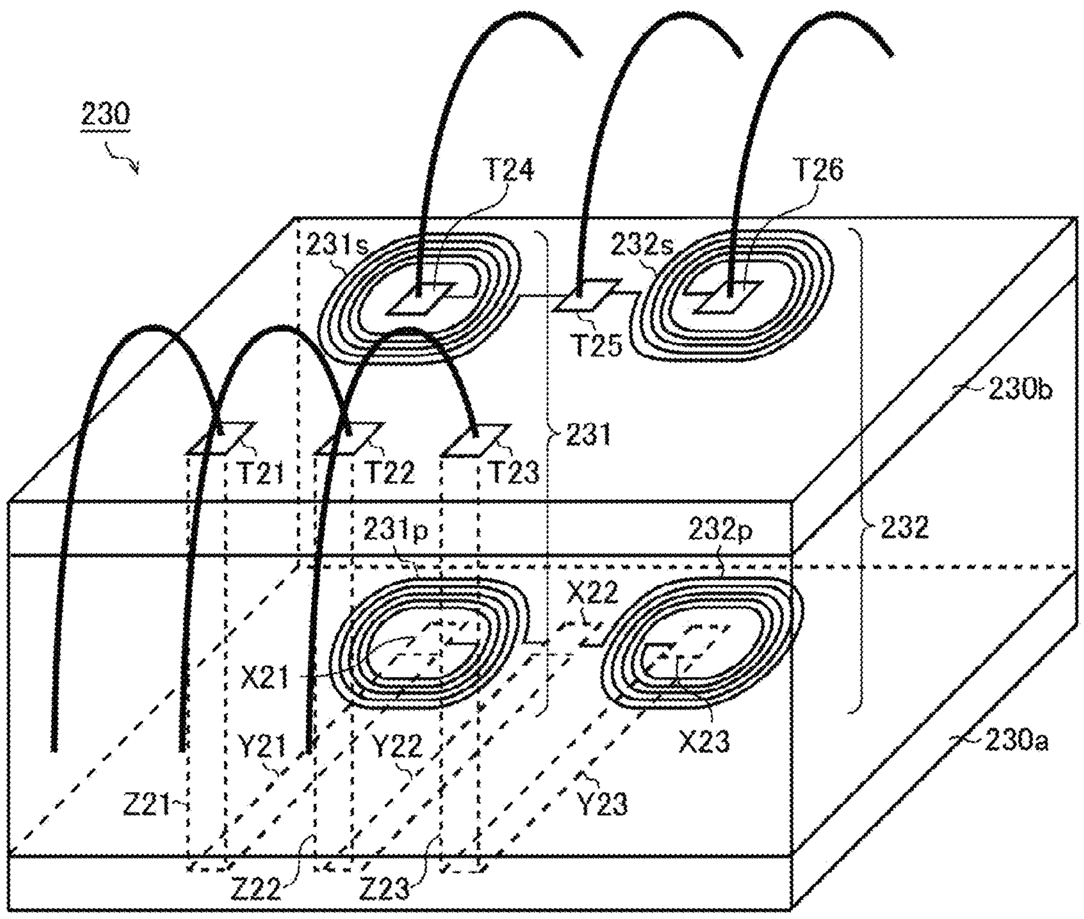
FIG. 2 is a diagram illustrating the basic structure of a transformer chip.

Next, the basic structure of the transformer chip 230 will be described. FIG. 2 is a diagram showing the basic structure of the transformer chip 230. In the transformer chip 230 shown there, the transformer 231 includes a primary coil 231*p* and a secondary coil 231*s* that face each other in the up-down direction; the transformer 232 includes a primary coil 232*p* and a secondary coil 232*s* that face each other in the up-down direction.

The primary coils 231*p* and 232*p* are both formed in a first wiring layer (lower layer) 230*a* in the transformer chip 230. The secondary coils 231*s* and 232*s* are both formed in a second wiring layer (the upper layer in the diagram) 230*b* in the transformer chip 230. The secondary coil 231*s* is disposed right above the primary coil 231*p* and faces the primary coil 231*p*; the secondary coil 232*s* is disposed right above the primary coil 232*p* and faces the primary coil 232*p*.

The primary coil 231*p* is laid in a spiral shape so as to encircle an internal terminal X21 clockwise, starting at the first terminal of the primary coil 231*p*, which is connected to the internal terminal X21. The second terminal of the primary coil 231*p*, which corresponds to its end point, is connected to an internal terminal X22. Likewise, the primary coil 232*p* is laid in a spiral shape so as to encircle an internal terminal X23 anticlockwise, starting at the first terminal of the primary coil 232*p*, which is connected to the internal terminal X23. The second terminal of the primary coil 232*p*, which corresponds to its end point, is connected to the internal terminal X22. The internal terminals X21, X22, and X23 are arrayed on a straight line in the illustrated order.

The internal terminal X21 is connected, via a wiring Y21 and a via Z21 both conductive, to an external terminal T21 in the second layer 230*b*. The internal terminal X22 is connected, via a wiring Y22 and a via Z22 both conductive, to an external terminal T22 in the second layer 230*b*. The internal terminal X23 is connected, via a wiring Y23 and a via Z23 both conductive, to an external terminal T23 in the second layer 230*b*. The external terminals T21 to T23 are disposed in a straight row and are used for wire-bonding with the controller chip 210.

The secondary coil 231*s* is laid in a spiral shape so as to encircle an external terminal T24 anticlockwise, starting at the first terminal of the secondary coil 231*s*, which is connected to the external terminal T24. The second terminal of the secondary coil 231*s*, which corresponds to its end point, is connected to an external terminal T25. Likewise, the secondary coil 232*s* is laid in a spiral shape so as to encircle an external terminal T26 clockwise, starting at the first terminal of the secondary coil 232*s*, which is connected to the external terminal T26. The second terminal of the secondary coil 232*s*, which corresponds to its end point, is connected to the external terminal T25. The external terminals T24, T25, and T26 are disposed in a straight row in the illustrated order and are used for wire-bonding with the driver chip 220.

The secondary coils 231*s* and 232*s* are AC-connected to the primary coils 231*p* and 232*p*, respectively, by magnetic coupling, and are DC-isolated from the primary coils 231*p* and 232*p*. That is, the driver chip 220 is AC-connected to the controller chip 210 via the transformer chip 230 and is DC-isolated from the controller chip 210 by the transformer chip 230.

<Transformer Chip (Two-Channel Type)>

Figure 3:
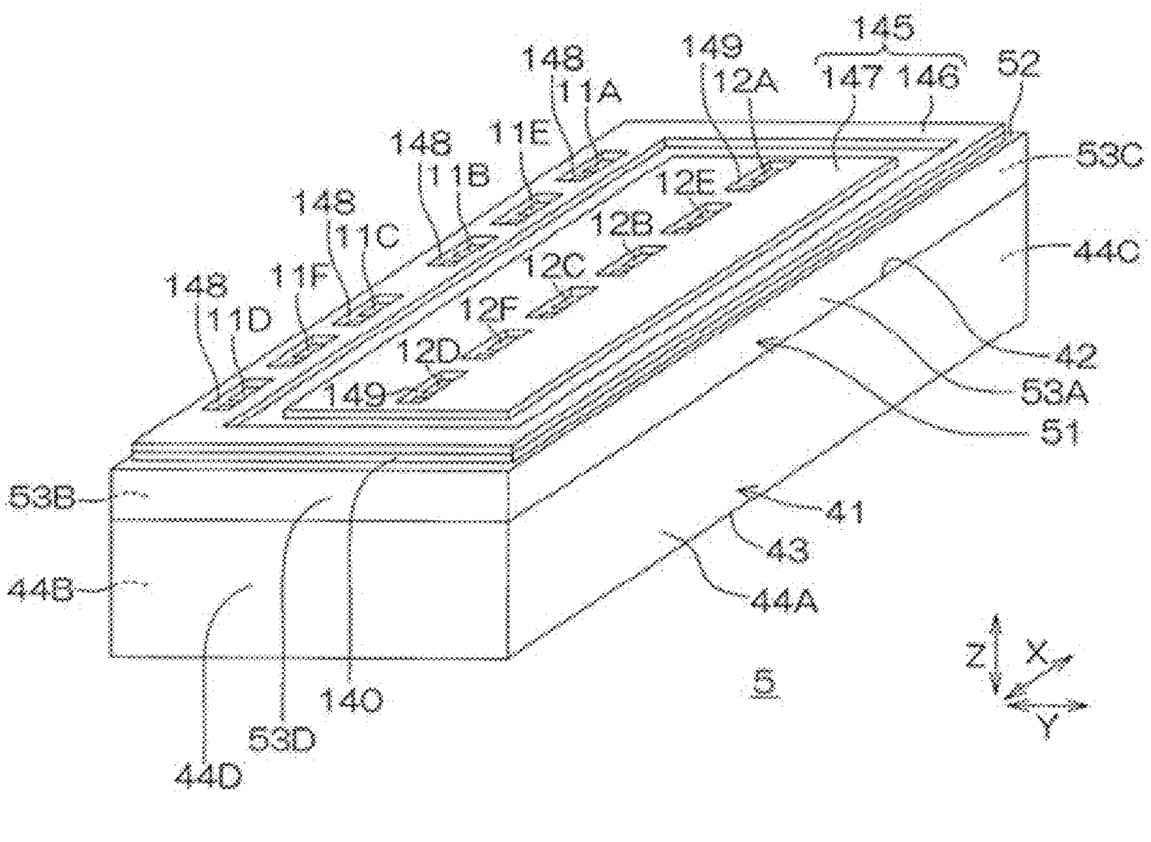
FIG. 3 is a perspective view of a semiconductor device used as a two-channel transformer chip.
Figure 4:
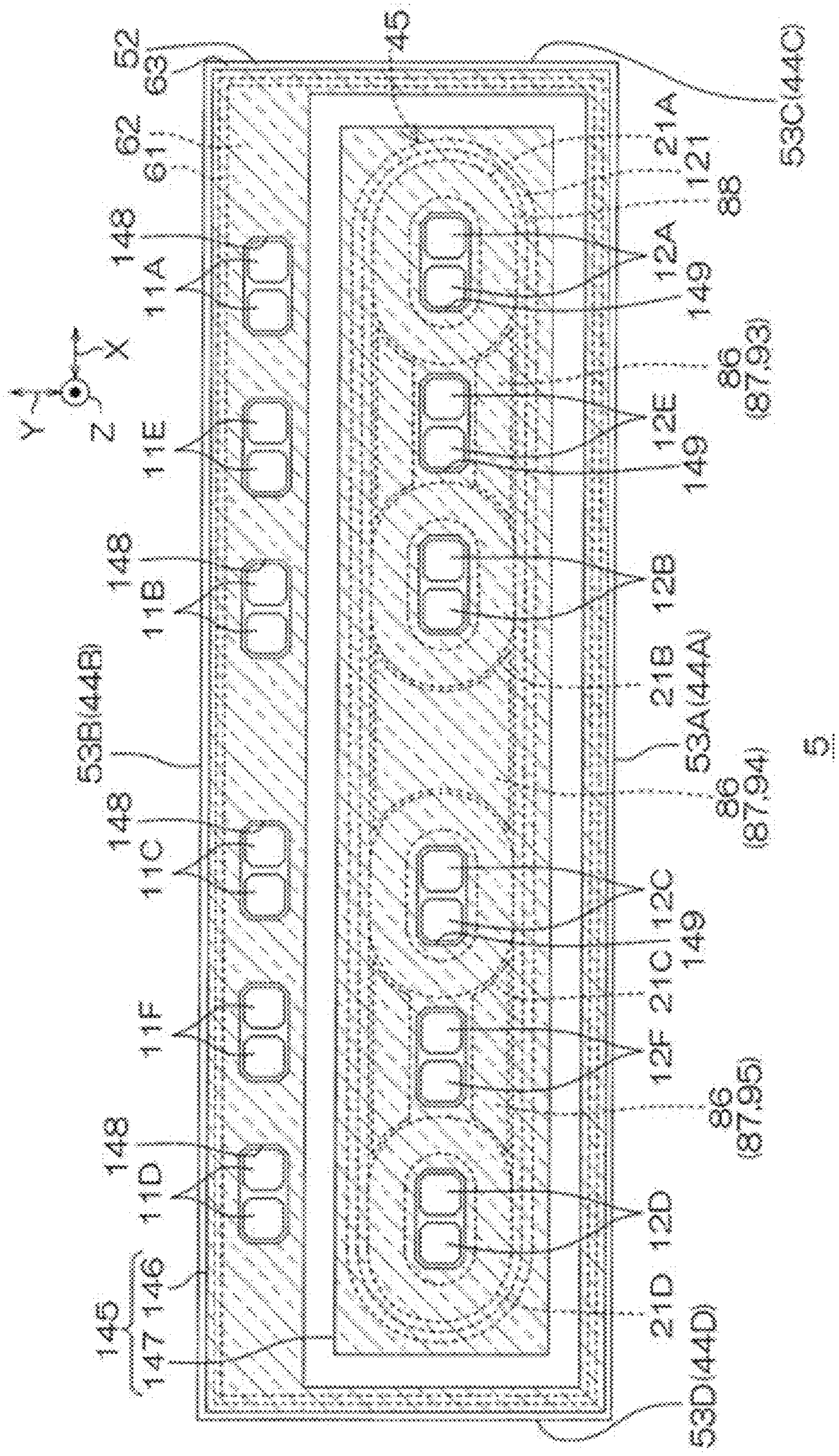
FIG. 4 is a plan view of the semiconductor device shown in FIG. 3.
Figure 5:
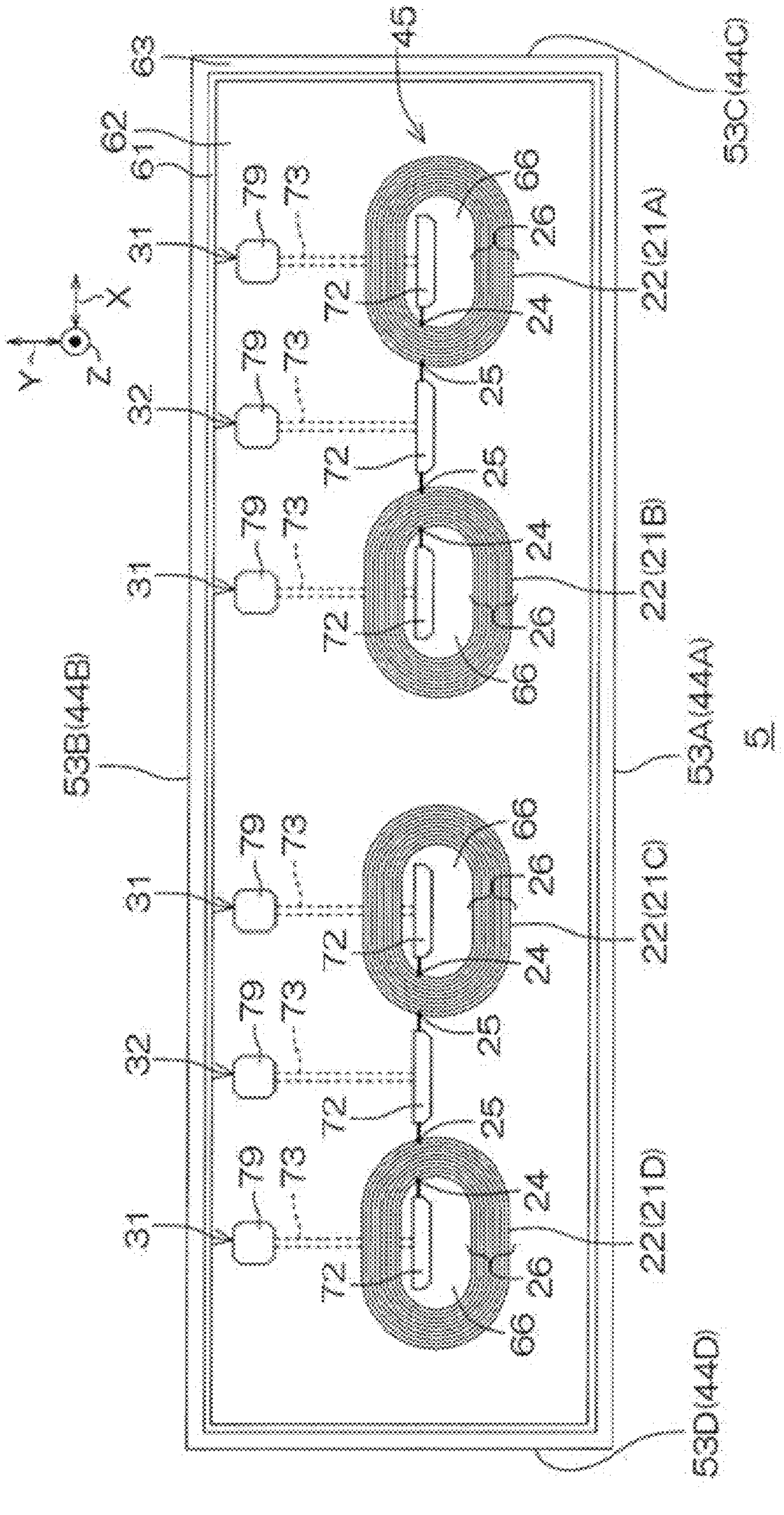
FIG. 5 is a plan view of a layer in the semiconductor device shown in FIG. 3 where low-potential coils are formed.
Figure 6:
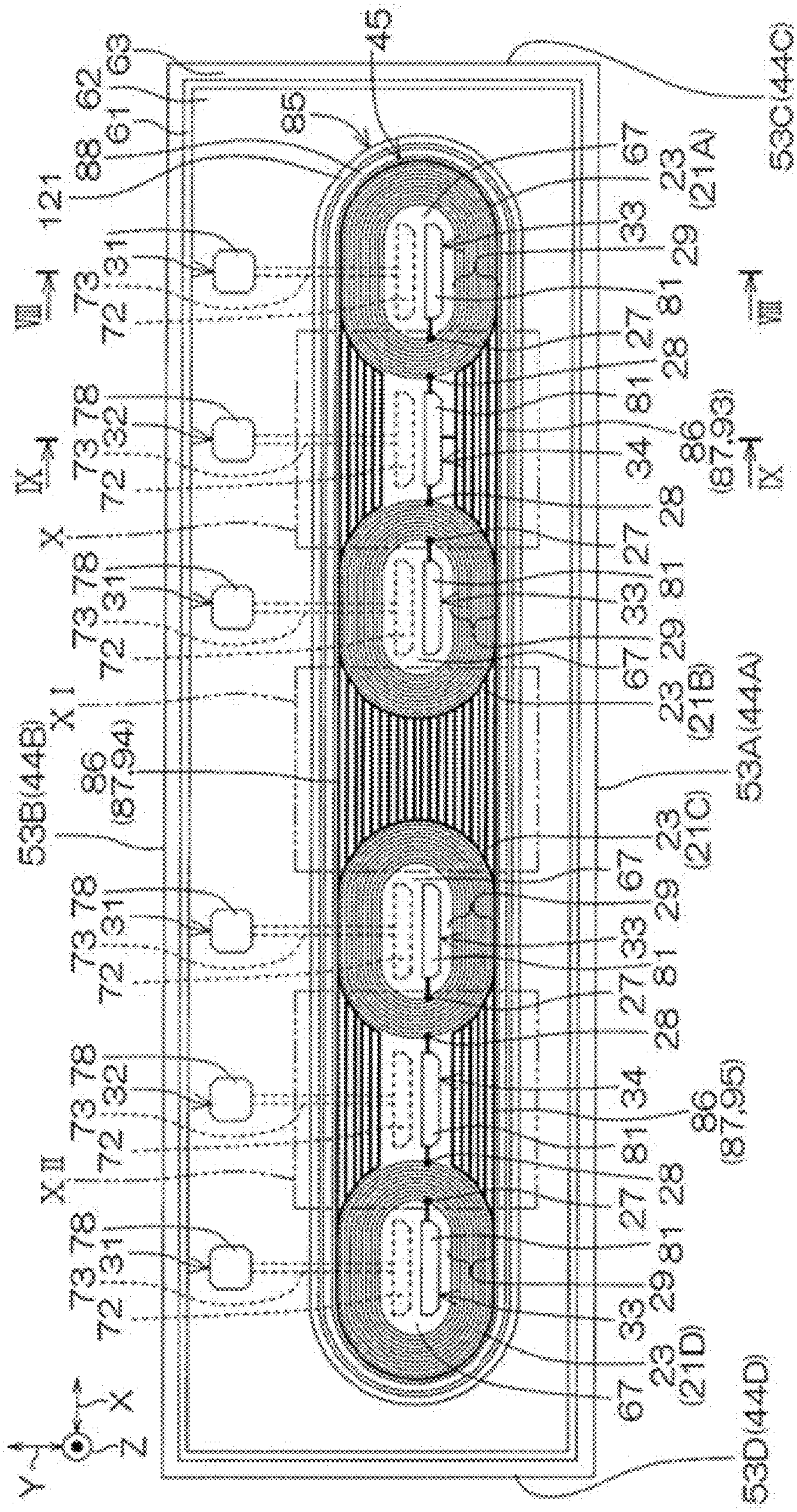
FIG. 6 is a plan view of a layer in the semiconductor device shown in FIG. 3 where high-potential coils are formed.
Figure 7:
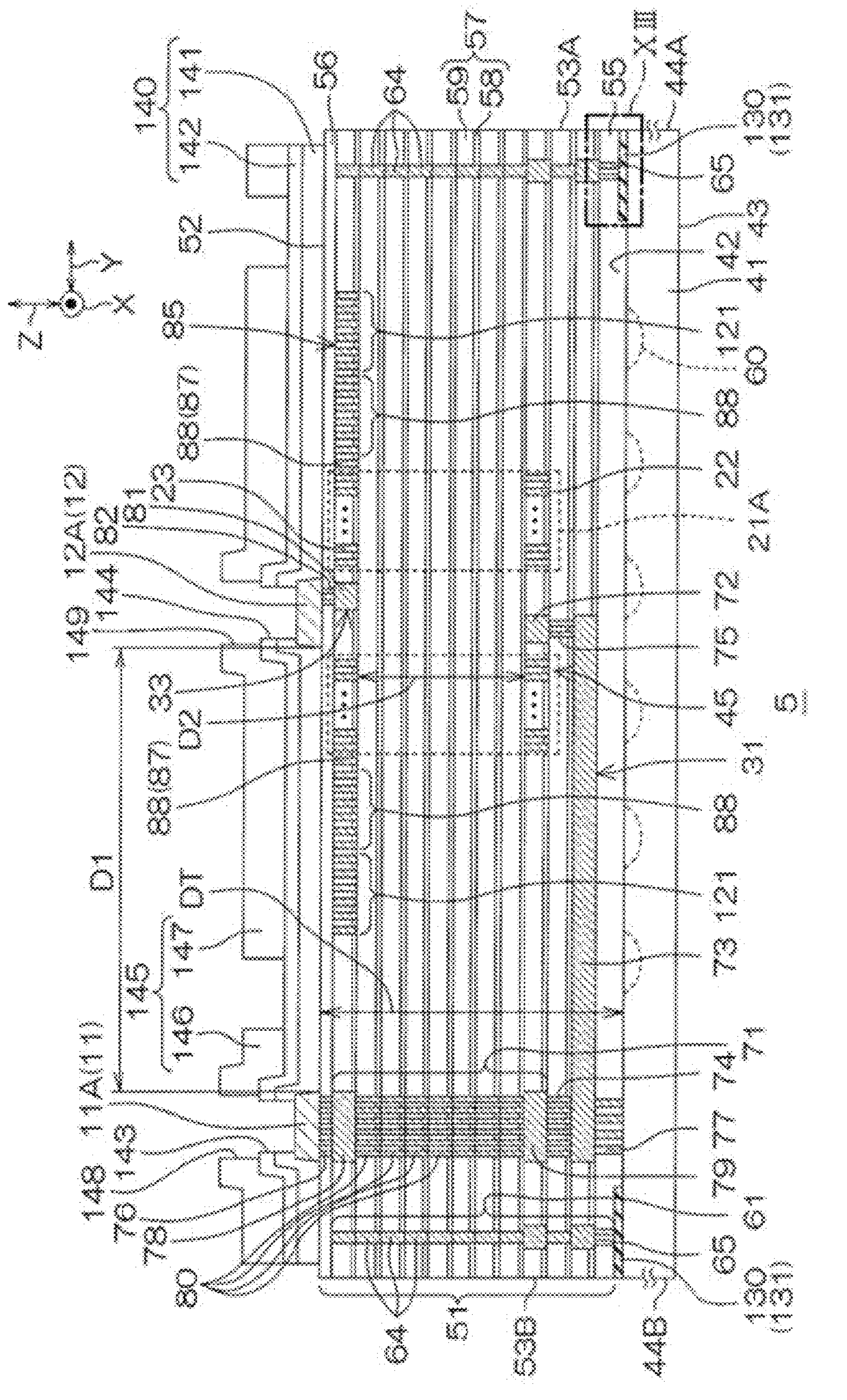
FIG. 7 is a cross-sectional view taken along line VIII-VIII shown in FIG. 6.
Figure 8:
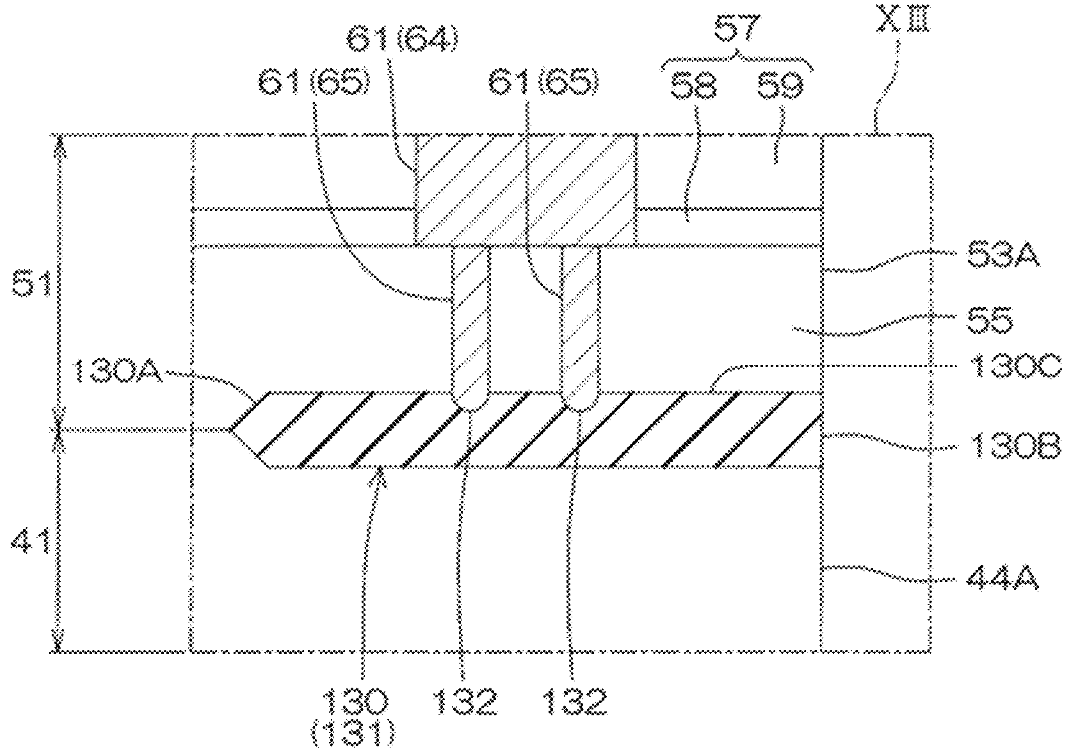
FIG. 8 is an enlarged view (showing a separation structure) of region XIII shown in FIG. 7.

FIG. 3 is a perspective view of a semiconductor device 5 used as a two-channel transformer chip. FIG. 4 is a plan view of the semiconductor device 5 shown in FIG. 3. FIG. 5 is a plan view showing a layer in the semiconductor device 5 shown in FIG. 3 where low-potential coils 22 (corresponding to the primary coils of transformers) are formed. FIG. 6 is a plan view showing a layer in the semiconductor device 5 shown in FIG. 3 where high-potential coils 23 (corresponding to the secondary coils of transformers) are formed. FIG. 7 is a sectional view along line VIII-VIII shown in FIG. 6. FIG. 8 is an enlarged view of region XIII shown in FIG. 7, which shows a separation structure 130.

Referring to FIG. 3 to FIG. 7, the semiconductor device 5 includes a semiconductor chip 41 in the shape of a rectangular parallelepiped. The semiconductor chip 41 contains at least one of silicon, a wide band gap semiconductor, and a compound semiconductor.

The wide band gap semiconductor is a semiconductor with a band gap larger than that of silicon (about 1.12 eV). Preferably, the wide band gap semiconductor has a band gap of 2.0 eV or more. The wide band gap semiconductor can be SiC (silicon carbide). The compound semiconductor can be a III-V group compound semiconductor. The compound semiconductor can contain at least one of aluminum nitride (AlN), indium nitride (InN), gallium nitride (GaN), and gallium arsenide (GaAs).

In the embodiment, the semiconductor chip 41 includes a semiconductor substrate made of silicon. The semiconductor chip 41 can be an epitaxial substrate that has a stacked structure composed of a semiconductor substrate made of silicon and an epitaxial layer made of silicon. The semiconductor substrate can be of an n-type or p-type conductivity. The epitaxial layer can be of an n-type or p-type.

The semiconductor chip 41 has a first principal surface 42 at one side, a second principal surface 43 at the other side, and chip side walls 44A to 44D that connect the first and second principal surfaces 42 and 43 together. As seen in a plan view from the normal direction Z to them (hereinafter simply expressed as "as seen in a plan view"), the first and second principal surfaces 42 and 43 are each formed in a quadrangular shape (in the embodiment, in a rectangular shape).

The chip side walls 44A to 44D include a first chip side wall 44A, a second chip side wall 44B, a third chip side wall 44C, and a fourth chip side wall 44D. The first and second chip side walls 44A and 44B constitute the longer sides of the semiconductor chip 41. The first and second chip side walls 44A and 44B extend along a first direction X and face away from each other in a second direction Y. The third and fourth chip side walls 44C and 44D constitute the shorter sides of the semiconductor chip 41. The third and fourth chip side walls 44C and 44D extend in the second direction Y and face away from each other in the first direction X. The chip side walls 44A to 44D have polished surfaces.

The semiconductor device 5 further includes an insulation layer 51 formed on the first principal surface 42 of the semiconductor chip 41. The insulation layer 51 has an insulation principal surface 52 and insulation side walls 53A to 53D. The insulation principal surface 52 is formed in a quadrangular shape (in the embodiment, a rectangular shape) that fits the first principal surface 42 as seen in a plan view. The insulation principal surface 52 extends parallel to the first principal surface 42.

The insulation side walls 53A to 53D include a first insulation side wall 53A, a second insulation side wall 53B, a third insulation side wall 53C, and a fourth insulation side wall 53D. The insulation side walls 53A to 53D extend from the circumferential edge of the insulation principal surface 52 toward the semiconductor chip 41 and are continuous with the chip side walls 44A to 44D. Specifically, the insulation side walls 53A to 53D are formed to be flush with the chip side walls 44A to 44D. The insulation side walls 53A to 53D constitute polished surfaces that are flush with the chip side walls 44A to 44D.

The insulation layer 51 has a stacked structure of multilayer insulation layers that include a bottom insulation layer 55, a top insulation layer 56, and a plurality of (in the embodiment, eleven) interlayer insulation layers 57. The bottom insulation layer 55 is an insulation layer that directly covers the first principal surface 42. The top insulation layer 56 is an insulation layer that constitutes the insulation principal surface 52. The plurality of interlayer insulation layers 57 are insulation layers that are interposed between the bottom and top insulation layers 55 and 56. In the embodiment, the bottom insulation layer 55 has a single-layer structure that contains silicon oxide. In the embodiment, the top insulation layer 56 has a single-layer structure that contains silicon oxide. The bottom and top insulation layers 55 and 56 can each have a thickness of 1 μm or more but 3 μm or less (e.g., about 2 μm).

The plurality of interlayer insulation layers 57 each have a stacked structure that includes a first insulation layer 58 at the bottom insulation layer 55 side and a second insulation layer 59 at the top insulation layer 56 side. The first insulation layer 58 can contain silicon nitride. The first insulation layer 58 is formed as an etching stopper layer for the second insulation layer 59. The first insulation layer 58 can have a thickness of 0.1 μm or more but 1 μm or less (e.g., about 0.3 μm).

The second insulation layer 59 is formed on top of the first insulation layer 58 and contains an insulating material different from that of the first insulation layer 58. The second insulation layer 59 can contain silicon oxide. The second insulation layer 59 can have a thickness of 1 μm or more but 3 μm or less (e.g., about 2 μm). Preferably, the second insulation layer 59 is given a thickness larger than that of the first insulation layer 58.

The insulation layer 51 can have a total thickness DT of 5 μm or more but 50 μm or less. The insulation layer 51 can have any total thickness DT and any number of interlayer insulation layers 57 stacked together, which are adjusted according to the desired dielectric strength voltage (dielectric breakdown withstand voltage). The bottom insulation layer 55, the top insulation layer 56, and the interlayer insulation layers 57 can employ any insulating material, which is thus not limited to any particular insulating material.

The semiconductor device 5 includes a first functional device 45 formed in the insulation layer 51. The first functional device 45 includes one or a plurality of (in the embodiment, a plurality of) transformers 21 (corresponding to the transformers mentioned previously). That is, the semiconductor device 5 is a multichannel device that includes a plurality of transformers 21. The plurality of transformers 21 are formed in an inner part of the insulation layer 51, at intervals from the insulation side walls 53A to 53D. The plurality of transformers 21 are formed at intervals from each other in the first direction X.

Specifically, the plurality of transformers 21 include a first transformer 21A, a second transformer 21B, a third transformer 21C, and a fourth transformer 21D that are formed in this order from the insulation side wall 53C side to the insulation side wall 53D side as seen in a plan view. The plurality of transformers 21A to 21D have similar structures. In the following description, the structure of the first transformer 21A will be described as an example. No separate description will be given of the structures of the second, third, and fourth transformers 21B, 21C, and 21D, to which the description of the structure of the first transformer 21A is to be taken to apply.

Referring to FIGS. 5 to 7, the first transformer 21A includes a low-potential coil 22 and a high-potential coil 23. The low-potential coil 22 is formed in the insulation layer 51. The high-potential coil 23 is formed in the insulation layer 51 so as to face the low-potential coil 22 in the normal direction Z. In the embodiment, the low- and high-potential coils 22 and 23 are formed in a region between the bottom and top insulation layers 55 and 56 (i.e., in the plurality of interlayer insulation layers 57).

The low-potential coil 22 is formed in the insulation layer 51, at the bottom insulation layer 55 (semiconductor chip 41) side, and the high-potential coil 23 is formed in the insulation layer 51, at the top insulation layer 56 (insulation principal surface 52) side with respect to the low-potential coil 22. That is, the high-potential coil 23 faces the semiconductor chip 41 across the low-potential coil 22. The low- and high-potential coils 22 and 23 can be disposed at any places. The high-potential coil 23 can face the low-potential coil 22 across one or more interlayer insulation layers 57.

The distance between the low- and high-potential coils 22 and 23 (i.e., the number of interlayer insulation layers 57 stacked together) is adjusted appropriately according to the dielectric strength voltage and electric field strength between the low- and high-potential coils 22 and 23. In the embodiment, the low-potential coil 22 is formed in the third interlayer insulation layer 57 as counted from the bottom insulation layer 55 side. In the embodiment, the high-potential coil 23 is formed in the first interlayer insulation layer 57 as counted from the top insulation layer 56 side.

The low-potential coil 22 is embedded in the interlayer insulation layer 57 so as to penetrate the first and second insulation layers 58 and 59. The low-potential coil 22 includes a first inner end 24, a first outer end 25, and a first spiral portion 26 that is patterned in a spiral shape between the first inner and outer ends 24 and 25. The first spiral portion 26 is patterned in a spiral shape that extends in an elliptical (oval) shape as seen in a plan view. The part of the first spiral portion 26 that forms its inner circumferential edge defines a first inner region 66 that is in an elliptical shape as seen in a plan view.

The first spiral portion 26 can have a number of turns of 5 or more but 30 or less. The first spiral portion 26 can have a width of 0.1 μm or more but 5 μm or less. Preferably, the first spiral portion 26 has a width of 1 μm or more but 3 μm or less. The width of the first spiral portion 26 is defined by its width in the direction orthogonal to the spiraling direction. The first spiral portion 26 has a first winding pitch of 0.1 μm or more but 5 μm or less. Preferably, the first winding pitch is 1 μm or more but 3 μm or less. The first winding pitch is defined by the distance between two parts of the first spiral portion 26 that are adjacent to each other in the direction orthogonal to the spiraling direction.

The first spiral portion 26 can have any winding shape and the first inner region 66 can have any planar shape, which are thus not limited to those shown in FIG. 5 etc. The first spiral portion 26 can be wound in a polygonal shape, such as a triangular or quadrangular shape, or in a circular shape as seen in a plan view. The first inner region 66 can be defined, so as to fit the winding shape of the first spiral portion 26, in a polygonal shape, such as a triangular or quadrangular shape, or in a circular shape as seen in a plan view.

The low-potential coil 22 can contain at least one of titanium, titanium nitride, copper, aluminum, and tungsten. The low-potential coil 22 can have a stacked structure composed of a barrier layer and a body layer. The barrier layer defines a recessed space in the interlayer insulation layer 57. The barrier layer can contain at least one of titanium and titanium nitride. The body layer can contain at least one of copper, aluminum, and tungsten.

The high-potential coil 23 is embedded in the interlayer insulation layer 57 so as to penetrate the first and second insulation layers 58 and 59. The high-potential coil 23 includes a second inner end 27, a second outer end 28, and a second spiral portion 29 that is patterned in a spiral shape between the second inner and outer ends 27 and 28. The second spiral portion 29 is patterned in a spiral shape that extends in an elliptical (oval) shape as seen in a plan view. The part of the second spiral portion 29 that forms its inner circumferential edge defines a second inner region 67 that is in an elliptical shape as seen in a plan view in the embodiment. The second inner region 67 in the second spiral portion 29 faces the first inner region 66 in the first spiral portion 26 in the normal direction Z.

The second spiral portion 29 can have a number of turns of 5 or more but 30 or less. The number of turns of the second spiral portion 29 relative to that of the first spiral portion 26 is adjusted according to the target value of voltage boosting. Preferably, the number of turns of the second spiral portion 29 is larger than that of the first spiral portion 26. Needless to say, the number of turns of the second spiral portion 29 can be smaller than or equal to that of the first spiral portion 26.

The second spiral portion 29 can have a width of 0.1 μm or more but 5 μm or less. Preferably, the second spiral portion 29 has a width of 1 μm or more but 3 μm or less. The width of the second spiral portion 29 is defined by its width in the direction orthogonal to the spiraling direction. Preferably, the width of the second spiral portion 29 is equal to the width of the first spiral portion 26.

The second spiral portion 29 can have a second winding pitch of 0.1 μm or more but 5 μm or less. Preferably, the second winding pitch is 1 μm or more but 3 μm or less. The second winding pitch is defined by the distance between two parts of the second spiral portion 29 that are adjacent to each other in the direction orthogonal to the spiraling direction. Preferably, the second winding pitch is equal to the first winding pitch of the first spiral portion 26.

The second spiral portion 29 can have any winding shape and the second inner region 67 can have any planar shape, which are thus not limited to those shown in FIG. 6 etc. The second spiral portion 29 can be wound in a polygonal shape, such as a triangular or quadrangular shape, or in a circular shape as seen in a plan view. The second inner region 67 can be defined, so as to fit the winding shape of the second spiral portion 29, in a polygonal shape, such as a triangular or quadrangular shape, or in a circular shape as seen in a plan view.

Preferably, the high-potential coil 23 is formed of the same conductive material as the low-potential coil 22. That is, preferably, like the low-potential coil 22, the high-potential coil 23 includes a barrier layer and a body layer.

Referring to FIG. 4, the semiconductor device 5 includes a plurality of (in the diagram, twelve) low-potential terminals 11 and a plurality of (in the diagram, twelve) high-potential terminals 12. The plurality of low-potential terminals 11 are electrically connected to the low-potential coils 22 of the corresponding transformers 21A to 21D respectively. The plurality of high-potential terminals 12 are electrically connected to the high-potential coils 23 of the corresponding transformers 21A to 21D respectively.

The plurality of low-potential terminals 11 are formed on the insulation principal surface 52 of the insulation layer 51. Specifically, the plurality of low-potential terminals 11 are formed in a second insulation side wall 53B side region, at an interval from the plurality of transformers 21A to 21D in the second direction Y, and are arrayed at intervals from each other in the first direction X.

The plurality of low-potential terminals 11 include a first low-potential terminal 11A, a second low-potential terminal 11B, a third low-potential terminal 11C, a fourth low-potential terminal 11D, a fifth low-potential terminal 11E, and a sixth low-potential terminal 11F. Actually, in the embodiment, two each of the plurality of low-potential terminals 11A to 11F are formed. The plurality of low-potential terminals 11A to 11F may each include any number of terminals.

The first low-potential terminal 11A faces the first transformer 21A in the second direction Y as seen in a plan view. The second low-potential terminal 11B faces the second transformer 21B in the second direction Y as seen in a plan view. The third low-potential terminal 11C faces the third transformer 21C in the second direction Y as seen in a plan view. The fourth low-potential terminal 11D faces the fourth transformer 21D in the second direction Y as seen in a plan view. The fifth low-potential terminal 11E is formed in a region between the first and second low-potential terminals 11A and 11B as seen in a plan view. The sixth low-potential terminal 11F is formed in a region between the third and fourth low-potential terminals 11C and 11D as seen in a plan view.

The first low-potential terminal 11A is electrically connected to the first inner end 24 of the first transformer 21A (low-potential coil 22). The second low-potential terminal 11B is electrically connected to the first inner end 24 of the second transformer 21B (low-potential coil 22). The third low-potential terminal 11C is electrically connected to the first inner end 24 of the third transformer 21C (low-potential coil 22). The fourth low-potential terminal 11D is electrically connected to the first inner end 24 of the fourth transformer 21D (low-potential coil 22).

The fifth low-potential terminal 11E is electrically connected to the first outer end 25 of the first transformer 21A (low-potential coil 22) and to the first outer end 25 of the second transformer 21B (low-potential coil 22). The sixth low-potential terminal 11F is electrically connected to the first outer end 25 of the third transformer 21C (low-potential coil 22) and to the first outer end 25 of the fourth transformer 21D (low-potential coil 22). The plurality of high-potential terminals 12 are formed on the insulation principal surface 52 of the insulation layer 51, at an interval from the plurality of low-potential terminals 11. Specifically, the plurality of high-potential terminals 12 are formed in a first insulation side wall 53A side region, at an interval from the plurality of low-potential terminals 11 in the second direction Y, and are arrayed at intervals from each other in the first direction X.

The plurality of high-potential terminals 12 are formed in regions close to the corresponding transformers 21A to 21D, respectively, as seen in a plan view. The high-potential terminals 12 being close to the transformers 21A to 21D means that, as seen in a plan view, the distance between the high-potential terminals 12 and the transformers 21 is smaller than the distance between the low-potential terminals 11 and the high-potential terminals 12.

Specifically, as seen in a plan view, the plurality of high-potential terminals 12 are formed at intervals from each other along the first direction X so as to face the plurality of transformers 21A to 21D along the first direction X. More specifically, as seen in a plan view, the plurality of high-potential terminals 12 are formed at intervals from each other along the first direction X so as to be located in the second inner regions 67 in the high-potential coils 23 and in regions between adjacent high-potential coils 23. As a result, as seen in a plan view, the plurality of high-potential terminals 12 are, along with the transformers 21A to 21D, arrayed in one row along the first direction X.

The plurality of high-potential terminals 12 include a first high-potential terminal 12A, a second high-potential terminal 12B, a third high-potential terminal 12C, a fourth high-potential terminal 12D, a fifth high-potential terminal 12E, and a sixth high-potential terminal 12F. Actually, in the embodiment, two each of the plurality of high-potential terminals 12A to 12F are formed. The plurality of high-potential terminals 12A to 12F may each include any number of terminals.

The first high-potential terminal 12A is formed in the second inner region 67 in the first transformer 21A (high-potential coil 23) as seen in a plan view. The second high-potential terminal 12B is formed in the second inner region 67 in the second transformer 21B (high-potential coil 23) as seen in a plan view. The third high-potential terminal 12C is formed in the second inner region 67 in the third transformer 21C (high-potential coil 23) as seen in a plan view. The fourth high-potential terminal 12D is formed in the second inner region 67 in the fourth transformer 21D (high-potential coil 23) as seen in a plan view. The fifth high-potential terminal 12E is formed in a region between the first and second transformers 21A and 21B as seen in a plan view. The sixth high-potential terminal 12F is formed in a region between the third and fourth transformers 21C and 21D as seen in a plan view.

The first high-potential terminal 12A is electrically connected to the second inner end 27 of the first transformer 21A (high-potential coil 23). The second high-potential terminal 12B is electrically connected to the second inner end 27 of the second transformer 21B (high-potential coil 23). The third high-potential terminal 12C is electrically connected to the second inner end 27 of the third transformer 21C (high-potential coil 23). The fourth high-potential terminal 12D is electrically connected to the second inner end 27 of the fourth transformer 21D (high-potential coil 23).

The fifth high-potential terminal 12E is electrically connected to the second outer end 28 of the first transformer 21A (high-potential coil 23) and to the second outer end 28 of the second transformer 21B (high-potential coil 23). The sixth high-potential terminal 12F is electrically connected to the second outer end 28 of the third transformer 21C (high-potential coil 23) and to the second outer end 28 of the fourth transformer 21D (high-potential coil 23).

Referring to FIGS. 5 and 7, the semiconductor device 5 includes a first low-potential wiring 31, a second low-potential wiring 32, a first high-potential wiring 33, and a second high-potential wiring 34, all formed in the insulation layer 51. Actually, in the embodiment, a plurality of first low-potential wirings 31, a plurality of second low-potential wirings 32, a plurality of first high-potential wirings 33, and a plurality of second high-potential wirings 34 are formed.

The first and second low-potential wirings 31 and 32 hold the low-potential coils 22 of the first and second transformers 21A and 21B at equal potentials. The first and second low-potential wirings 31 and 32 also hold the low-potential coils 22 of the third and fourth transformers 21C and 21D at equal potentials. In the embodiment, the first and second low-potential wirings 31 and 32 hold the low-potential coils 22 of all the transformers 21A to 21D at equal potentials.

The first and second high-potential wirings 33 and 34 hold the high-potential coils 23 of the first and second transformers 21A and 21B at equal potentials. The first and second high-potential wirings 33 and 34 also hold the high-potential coils 23 of the third and fourth transformers 21C and 21D at equal potentials. In the embodiment, the first and second high-potential wirings 33 and 34 hold the high-potential coils 23 of all the transformers 21A to 21D at equal potentials.

The plurality of first low-potential wirings 31 are electrically connected respectively to the corresponding low-potential terminals 11A to 11D and to the first inner ends 24 of the corresponding transformers 21A to 21D (low-potential coils 22). The plurality of first low-potential wirings 31 have similar structures. In the following description, the structure of the first low-potential wiring 31 connected to the first low-potential terminal 11A and to the first transformer 21A will be described as an example. No separate description will be given of the structures of the other first low-potential wirings 31, to which the description of the structure of the first low-potential wiring 31 connected to the first transformer 21A is to be taken to apply.

The first low-potential wiring 31 includes a through wiring 71, a low-potential connection wiring 72, a lead wiring 73, a first connection plug electrode 74, a second connection plug electrode 75, one or a plurality of (in this embodiment, a plurality of) pad plug electrodes 76, and one or a plurality of (in this embodiment, a plurality of) substrate plug electrodes 77.

Preferably, the through wiring 71, the low-potential connection wiring 72, the lead wiring 73, the first connection plug electrode 74, the second connection plug electrode 75, the pad plug electrodes 76, and the substrate plug electrodes 77 are formed of the same conductive material as the low-potential coil 22 and the like. That is, preferably, like the low-potential coil 22 and the like, the through wiring 71, the low-potential connection wiring 72, the lead wiring 73, the first connection plug electrode 74, the second connection plug electrode 75, the pad plug electrodes 76, and the substrate plug electrodes 77 each include a barrier layer and a body layer.

The through wiring 71 penetrates a plurality of interlayer insulation layers 57 in the insulation layer 51 and extends in a columnar shape along the normal direction Z. In the embodiment, the through wiring 71 is formed in a region between the bottom and top insulation layers 55 and 56 in the insulation layer 51. The through wiring 71 has a top end part at the top insulation layer 56 side and a bottom end part at the bottom insulation layer 55 side. The top end part of the through wiring 71 is formed in the same interlayer insulation layer 57 as the high-potential coil 23 and is covered by the top insulation layer 56. The bottom end part of the through wiring 71 is formed in the same interlayer insulation layer 57 as the low-potential coil 22.

In the embodiment, the through wiring 71 includes a first electrode layer 78, a second electrode layer 79, and a plurality of wiring plug electrodes 80. In the through wiring 71, the first and second electrode layers 78 and 79 and the wiring plug electrodes 80 are formed of the same conductive material as the low-potential coil 22 and the like. That is, like the low-potential coil 22 and the like, the first and second electrode layers 78 and 79 and the wiring plug electrodes 80 each include a barrier layer and a body layer.

The first electrode layer 78 constitutes the top end part of the through wiring 71. The second electrode layer 79 constitutes the bottom end part of the through wiring 71. The first electrode layer 78 is formed as an island, and faces the low-potential terminal 11 (first low-potential terminal 11A) in the normal direction Z. The second electrode layer 79 is formed as an island, and faces the first electrode layer 78 in the normal direction Z.

The plurality of wiring plug electrodes 80 are embedded respectively in the plurality of interlayer insulation layers 57 located in a region between the first and second electrode layers 78 and 79. The plurality of wiring plug electrodes 80 are stacked together from the bottom insulation layer 55 to the top insulation layer 56 so as to be electrically connected together, and electrically connect together the first and second electrode layers 78 and 79. The plurality of wiring plug electrodes 80 each have a plane area smaller than the plane area of either of the first and second electrode layers 78 and 79.

The number of layers stacked in the plurality of wiring plug electrodes 80 is equal to the number of layers stacked in the plurality of interlayer insulation layers 57. In the embodiment, six wiring plug electrodes 80 are embedded in interlayer insulation layers 57 respectively, and any number of wiring plug electrodes 80 can be embedded in interlayer insulation layers 57 respectively. Needless to say, one or a plurality of wiring plug electrodes 80 can be formed that penetrates a plurality of interlayer insulation layers 57.

The low-potential connection wiring 72 is formed in the same interlayer insulation layer 57 as the low-potential coil 22, in the first inner region 66 in the first transformer 21A (low-potential coil 22). The low-potential connection wiring 72 is formed as an island and faces the high-potential terminal 12 (first high-potential terminal 12A) in the normal direction Z. Preferably, the low-potential connection wiring 72 has a plane area larger than the plane area of the wiring plug electrode 80. The low-potential connection wiring 72 is electrically connected to the first inner end 24 of the low-potential coil 22.

The lead wiring 73 is formed in the interlayer insulation layer 57, in a region between the semiconductor chip 41 and the through wiring 71. In the embodiment, the lead wiring 73 is formed in the first interlayer insulation layer 57 as counted from the bottom insulation layer 55. The lead wiring 73 has a first end part at one side, a second end part at the other side, and a wiring part that connects together the first and second end parts. The first end part of the lead wiring 73 is located in a region between the semiconductor chip 41 and the bottom end part of the through wiring 71. The second end part of the lead wiring 73 is located in a region between the semiconductor chip 41 and the low-potential connection wiring 72. The wiring part extends along the first principal surface 42 of the semiconductor chip 41 and extends in the shape of a stripe in a region between the first and second end parts.

The first connection plug electrode 74 is formed in the interlayer insulation layer 57, in a region between the through wiring 71 and the lead wiring 73, and is electrically connected to the through wiring 71 and to the first end part of the lead wiring 73. The second connection plug electrode 75 is formed in the interlayer insulation layer 57, in a region between the low-potential connection wiring 72 and the lead wiring 73, and is electrically connected to the low-potential connection wiring 72 and to the second end part of the lead wiring 73.

The plurality of pad plug electrodes 76 are formed in the top insulation layer 56, in a region between the low-potential terminal 11 (first low-potential terminal 11A) and the through wiring 71, and are electrically connected to the low-potential terminal 11 and to the top end part of the through wiring 71. The plurality of substrate plug electrodes 77 are formed in the bottom insulation layer 55, in a region between the semiconductor chip 41 and the lead wiring 73. In the embodiment, the substrate plug electrodes 77 are formed in a region between the semiconductor chip 41 and the first end part of the lead wiring 73 and are electrically connected to the semiconductor chip 41 and to the first end part of the lead wiring 73.

Referring to FIG. 6 and FIG. 7, the plurality of first high-potential wirings 33 are connected respectively to the corresponding high-potential terminals 12A to 12D and to the second inner ends 27 of the corresponding transformers 21A to 21D (high-potential coils 23). The plurality of first high-potential wirings 33 have similar structures. In the following description, the structure of the first high-potential wiring 33 connected to the first high-potential terminal 12A and to the first transformer 21A will be described as an example. No description will be given of the structures of the other first high-potential wirings 33, to which the description of the structure of the first high-potential wiring 33 connected to the first transformer 21A is to be taken to apply.

The first high-potential wiring 33 includes a high-potential connection wiring 81 and one or a plurality of (in this embodiment, a plurality of) pad plug electrodes 82. Preferably, the high-potential connection wiring 81 and the pad plug electrodes 82 are formed of the same conductive material as the low-potential coil 22 and the like. That is, preferably, like the low-potential coil 22 and the like, the high-potential connection wiring 81 and the pad plug electrodes 82 each include a barrier layer and a body layer.

The high-potential connection wiring 81 is formed in the same interlayer insulation layer 57 as the high-potential coil 23, in the second inner region 67 in the high-potential coil 23. The high-potential connection wiring 81 is formed as an island, and faces the high-potential terminal 12 (first high-potential terminal 12A) in the normal direction Z. The high-potential connection wiring 81 is electrically connected to the second inner end 27 of the high-potential coil 23. The high-potential connection wiring 81 is formed at an interval from the low-potential connection wiring 72 as seen in a plan view, and does not face the low-potential connection wiring 72 in the normal direction Z. This results in an increased insulation distance between the low- and high-potential connection wirings 72 and 81 and hence an increased dielectric strength voltage in the insulation layer 51.

The plurality of pad plug electrodes 82 are formed in the top insulation layer 56, in a region between the high-potential terminal 12 (first high-potential terminal 12A) and the high-potential connection wiring 81, and are electrically connected to the high-potential terminal 12 and to the high-potential connection wiring 81. The plurality of pad plug electrodes 82 each have a plane area smaller than the plane area of the high-potential connection wiring 81 as seen in a plan view.

Referring to FIG. 7, preferably, the distance D1 between the low- and high-potential terminals 11 and 12 is larger than the distance D2 between the low- and high-potential coils 22 and 23 (D2<D1). Preferably, the distance D1 is larger than the total thickness DT of the plurality of interlayer insulation layers 57 (DT<D1). The ratio D2/D1 of the distance D2 to the distance D1 can be 0.01 or more but 0.1 or less. Preferably, the distance D1 is 100 μm or more but 500 μm or less. The distance D2 can be 1 μm or more but 50 μm or less. Preferably, the distance D2 is 5 μm or more but 25 μm or less. The distances D1 and D2 can have any values, which are adjusted appropriately according to the desired dielectric strength voltage.

Referring to FIG. 6 and FIG. 7, the semiconductor device 5 has a dummy pattern 85 that is embedded in the insulation layer 51 so as to be located around the transformers 21A to 21D as seen in a plan view.

The dummy pattern 85 is formed in a pattern different (discontinuous) from that of either of the high- and low-potential coils 23 and 22, and is independent of the transformers 21A to 21D. That is, the dummy pattern 85 does not function as part of the transformers 21A to 21D. The dummy pattern 85 is formed as a shield conductor layer that shields electric fields between the low- and high-potential coils 22 and 23 in the transformers 21A to 21D to suppress electric field concentration on the high-potential coil 23. In the embodiment, the dummy pattern 85 is patterned at a line density per unit area that is equal to the line density of the high-potential coil 23. The line density of the dummy pattern 85 being equal to the line density of the high-potential coil 23 means that the line density of the dummy pattern 85 falls within the range of ±20% of the line density of the high-potential coil 23.

The dummy pattern 85 can be formed at any depth in the insulation layer 51, which is adjusted according to the electric field strength to be attenuated. Preferably, the dummy pattern 85 is formed in a region closer to the high-potential coil 23 than to the low-potential coil 22 with respect to the normal direction Z. The dummy pattern 85 being closer to the high-potential coil 23 with respect to the normal direction Z means that, with respect to the normal direction Z, the distance between the dummy pattern 85 and the high-potential coil 23 is smaller than the distance between the dummy pattern 85 and the low-potential coil 22.

In that way, electric field concentration on the high-potential coil 23 can be suppressed properly. The smaller the distance between the dummy pattern 85 and the high-potential coil 23 with respect to the normal direction Z, the more effectively electric field concentration on the high-potential coil 23 can be suppressed. Preferably, the dummy pattern 85 is formed in the same interlayer insulation layer 57 as the high-potential coil 23. In that way, electric field concentration on the high-potential coil 23 can be suppressed more properly. The dummy pattern 85 includes a plurality of dummy patterns that are in varying electrical states. The dummy pattern 85 can include a high-potential dummy pattern.

The high-potential dummy pattern 86 can be formed at any depth in the insulation layer 51, which is adjusted according to the electric field strength to be attenuated. Preferably, the high-potential dummy pattern 86 is formed in a region closer to the high-potential coil 23 than to the low-potential coil 22 with respect to the normal direction Z. The high-potential dummy pattern 86 being closer to the high-potential coil 23 with respect to the normal direction Z means that, with respect to the normal direction Z, the distance between the high-potential dummy pattern 86 and the high-potential coil 23 is smaller than the distance between the high-potential dummy pattern 86 and the low-potential coil 22.

The dummy pattern 85 includes a floating dummy pattern that is formed in an electrically floating state in the insulation layer 51 so as to be located around the transformers 21A to 21D.

In the embodiment, the floating dummy pattern is patterned in dense lines so as to partly cover and partly expose a region around the high-potential coil 23 as seen in a plan view. The floating dummy pattern can be formed so as to have ends or no ends.

The floating dummy pattern can be formed at any depth in the insulation layer 51, which is adjusted according to the electric field strength to be attenuated.

Any number of floating lines can be provided, which is adjusted according to the electric field strength to be attenuated. The floating dummy pattern can include a plurality of floating dummy patterns.

Referring to FIG. 7, the semiconductor device 5 includes a second functional device 60 that is formed in the first principal surface 42 of the semiconductor chip 41 in a device region 62. The second functional device 60 is formed using a superficial part of the first principal surface 42 and/or a region on the first principal surface 42 of the semiconductor chip 41 and is covered by the insulation layer 51 (bottom insulation layer 55). In FIG. 7, the second functional device 60 is shown in a simplified form by broken lines indicated in a superficial part of the first principal surface 42.

The second functional device 60 is electrically connected to a low-potential terminal 11 via a low-potential wiring and is electrically connected to a high-potential terminal 12 via a high-potential wiring. Except that the low-potential wiring is patterned in the insulation layer 51 so as to be connected to the second functional device 60, it has a similar structure to the first low-potential wiring 31 (second low-potential wiring 32). Except that the high-potential wiring is patterned in the insulation layer 51 so as to be connected to the second functional device 60, it has a similar structure to the first high-potential wiring 33 (second high-potential wiring 34). No description will be given of the low- and high-potential wirings associated with the second functional device 60.

The second functional device 60 can include at least one of a passive device, a semiconductor rectification device, and a semiconductor switching device. The second functional device 60 can include a circuit network comprising a selective combination of any two or more of a passive device, a semiconductor rectification device, and a semiconductor switching device. The circuit network can constitute part or the whole of an integrated circuit.

The passive device can include a semiconductor passive device. The passive device can include one or both of a resistor and a capacitor. The semiconductor rectification device can include at least one of a pn-junction diode, a PIN diode, a Zener diode, a Schottky barrier diode, and a fast-recovery diode. The semiconductor switching device can include at least one of a BJT (bipolar junction transistor), a MISFET (metal-insulator-semiconductor field-effect transistor), an IGBT (insulated-gate bipolar junction transistor), and a JFET (junction field-effect transistor).

Referring to FIG. 5 to FIG. 7, the semiconductor device 5 further includes a sealing conductor 61 embedded in the insulation layer 51. The sealing conductor 61 is embedded in the form of walls in the insulation layer 51, at intervals from the insulation side walls 53A to 53D as seen in a plan view and partitions the insulation layer 51 into the device region 62 and an outer region 63. The sealing conductor 61 prevents moisture entry and crack development from the outer region 63 to the device region 62.

The device region 62 is a region that includes the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. The outer region 63 is a region outside the device region 62.

The sealing conductor 61 is electrically isolated from the device region 62. Specifically, the sealing conductor 61 is electrically isolated from the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. More specifically, the sealing conductor 61 is held in an electrically floating state. The sealing conductor 61 does not form a current path connected to the device region 62.

The sealing conductor 61 is formed in the shape of a stripe along the insulation side walls 53A to 53D as seen in a plan view. In the embodiment, the sealing conductor 61 is formed in a quadrangular ring shape (specifically, a rectangular ring shape) as seen in a plan view. Thus, the sealing conductor 61 defines the device region 62 in a quadrangular shape (specifically, a rectangular shape) as seen in a plan view. Furthermore, the sealing conductor 61 defines the outer region 63 in a quadrangular ring shape (specifically, a rectangular ring shape) surrounding the device region 62 as seen in a plan view.

Specifically, the sealing conductor 61 has a top end part at the insulation principal surface 52 side, a bottom end part at the semiconductor chip 41 side, and a wall part that extends in the form of walls between the top and bottom end parts. In the embodiment, the top end part of the sealing conductor 61 is formed at an interval from the insulation principal surface 52 toward the semiconductor chip 41 and is located in the insulation layer 51. In the embodiment, the top end part of the sealing conductor 61 is covered by the top insulation layer 56. The top end part of the sealing conductor 61 can be covered by one or a plurality of interlayer insulation layers 57. The top end part of the sealing conductor 61 can be exposed through the top insulation layer 56. The bottom end part of the sealing conductor 61 is formed at an interval from the semiconductor chip 41 toward the top end part.

Thus, in the embodiment, the sealing conductor 61 is embedded in the insulation layer 51 so as to be located at the semiconductor chip 41 side of the plurality of low-potential terminals 11 and the plurality of high-potential terminals 12. Moreover, in the insulation layer 51, the sealing conductor 61 faces, in the direction parallel to the insulation principal surface 52, the first functional device 45 (plurality of transformers 21), the first low-potential wirings 31, the second low-potential wirings 32, the first high-potential wirings 33, the second high-potential wirings 34, and the dummy pattern 85. In the insulation layer 51, the sealing conductor 61 can face, in the direction parallel to the insulation principal surface 52, part of the second functional device 60.

The sealing conductor 61 includes a plurality of sealing plug conductors 64 and one or a plurality of (in the embodiment, a plurality of) sealing via conductors 65. Any number of sealing via conductors 65 may be provided. Of the plurality of sealing plug conductors 64, the top sealing plug conductor 64 constitutes the top end part of the sealing conductor 61. The plurality of sealing via conductors 65 constitute the bottom end part of the sealing conductor 61. Preferably, the sealing plug conductors 64 and the sealing via conductors 65 are formed of the same conductive material as the low-potential coil 22. That is, preferably, like the low-potential coil 22 and the like, the sealing plug conductors 64 and the sealing via conductors 65 each include a barrier layer and a body layer.

The plurality of sealing plug conductors 64 are embedded in the plurality of interlayer insulation layers 57 respectively, and are each formed in a quadrangular ring shape (specifically, a rectangular ring shape) surrounding the device region 62. The plurality of sealing plug conductors 64 are stacked together from the bottom insulation layer 55 to the top insulation layer 56 so as to be connected together. The number of layers stacked in the plurality of sealing plug conductors 64 is equal to the number of layers in the plurality of interlayer insulation layers 57. Needless to say, one or a plurality of sealing plug conductors 64 may be formed that penetrates a plurality of interlayer insulation layers 57.

So long as a set of a plurality of sealing plug conductors 64 constitutes one ring-shaped sealing conductor 61, not all the sealing plug conductors 64 need be formed in a ring shape. For example, at least one of the plurality of sealing plug conductors 64 can be formed so as to have ends. Or at least one of the plurality of sealing plug conductors 64 may be divided into a plurality of strip-shaped portions with ends. However, with consideration given to the risk of moisture entry and crack development into the device region 62, preferably, the plurality of sealing plug conductors 64 are formed so as to have no ends (in a ring shape).

The plurality of sealing via conductors 65 are formed in the bottom insulation layer 55, in a region between the semiconductor chip 41 and the sealing plug conductors 64. The plurality of sealing via conductors 65 are formed at an interval from the semiconductor chip 41, and are connected to the sealing plug conductors 64. The plurality of sealing via conductors 65 have a plane area smaller than the plane area of the sealing plug conductors 64. In a case where a single sealing via conductor 65 is formed, the single sealing via conductors 65 can have a plane area equal to or larger than the plane area of the sealing plug conductors 64.

The sealing conductor 61 can have a width of 0.1 μm or more but 10 μm or less. Preferably, the sealing conductor 61 has a width of 1 μm or more but 5 μm or less. The width of the sealing conductor 61 is defined by its width in the direction orthogonal to the direction in which it extends.

Referring to FIG. 7 and FIG. 8, the semiconductor device 5 further includes the separation structure 130 that is interposed between the semiconductor chip 41 and the sealing conductor 61 and that electrically isolates the sealing conductor 61 from the semiconductor chip 41. Preferably, the separation structure 130 includes an insulator. In the embodiment, the separation structure 130 is a field insulation film 131 formed on the first principal surface 42 of the semiconductor chip 41.

The field insulation film 131 includes at least one of an oxide film (silicon oxide film) and a nitride film (silicon nitride film). Preferably, the field insulation film 131 is a LOCOS (local oxidation of silicon) film as one example of an oxide film that is formed through oxidation of the first principal surface 42 of the semiconductor chip 41. The field insulation film 131 can have any thickness so long as it can insulate between the semiconductor chip 41 and the sealing conductor 61. The field insulation film 131 can have a thickness of 0.1 μm or more but 5 μm or less.

The separation structure 130 is formed on the first principal surface 42 of the semiconductor chip 41 and extends in the shape of a stripe along the sealing conductor 61 as seen in a plan view. In the embodiment, the separation structure 130 is formed in a quadrangular ring shape (specifically, a rectangular ring shape) as seen in a plan view. The separation structure 130 has a connection portion 132 to which the bottom end part of the sealing conductor 61 (i.e., the sealing via conductors 65) is connected. The connection portion 132 can form an anchor portion into which the bottom end part of the sealing conductor 61 (i.e., the sealing via conductors 65) is anchored toward the semiconductor chip 41. Needless to say, the connection portion 132 can be formed to be flush with the principal surface of the separation structure 130.

The separation structure 130 includes an inner end part 130A at the device region 62 side, an outer end part 130B at the outer region 63 side, and a main body part 130C between the inner and outer end parts 130A and 130B. As seen in a plan view, the inner end part 130A defines the region where the second functional device 60 is formed (i.e., the device region 62). The inner end part 130A can be formed integrally with an insulation film (not illustrated) formed on the first principal surface 42 of the semiconductor chip 41.

The outer end part 130B is exposed on the chip side walls 44A to 44D of the semiconductor chip 41 and is continuous with the chip side walls 44A to 44D of the semiconductor chip 41. More specifically, the outer end part 130B is formed so as to be flush with the chip side walls 44A to 44D of the semiconductor chip 41. The outer end part 130B constitutes a polished surface between, to be flush with, the chip side walls 44A to 44D of the semiconductor chip 41 and the insulation side walls 53A to 53D of the insulation layer 51. Needless to say, an embodiment is also possible where the outer end part 130B is formed within the first principal surface 42 at intervals from the chip side walls 44A to 44D.

The main body part 130C has a flat surface that extends substantially parallel to the first principal surface 42 of the semiconductor chip 41. The main body part 130C has the connection portion 132 to which the bottom end part of the sealing conductor 61 (i.e., the sealing via conductors 65) is connected. The connection portion 132 is formed in the main body part 130C, at intervals from the inner and outer end parts 130A and 130B. The separation structure 130 can be implemented in many ways other than in the form of a field insulation film 131.

Referring to FIG. 7, the semiconductor device 5 further includes an inorganic insulation layer 140 formed on the insulation principal surface 52 of the insulation layer 51 so as to cover the sealing conductor 61. The inorganic insulation layer 140 can be called a passivation layer. The inorganic insulation layer 140 protects the insulation layer 51 and the semiconductor chip 41 from above the insulation principal surface 52.

In the embodiment, the inorganic insulation layer 140 has a stacked structure composed of a first inorganic insulation layer 141 and a second inorganic insulation layer 142. The first inorganic insulation layer 141 can contain silicon oxide. Preferably, the first inorganic insulation layer 141 contains USG (undoped silicate glass), which is undoped silicon oxide. The first inorganic insulation layer 141 can have a thickness of 50 nm or more but 5000 nm or less. The second inorganic insulation layer 142 can contain silicon nitride. The second inorganic insulation layer 142 can have a thickness of 500 nm or more but 5000 nm or less. Increasing the total thickness of the inorganic insulation layer 140 helps increase the dielectric strength voltage above the high-potential coils 23.

In a configuration where the first inorganic insulation layer 141 is made of USG and the second inorganic insulation layer 142 is made of silicon nitride, USG has the higher dielectric breakdown voltage (V/cm) than silicon nitride. In view of this, when thickening the inorganic insulation layer 140, it is preferable to form the first inorganic insulation layer 141 thicker than the second inorganic insulation layer 142.

The first inorganic insulation layer 141 can contain at least one of BPSG (boron-doped phosphor silicate glass) and PSG (phosphorus silicate glass) as examples of silicon oxide. In that case, however, since the silicon oxide contains a dopant (boron or phosphorus), for an increased dielectric strength voltage above the high-potential coils 23, it is particularly preferable to form the first inorganic insulation layer 141 of USG. Needless to say, the inorganic insulation layer 140 can have a single-layer structure composed of either the first or second inorganic insulation layer 141 or 142.

The inorganic insulation layer 140 covers the entire area of the sealing conductor 61, and has a plurality of low-potential pad openings 143 and a plurality of high-potential pad openings 144 that are formed in a region outside the sealing conductor 61. The plurality of low-potential pad openings 143 expose the plurality of low-potential terminals 11 respectively. The plurality of high-potential pad openings 144 expose the plurality of high-potential terminals 12 respectively. The inorganic insulation layer 140 can have overlap parts that overlap circumferential edge parts of the low-potential terminals 11. The inorganic insulation layer 140 can have overlap parts that overlap circumferential edge parts of the high-potential terminals 12.

The semiconductor device 5 further includes an organic insulation layer 145 that is formed on the inorganic insulation layer 140. The organic insulation layer 145 can contain photosensitive resin. The organic insulation layer 145 can contain at least one of polyimide, polyamide, and polybenzoxazole. In the embodiment, the organic insulation layer 145 contains polyimide. The organic insulation layer 145 can have a thickness of 1 μm or more but 50 μm or less.

Preferably, the organic insulation layer 145 has a thickness larger than the total thickness of the inorganic insulation layer 140. Moreover, preferably, the inorganic and organic insulation layers 140 and 145 together have a total thickness larger than the distance D2 between the low- and high-potential coils 22 and 23. In that case, preferably, the inorganic insulation layer 140 has a total thickness of 2 μm or more but 10 μm or less. Preferably, the organic insulation layer 145 has a thickness of 5 μm or more but 50 μm or less. Such structures help suppress an increase in the thicknesses of the inorganic and organic insulation layers 140 and 145 while appropriately increasing the dielectric strength voltage above the high-potential coil 23 owing to the stacked film of the inorganic and organic insulation layers 140 and 145.

The organic insulation layer 145 includes a first part 146 that covers a low-potential side region and a second part 147 that covers a high-potential side region. The first part 146 covers the sealing conductor 61 across the inorganic insulation layer 140. The first part 146 has a plurality of low-potential terminal openings 148 through which the plurality of low-potential terminals 11 (low-potential pad openings 143) are respectively exposed in a region outside the sealing conductor 61. The first part 146 can have overlap parts that overlap circumferential edges (overlap parts) of the low-potential pad openings 143.

The second part 147 is formed at an interval from the first part 146 and exposes the inorganic insulation layer 140 between the first and second parts 146 and 147. The second part 147 has a plurality of high-potential terminal openings 149 through which the plurality of high-potential terminals 12 (high-potential pad openings 144) are respectively exposed. The second part 147 can have overlap parts that overlap circumferential edges (overlap parts) of the high-potential pad openings 144.

The second part 147 covers the transformers 21A to 21D and the dummy pattern 85 together. Specifically, the second part 147 covers the plurality of high-potential coils 23, the plurality of high-potential terminals 12, a first high-potential dummy pattern 87, a second high-potential dummy pattern 88, and a floating dummy pattern 121 together.

The present disclosure can be implemented in any other embodiments. The embodiment described above deals with an example where a first functional device 45 and a second functional device 60 are formed. An embodiment is however also possible that only has a second functional device 60, with no first functional device 45. In that case, the dummy pattern 85 may be omitted. This structure provides, with respect to the second functional device 60, effects similar to those mentioned in connection with the first embodiment (except those associated with the dummy pattern 85).

That is, in a case where a voltage is applied to the second functional device 60 via the low- and high-potential terminals 11 and 12, it is possible to suppress unnecessary conduction between the high-potential terminal 12 and the sealing conductor 61. Likewise, in a case where a voltage is applied to the second functional device 60 via the low- and high-potential terminals 11 and 12, it is possible to suppress unnecessary conduction between the low-potential terminal 11 and the sealing conductor 61.

The embodiment described above deals with an example where a second functional device 60 is formed. The second functional device 60 however is not essential and can be omitted.

The embodiment described above deals with an example where a dummy pattern 85 is formed. The dummy pattern 85 however is not essential and can be omitted.

The embodiment described above deals with an example where the first functional device 45 is of a multichannel type that includes a plurality of transformers 21. It is however also possible to employ a single-channel first functional device 45 that includes a single transformer 21.

<Transformer Layout>

Figure 9:
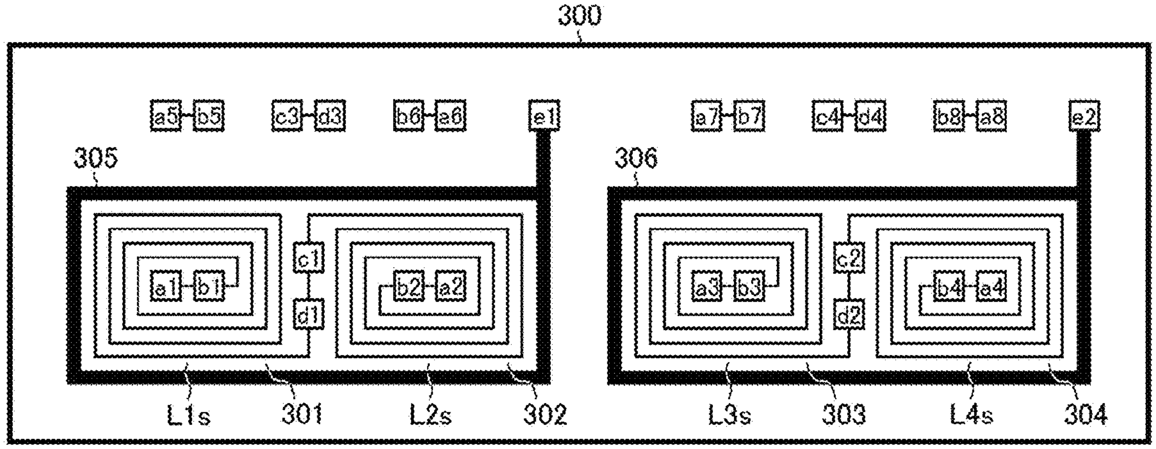
FIG. 9 is a diagram schematically showing an example of the layout of a transformer chip.

FIG. 9 is a plan view (top view) schematically showing one example of transformer layout in a two-channel transformer chip 300 (corresponding to the semiconductor device 5 described previously). The transformer chip 300 shown there includes a first transformer 301, a second transformer 302, a third transformer 303, a fourth transformer 304, a first guard ring 305, a second guard ring 306, pads a1 to a8, pads b1 to b8, pads c1 to c4, and pads d1 to d4.

In the transformer chip 300, the pads a1 and b1 are connected to one terminal of the secondary coil L1*s* of the first transformer 301, and the pads c1 and d1 are connected to the other terminal of that secondary coil L1*s*. The pads a2 and b2 are connected to one terminal of the secondary coil L2*s* of the second transformer 302, and the pads c1 and d1 are connected to the other terminal of that secondary coil L2*s*.

Moreover, the pads a3 and b3 are connected to one terminal of the secondary coil L3*s* of the third transformer 303, and the pads c2 and d2 are connected to the other terminal of that secondary coil L3*s*. The pads a4 and b4 are connected to one terminal of the secondary coil L4*s* of the fourth transformer 304, and the pads c2 and d2 are connected to the other terminal of that secondary coil L4*s*.

FIG. 9 does not show any of the primary coils of the first, second, third, and fourth transformers 301, 302, 303, and 304. The primary coils basically have structures similar to those of the secondary coils L1*s* to L4*s* respectively and are disposed right below the secondary coils L1*s* to L4*s*, respectively, so as to face them.

Specifically, the pads a5 and b5 are connected to one terminal of the primary coil of the first transformer 301, and the pads c3 and d3 are connected to the other terminal of that primary coil. Likewise, the pads a6 and b6 are connected to one terminal of the primary coil of the second transformer 302, and the pads c3 and d3 are connected to the other terminal of that primary coil.

Likewise, the pads a7 and b7 are connected to one terminal of the primary coil of the third transformer 303, and the pads c4 and d4 are connected to the other terminal of that primary coil. Likewise, the pads a8 and b8 are connected to one terminal of the primary coil of the fourth transformer 304, and the pads c4 and d4 are connected to the other terminal of that primary coil.

The pads a5 to a8, the pads b5 to b8, the pads c3 and c4, and the pads d3 and d4 mentioned above are each led from inside the transformer chip 300 to its surface across an unillustrated via.

Of the plurality of pads mentioned above, the pads a1 to a8 each correspond to a first current feed pad, and the pads b1 to b8 each correspond to a first voltage measurement pad; the pads c1 to c4 each correspond to a second current feed pad, and the pads d1 to d4 each correspond to a second voltage measurement pad.

Thus, the transformer chip 300 of this configuration example permits, during its defect inspection, accurate measurement of the series resistance component across each coil. It is thus possible not only to reject defective products with a broken wire in a coil but also to appropriately reject defective products with an abnormal resistance value in a coil (e.g., a midway short circuit between coils), and hence to prevent defective products from being distributed in the market.

For a transformer chip 300 that has passed the defect inspection mentioned above, the plurality of pads described above can be used for connection with a primary-side chip and a secondary-side chip (e.g., the controller chip 210 and the driver chip 220 described previously).

Specifically, the pads a1 and b1, the pads a2 and b2, the pads a3 and b3, and the pads a4 and b4 can each be connected to one of the signal input and output terminals of the secondary-side chip; the pads c1 and d1 and the pads c2 and d2 can each be connected to a common voltage application terminal (GND2) of the secondary-side chip.

On the other hand, the pads a5 and b5, the pads a6 and b6, the pads a7 and b7, and the pads a8 and b8 can each be connected to one of the signal input and output terminals of the primary-side chip; the pads c3 and d3 and the pads c4 and d4 can each be connected to a common voltage application terminal (GND1) of the primary-side chip.

Here, as shown in FIG. 9, the first to fourth transformers 301 to 304 are so arranged as to be coupled for each signal transmission direction. In terms of what is shown in the diagram, for example, the first and second transformers 301 and 302, which transmit a signal from the primary-side chip to the secondary-side chip, are coupled into a first pair by the first guard ring 305. Likewise, for example, the third and fourth transformers 303 and 304, which transmit a signal from the secondary-side chip to the primary-side chip, are coupled into a second pair by the second guard ring 306.

Such coupling is intended, in a structure where the primary and secondary coils of each of the first to fourth transformers 301 to 304 are formed so as to be stacked on each other in the up-down direction of the substrate of the transformer chip 300, to obtain a desired withstand voltage between the primary and secondary coils. The first and second guard rings 305 and 306 are however not essential elements.

The first and second guard rings 305 and 306 can be connected via pads e1 and e2, respectively, to a low-impedance wiring such as a grounded terminal.

In the transformer chip 300, the pads c1 and d1 are shared between the secondary coils L1*s* and L2*s*. The pads c2 and d2 are shared between the secondary coils L3*s* and L4*s*. The pads c3 and d3 are shared between the primary coils L1*p* and L2*p*. The pads c4 and d4 are shared between the primary coils that correspond to them respectively. This configuration helps reduce the number of pads and helps make the transformer chip 300 compact.

Moreover, as shown in FIG. 9, the primary and secondary coils of the first to fourth transformers 301 to 304 are preferably each wound in a rectangular shape (or, with the corners rounded, in a running-track shape) as seen in a plan view of the transformer chip 300. This configuration helps increase the area over which the primary and secondary coils overlap each other and helps enhance the transmission efficiency across the transformers.

Needless to say, the illustrated transformer layout is merely an example; any number of coils of any shape can be disposed in any layout, and pads can be disposed in any layout. Any of the chip structure, transformer layouts, etc. described above can be applied to semiconductor devices in general that have a coil integrated in a semiconductor chip.

<Signal Transmission Device (First Embodiment)>

Figure 10:
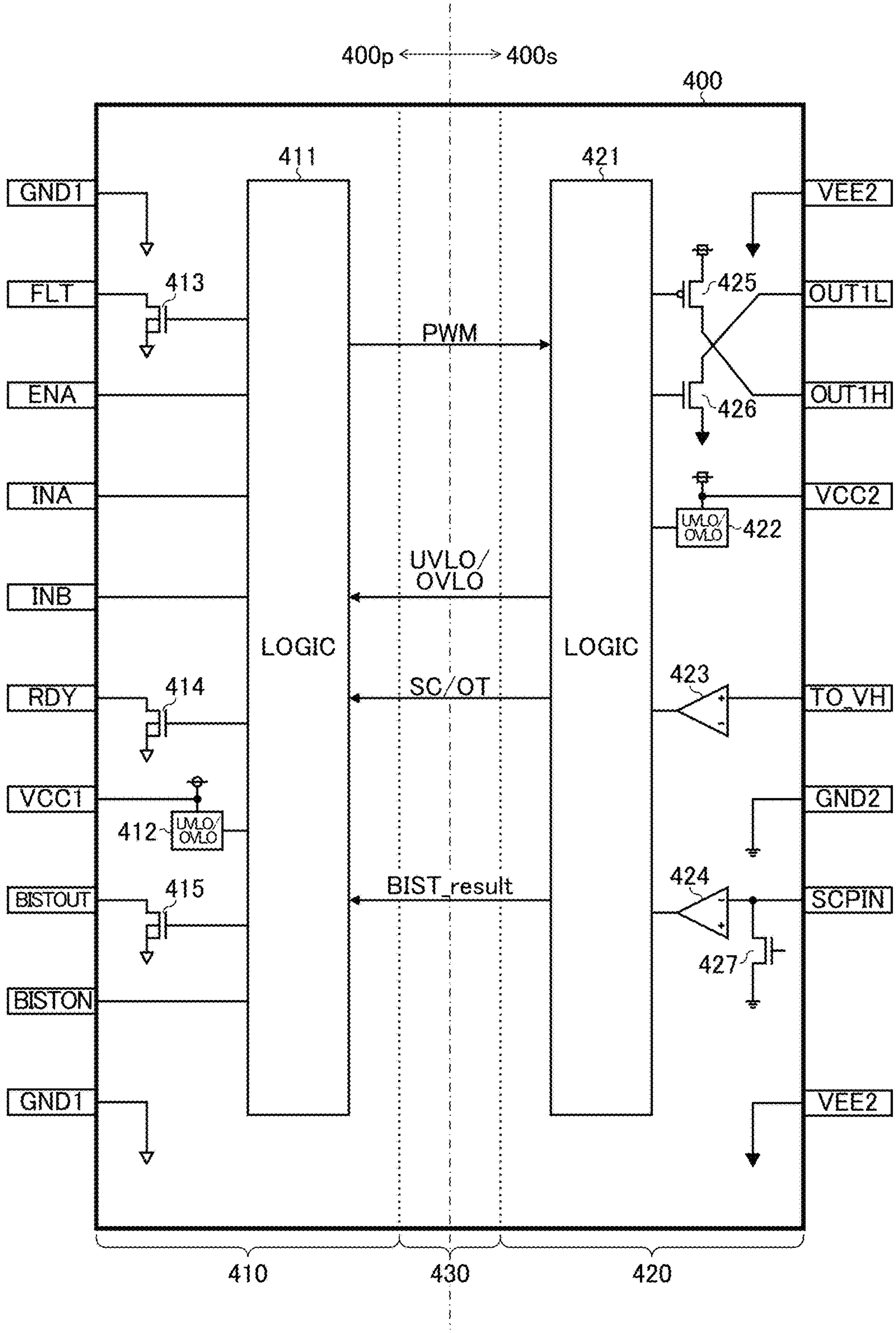
FIG. 10 is a diagram showing a first embodiment of the signal transmission device.

FIG. 10 is a diagram showing a first embodiment (=configuration to be compared with a second embodiment described later) of the signal transmission device. The signal transmission device 400 of the first embodiment is a semiconductor integrated circuit device (so-called isolated gate driver IC) which transmits, while electrically isolating an area between a primary circuit system 400*p* (VCC1-GND1 system) and a secondary circuit system 400*s* (VCC2-GND2 system), a pulse signal from the primary circuit system 400*p* to the secondary circuit system 400*s* to drive the gate of a power transistor (not shown) provided in the secondary circuit system 400*s*. The signal transmission device 400 can be understood to correspond to the signal transmission device 200 described above.

The signal transmission device 400 includes, as a means for establishing electrical connection with the outside of the device, a plurality of external terminals (in the figure, power supply terminals VCC1 and VCC2, ground terminals GND1 and GND2, a negative power supply terminal VEE2, input terminals INA and INB, output terminals OUT1H and OUT1L, a fault terminal FLT, a ready terminal RDY, an enable terminal ENA, an overheating/load power supply abnormality detection terminal TO_VH, a short circuit detection terminal SCPIN, a self-diagnosis on terminal BISTON and a self-diagnosis output terminal BISTOUT).

On the first side (=the left side in the figure) of the package of the signal transmission device 400, the ground terminal GND1, the fault terminal FLT, the enable terminal ENA, the input terminal INA, the input terminal INB, the ready terminal RDY, the power supply terminal VCC1, the self-diagnosis output terminal BISTOUT, the self-diagnosis on terminal BISTON and the ground terminal GND1 are arranged sequentially from above.

On the other hand, on the second side of the package (=the side opposite the first side, the right side in the figure), the negative power supply terminal VEE2, the output terminal OUT1L, the output terminal OUT1H, the power supply terminal VCC2, the overheating/load power supply abnormality detection terminal TO_VH, the ground terminal GND2, the short circuit detection terminal SCPIN and the negative power supply terminal VEE2 are arranged sequentially from above.

Preferably, as described above, the external terminals (GND1, FLT, ENA, INA, INB, RDY, VCC1, BISTOUT and BISTON) of the primary circuit system 400*p* are concentrated on the first side of the package, and the external terminals (VEE2, OUT1L, OUT1H, VCC2, TO_VH, GND2 and SCPIN) of the secondary circuit system 400*s* are concentrated on the second side of the package.

The ground terminal GND1 and the negative power supply terminal VEE2 are preferably arranged at both ends of the first and second sides of the package. In other words, two ground terminals GND1 and two negative power supply terminals VEE2 are preferably provided.

The signal transmission device 400 can be widely applied to general applications (such as a motor driver which handles a high voltage or a DC/DC converter) that require signal transmission between the primary circuit system 400*p* and the secondary circuit system 400*s* while isolating therebetween.

Then, the internal configuration of the signal transmission device 400 will be described with reference to FIG. 10. The signal transmission device 400 of the present configuration example is formed by sealing a controller chip 410 (=corresponding to a first chip), a driver chip 420 (=corresponding to a second chip) and a transformer chip 430 (=corresponding to a third chip) in a single package.

The controller chip 410 is a semiconductor chip obtained by integrating the circuit element of the primary circuit system 400*p* which is operated by receiving the supply of the power supply voltage VCC1 (for example, the maximum of 7V with reference to GND1). In the controller chip 410, for example, a logic circuit 411, a UVLO [under-voltage lock out]/OVLO [over-voltage lock out] circuit 412 and NMOSFETs [N-channel type metal oxide semiconductor field effect transistor] 413 to 415 are integrated.

The logic circuit 411 generates the drive pulse signal PWM of the power transistor (not shown) according to input pulse signals INA and INB. For example, when INB=H (logic level when disabled), PWM=L (fixed value) whereas when INB=L (logic level when enabled), PWM=INA. The logic circuit 411 also has the function of monitoring various types of abnormality detection signals (for a low voltage, an overvoltage, a short circuit, an open circuit, overheating, a load power supply abnormality and the like) of the signal transmission device 400, and determining the logic levels of a fault signal FLT and a ready signal RDY by driving the NMOSFETs 413 and 414 based on the results of the monitoring. The logic circuit 411 also has the function of switching, according to an enable signal ENA, whether the entire signal transmission device 400 can be operated (enable/disable).

The logic circuit 411 further has the function of performing self-diagnosis (so-called BIST [built-in self test]) on the units of the signal transmission device 400 according to a self-diagnosis on signal BISTON, and determining the logic level of a self-diagnosis output signal BISTOUT by driving the NMOSFET 415 based on the result of the self-diagnosis. In other words, the logic circuit 411 functions as a part of a self-diagnosis circuit incorporated in the signal transmission device 400 (the details of which will be described later).

The UVLO/OVLO circuit 412 detects each of the low voltage and the overvoltage of the power supply voltage VCC1, and outputs the result of the detection to the logic circuit 411.

The NMOSFET 413 conducts/interrupts between the fault terminal FLT and the ground end according to an instruction from the logic circuit 411. For example, when overheating or a load power supply abnormality is detected in the driver chip 420, the NMOSFET 413 is turned on, and thus the fault terminal FLT is turned low (=logic level when an abnormality is detected).

The NMOSFET 414 conducts/interrupts between the ready terminal RDY and the ground end according to an instruction from the logic circuit 411. For example, when a low voltage or an overvoltage is detected in one of the controller chip 410 and the driver chip 420, the NMOSFET 414 is turned on, and thus the ready terminal RDY is turned low (=logic level when an abnormality is detected).

The NMOSFET 415 conducts/interrupts between the self-diagnosis output terminal BISTOUT and the ground end according to an instruction from the logic circuit 411. For example, when the result of the self-diagnosis performed by the signal transmission device 400 is not good, the NMOSFET 415 is turned on, and thus the self-diagnosis output terminal BISTOUT is turned low (=logic level when an abnormality is detected).

The driver chip 420 is a semiconductor chip obtained by integrating the circuit element of the secondary circuit system 400*s* which is operated by receiving the supply of the power supply voltage VCC2 (for example, the maximum of 30V with reference to GND2). In the driver chip 420, for example, a logic circuit 421, a UVLO/OVLO circuit 422, comparators 423 and 424, a PMOSFET [P-channel type MOSFET] 425 and NMOSFETs 426 and 427 are integrated.

The logic circuit 421 turns on and off the PMOSFET 425 and the NMOSFET 426 according to the drive pulse signal PWM input via the transformer chip 430 to drive the gate of the power transistor (not shown) connected to the output terminals OUT1H and OUT1L. The output terminals OUT1H and OUT1L are preferably short-circuited to each other outside the signal transmission device 400. The logic circuit 421 also has the function of transmitting various types of abnormality detection signals (for a low voltage, an overvoltage, a short circuit, an open circuit, overheating, a load power supply abnormality and the like) on the side of the driver chip 420 via the transformer chip 430 to the controller chip 410.

The logic circuit 421 further has the function of transmitting the result (BIST_result) of the self-diagnosis on the side of the driver chip 420 via the transformer chip 430 to the controller chip 410. In other words, the logic circuit 421 functions as a part of the self-diagnosis circuit incorporated in the signal transmission device 400 (the details of which will be described later).

The UVLO/OVLO circuit 422 detects each of the low voltage and the overvoltage of the power supply voltage VCC2, and outputs the result of the detection to the logic circuit 421.

The comparator 423 monitors the terminal voltage of the overheating/load power supply abnormality detection terminal TO_VH to perform overheating detection on the power transistor or overvoltage detection on the load power supply.

The comparator 424 monitors the terminal voltage of the short circuit detection terminal SCPIN to perform short circuit detection on the power transistor (penetration detection on upper and lower power transistors).

The PMOSFET 425 conducts/interrupts between the power supply terminal and the output terminal OUT1H according to an instruction from the logic circuit 421. For example, when the drive pulse signal PWM is high, the PMOSFET 425 is turned on, and thus the output terminal OUT1H (hence, the output pulse signal applied to the gate of the power transistor) is turned high.

The NMOSFET 426 conducts/interrupts between the output terminal OUT1L and the ground end according to an instruction from the logic circuit 421. For example, when the drive pulse signal PWM is low, the NMOSFET 426 is turned on, and thus the output terminal OUT1L (hence, the output pulse signal applied to the gate of the power transistor) is turned low.

As described above, the PMOSFET 425 and the NMOSFET 426 function as a half-bridge output stage for gate drive (CMOS [complementary MOS] inverter stage).

The NMOSFET 427 conducts/interrupts between the ground terminal GND2 and the short circuit detection terminal SCPIN according to an instruction from the logic circuit 421. For example, when OUT1H=H, the NMOSFET 427 is turned off whereas when OUT1H=L, the NMOSFET 427 is turned on. The NMOSFET 427 functions as a discharge switch which is complementarily turned on and off with the power transistor (not shown) to discharge a capacitor (not shown) externally attached between the SCPIN and the GND2.

The transformer chip 430 is a semiconductor chip obtained by integrating a transformer which performs bidirectional signal transmission while isolating between the controller chip 410 and the driver chip 420.

The signal transmission device 400 of the present configuration example independently includes, in addition to the controller chip 410 and the driver chip 420, the transformer chip 430 which incorporates only a transformer, and the signal transmission device 400 is formed by sealing these three chips in a single package.

With this configuration, the controller chip 410 and the driver chip 420 each can be formed by a common low- to middle-withstand-voltage process (with a withstand voltage of several volts to several tens of volts). This eliminates the need for a dedicated high-withstand-voltage process (with a withstand voltage of several kilovolts) and helps reduce manufacturing costs.

Both the controller chip 410 and the driver chip 420 can be produced using proven existing processes, and do not require new reliability tests, with the result that it is possible to reduce a development period and development costs.

Even when a direct-current isolation element (for example, a photocoupler) other than a transformer is used, it is possible to easily cope with such a change by replacing only the transformer chip 430, and thus it is not necessary to redevelop the controller chip 410 and the driver chip 420, with the result that it is possible to reduce a development period and development costs.

<Electronic Device>

Figure 11:
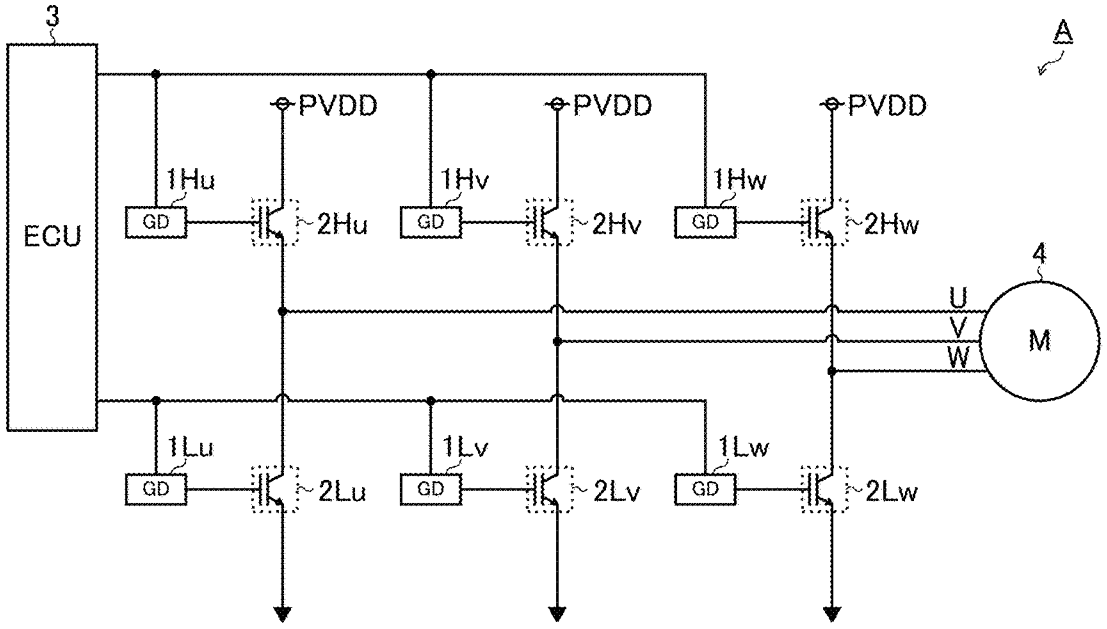
FIG. 11 is a diagram showing one configuration example of an electronic device incorporating the signal transmission device.

FIG. 11 is a diagram showing one configuration example of an electronic device incorporating the signal transmission device 400. The electronic device A of the present configuration example includes upper gate drivers IC 1H (u/v/w), lower gate drivers IC 1L (u/v/w), upper power transistors 2H (u/v/w), lower power transistors 2L (u/v/w), an ECU 3 and a motor 4.

The upper gate drivers IC 1H (u/v/w) generate, while isolating between the ECU 3 and the upper power transistors 2H (u/v/w), upper gate drive signals according to upper gate control signals input from the ECU 3 to drive the upper power transistors 2H (u/v/w).

The lower gate drivers IC 1L (u/v/w) generate, while isolating between the ECU 3 and the lower power transistors 2L (u/v/w), lower gate drive signals according to lower gate control signals input from the ECU 3 to drive the lower power transistors 2L (u/v/w).

As the upper gate drivers IC 1H (u/v/w) and the lower gate drivers IC 1L (u/v/w), the signal transmission device 400 described above can be suitably used.

The upper power transistors 2H (u/v/w) are connected between a power system power supply end (=application end of a load power supply voltage PVDD and the input ends for the phases of the motor 4 as upper switches which form half-bridge output stages of the three phases (U phase/V phase/W phase).

The lower power transistors 2L (u/v/w) are connected between the input ends for the phases of the motor 4 and a power system ground end as lower switches which form the half-bridge output stages of the three phases (U phase/V phase/W phase).

Although in the figure, as each of the upper power transistors 2H (u/v/w) and the lower power transistors 2L (u/v/w), IGBTs [insulated gate bipolar transistor] are used, for example, instead of the IGBTs, MOSFETs can be used.

The ECU 3 drives the upper power transistors 2H (u/v/w) and the lower power transistors 2L (u/v/w) via the upper gate drivers IC1H (u/v/w) and the lower gate drivers IC 1L (u/v/w) to control the rotational drive of the motor 4. The ECU 3 also has the function of monitoring the fault terminals FLT and the ready terminals RDY of the upper gate drivers IC 1H (u/v/w) and the lower gate drivers IC 1L (u/v/w) to perform various types of safety control based on the results of the monitoring.

The ECU 3 further has the function of using the self-diagnosis on signal BISTON to output the result of the self-diagnosis performed by the signal transmission device 400, and confirming, based on the logic level of the self-diagnosis output signal BISTOUT, whether various types of protection circuits (for low voltage protection, overvoltage protection, overheating protection and short circuit protection) of the signal transmission device 400 are normal.

The motor 4 is a three-phase motor which is driven to rotate according to drive voltages U/V/W of the three phases input from the half-bridge output stages of the three phases (U phase/V phase/W phase).

<Self-Diagnosis Circuit>

Figure 12:
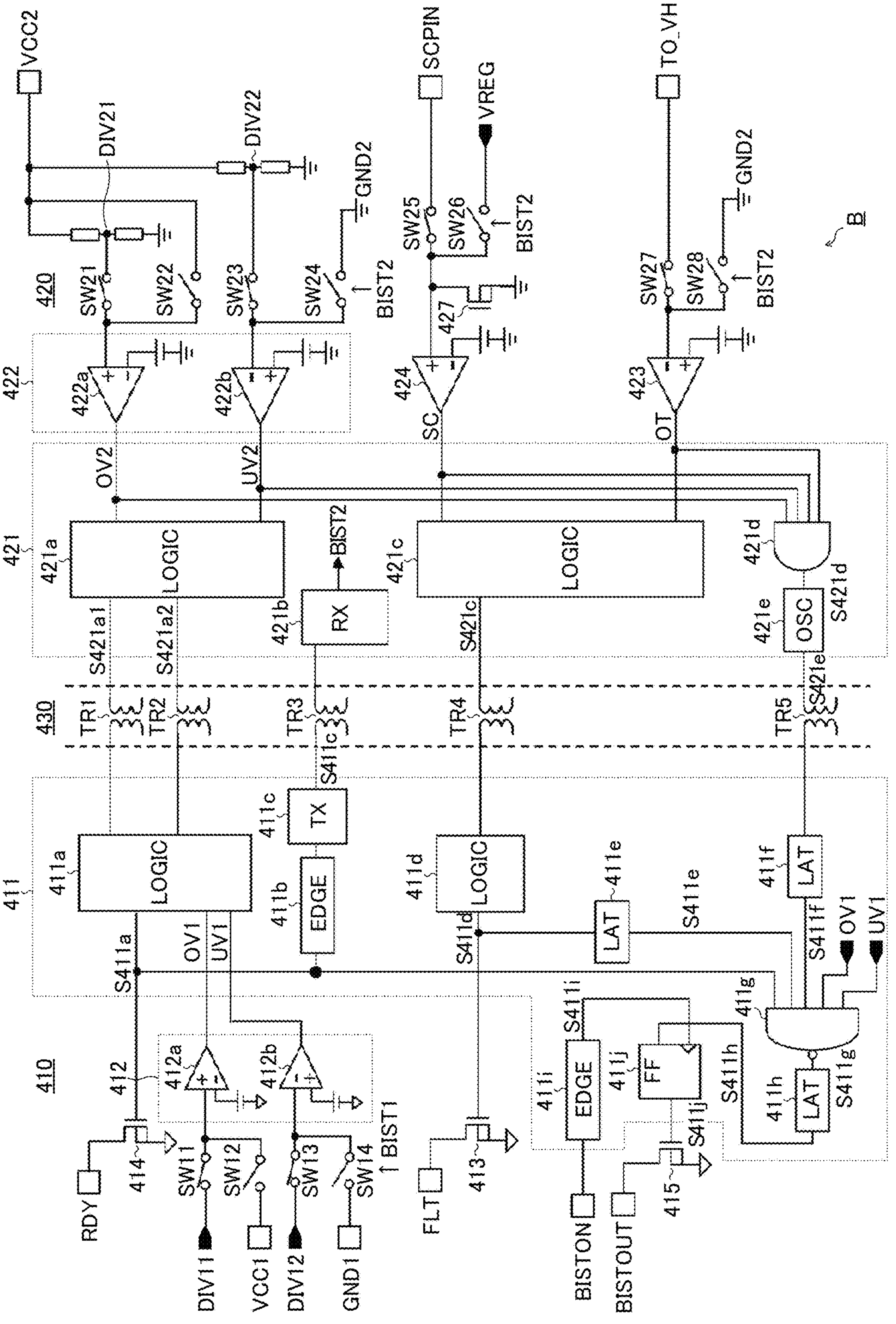
FIG. 12 is a diagram showing one configuration example of a self-diagnosis circuit.

FIG. 12 is a diagram showing one configuration example of the self-diagnosis circuit incorporated in the signal transmission device 400 of the first embodiment (FIG. 10). The self-diagnosis circuit B of the present configuration example includes, as a part thereof, the logic circuits 411 and 421 described previously, and also includes switches SW11 to SW14 and switches SW21 to SW28. In the transformer chip 430, as isolation elements related to the self-diagnosis circuit B, transformers TR1 to TR5 are integrated.

A description will first be given with attention focused on the controller chip 410.

The logic circuit 411 includes, as functional blocks related to the self-diagnosis circuit B, for example, a logic unit 411*a*, an edge detection unit 411*b*, a pulse transmission unit 411*c*, a logic unit 411*d*, latches 411*e* and 411*f*, a NAND gate 411*g*, a latch 411*h*, an edge detection unit 411*i* and a flip-flop 411*j*.

When a low voltage or an overvoltage is detected in one of the UVLO/OVLO circuits 412 and 422, the logic unit

411*a* turns high the gate signal S411*a* of the NMOSFET 414 to turn on the NMOSFET 414, and thereby turns the ready signal RDY low (=logic level when an abnormality is detected). The result of the detection (=an overvoltage detection signal OV1 or a low voltage detection signal UV1) performed by the UVLO/OVLO circuit 412 is directly input to the logic unit 411*a*. On the other hand, the result of the detection (=an overvoltage detection signal OV2 or a low voltage detection signal UV2) performed by the UVLO/OVLO circuit 422 is temporarily input to the logic circuit 421 and is thereafter transmitted via the transformers TR1 and TR2 to the logic unit 411*a*.

The edge detection unit 411*b* detects the falling edge of the gate signal S411*a* (hence, the rising edge of the ready signal RDY), and outputs the result of the detection to the pulse transmission unit 411*c*.

When the falling edge of the gate signal S411*a* is detected by the edge detection unit 411*b*, the pulse transmission unit 411*c* transmits a pulse signal S411*c* (=self-diagnosis command for the driver chip 420) to the logic circuit 421 via the transformer TR3.

When overheating (or a load power supply abnormality) or a short circuit (up/down penetration) in the power transistor is detected in the driver chip 420, the logic unit 411*d* turns high the gate signal S411*d* of the NMOSFET 413 to turn on the NMOSFET 413, and thereby turns the fault terminal FLT low (=logic level when an abnormality is detected). The result of the detection (=an overheating detection signal OT or a short circuit detection signal SC) of overheating or a short circuit is temporarily input to the logic circuit 421 and is thereafter transmitted via the transformer TR4 to the logic unit 411*d*.

The latch 411*e* latches the gate signal S411*d* at a predetermined timing to generate a latch signal S411*e*, and outputs the latch signal S411*e* to the NAND gate 411*g*.

The latch 411*f* latches a secondary BIST result (=pulse signal S421*e*) transmitted from the logic circuit 421 via the transformer TR5 at a predetermined timing to generate a latch signal S411*f*, and outputs the latch signal S411*f* to the NAND gate 411*g*.

The NAND gate 411*g* receives inputs of the gate signal S411*a*, the latch signals S411*e* and S411*f*, the overvoltage detection signal OV1 and the low voltage detection signal UV1 to generate a NAND signal S411*g*. Hence, when at least one of the five signals described above are low (=logic level when no abnormality is detected), the NAND signal S411*g* is high whereas when all the five signals are high (=logic level when an abnormality is detected), the NAND signal S411*g* is low.

The latch 411*h* latches the NAND signal S411*g* at a predetermined timing to generate a latch signal S411*h*, and outputs the latch signal S411*h* to the flip-flop 411*j*.

The edge detection unit 411*i* detects the rising edge of the self-diagnosis on signal BISTON and generates a pulse in the clock signal S411*i* of the flip-flop 411*j*.

The flip-flop 411*j* receives the latch signal S411*h* at a timing when the pulse is generated in the clock signal S411*i*, and outputs the latch signal S411*h* as the gate signal S411*j* of the NMOSFET 415. When the gate signal S411*j* is high, the NMOSFET 415 is turned on, and thus the self-diagnosis output signal BISTOUT is turned low (=logic level when the self-diagnosis is not good) whereas when the gate signal S411*j* is low, the NMOSFET 415 is turned off, and thus the self-diagnosis output signal BISTOUT is brought into a high impedance state (=logic level when the self-diagnosis is OK).

The UVLO/OVLO circuit 412 is one of the diagnostic targets of the self-diagnosis circuit B and includes comparators 412*a* and 412*b*.

The comparator 412*a* compares a monitoring target voltage (DIV11 or VCC1) input to the non-inverting input terminal (+) and an overvoltage detection threshold value input to the inverting input terminal (−) to generate the overvoltage detection signal OV1. When the monitoring target voltage is higher than the overvoltage detection threshold value, the overvoltage detection signal OV1 is high (=logic level when an abnormality occurs) whereas when the monitoring target voltage is lower than the overvoltage detection threshold value, the overvoltage detection signal OV1 is low (=logic level during normal operation).

The comparator 412*b* compares a monitoring target voltage (DIV12 or GND1) input to the inverting input terminal (−) and a low voltage detection threshold value input to the non-inverting input terminal (+) to generate the low voltage detection signal UV1. When the monitoring target voltage is lower than the low voltage detection threshold value, the low voltage detection signal UV1 is high (=logic level when an abnormality occurs) whereas when the monitoring target voltage is higher than the low voltage detection threshold value, the low voltage detection signal UV1 is low (=logic level during normal operation).

The switch SW11 is connected between the application end of a divided voltage DIV11 (=divided voltage of the power supply voltage VCC1) and the non-inverting input terminal (+) of the comparator 412*a*. The switch SW11 is turned off at the time of BIST and is turned on at the time of non-BIST. On the other hand, the switch SW12 is connected between the application end of the power supply voltage VCC1 and the non-inverting input terminal (+) of the comparator 412*a*. The switch SW12 is turned on at the time of BIST and is turned off at the time of non-BIST. In other words, as the monitoring target voltage described above, the divided voltage DIV11 is input to the non-inverting input terminal (+) of the comparator 412*a* at the time of non-BIST, and the power supply voltage VCC1 is input thereto at the time of BIST.

The switch SW13 is connected between the application end of a divided voltage DIV12 (=divided voltage of the power supply voltage VCC1) and the inverting input terminal (−) of the comparator 412*b*. The switch SW13 is turned off at the time of BIST and is turned on at the time of non-BIST. On the other hand, the switch SW14 is connected between the application end of a ground voltage GND1 and the inverting input terminal (−) of the comparator 412*b*. The switch SW14 is turned on at the time of BIST and is turned off at the time of non-BIST. In other words, as the monitoring target voltage described above, the divided voltage DIV12 is input to the inverting input terminal (−) of the comparator 412*b* at the time of non-BIST, and the ground voltage GND1 is input thereto at the time of BIST.

Each of the switches SW11 to SW14 is turned on and off according to a primary side self-diagnosis signal BIST1. For example, the primary side self-diagnosis signal BIST1 is turned low at the time of BIST and is turned high at the time of non-BIST.

A description will then be given with attention focused on the driver chip 420.

The logic circuit 421 includes, as functional blocks related to the self-diagnosis circuit B, for example, a logic circuit 421*a*, a pulse reception unit 421*b*, a logic unit 421*c*, an AND gate 421*d* and an oscillator 421*e*.

The logic circuit 421*a* transmits the result of the detection (=the overvoltage detection signal OV2 or the low voltage detection signal UV2) performed by the UVLO/OVLO circuit 422 to the logic unit 411*a* via the transformers TR1 and TR2. For example, when a low voltage or an overvoltage is detected, the logic circuit 421*a* stops the generation of both pulse signals S421*a*1 and S421*a*2 (hence, the driving of both the transformers TR1 and TR2). The logic unit 411*a* detects that the generation of both the pulse signals S421*a*1 and S421*a*2 (hence, the driving of both the transformers TR1 and TR2) has been stopped and then recognizes that a low voltage or an overvoltage is detected in the logic circuit 421*a*. On the other hand, when the detection of a low voltage or an overvoltage is cancelled (at the time of non-detection), the logic circuit 421*a* uses the pulse signal S421*a*1 or S421*a*2 to drive the transformer TR1 or TR2. For example, when the gate signal (OUTH) of the power transistor is high, the pulse signal S421*a*1 is used to drive the transformer TR1 whereas when the gate signal (OUTH) is low, the pulse signal S421*a*2 is used to drive the transformer TR2.

The pulse reception unit 421*b* generates a secondary side self-diagnosis signal BIST2 according to the pulse signal S411*c* (=self-diagnosis command for the driver chip 420) received via the transformer TR3.

The logic unit 421*c* transmits the result of the detection (=the overheating detection signal OT or the short circuit detection signal SC) of overheating or a short circuit via the transformer TR4 to the logic unit 411*d*. For example, when overheating or a short circuit is detected, the logic unit 421*c* uses a pulse signal S421*c* to drive the transformer TR4.

The AND gate 421*d* receives inputs of the overvoltage detection signal OV2, the low voltage detection signal UV2, the overheating detection signal OT and the short circuit detection signal SC to generate an AND signal S421*d*. Hence, when at least one of the four signals described above are low (=logic level when no abnormality is detected), the AND signal S421*d* is low whereas when all the four signals are high (=logic level when an abnormality is detected), the AND signal S421*d* is high.

When the AND signal S421*d* is turned high, the oscillator 421*e* transmits the pulse signal S421*e* (=the result of the self-diagnosis on the controller chip 410, and for example, 10 MHz and 3CLK) via the transformer TR5 to the logic circuit 411.

The UVLO/OVLO circuit 422 is one of the diagnostic targets of the self-diagnosis circuit B and includes comparators 422*a* and 422*b*. Each of the comparators 423 and 424 is also one of the diagnostic targets of the self-diagnosis circuit B.

The comparator 422*a* compares a monitoring target voltage (DIV21 or VCC2) input to the non-inverting input terminal (+) and an overvoltage detection threshold value input to the inverting input terminal (−) to generate the overvoltage detection signal OV2. When the monitoring target voltage is higher than the overvoltage detection threshold value, the overvoltage detection signal OV2 is high (=logic level when an abnormality occurs) whereas when the monitoring target voltage is lower than the overvoltage detection threshold value, the overvoltage detection signal OV2 is low (=logic level during normal operation).

The comparator 422*b* compares a monitoring target voltage (DIV22 or GND2) input to the inverting input terminal (−) and a low voltage detection threshold value input to the non-inverting input terminal (+) to generate the low voltage detection signal UV2. When the monitoring target voltage is lower than the low voltage detection threshold value, the low voltage detection signal UV2 is high (=logic level when an abnormality occurs) whereas when the monitoring target voltage is higher than the low voltage detection threshold value, the low voltage detection signal UV2 is low (=logic level during normal operation).

The comparator 423 compares a monitoring target voltage (TO_VH or GND2) input to the inverting input terminal (−) and an overheating detection threshold value input to the non-inverting input terminal (+) to generate the overheating detection signal OT. When the monitoring target voltage is lower than the overheating detection threshold value, the overheating detection signal OT is high (=logic level when an abnormality occurs) whereas when the monitoring target voltage is higher than the overheating detection threshold value, the overheating detection signal OT is low (=logic level during normal operation).

The comparator 424 compares a monitoring target voltage (SCPIN or VREG) input to the non-inverting input terminal (+) and a short circuit detection threshold value input to the inverting input terminal (−) to generate the short circuit detection signal SC. When the monitoring target voltage is higher than the short circuit detection threshold value, the short circuit detection signal SC is high (=logic level when an abnormality occurs) whereas when the monitoring target voltage is lower than the short circuit detection threshold value, the short circuit detection signal SC is low (=logic level during normal operation).

The switch SW21 is connected between the application end of a divided voltage DIV21 (=divided voltage of the power supply voltage VCC2) and the non-inverting input terminal (+) of the comparator 422*a*. The switch SW21 is turned off at the time of BIST and is turned on at the time of non-BIST. On the other hand, the switch SW22 is connected between the application end of the power supply voltage VCC2 and the non-inverting input terminal (+) of the comparator 422*a*. The switch SW22 is turned on at the time of BIST and is turned off at the time of non-BIST. In other words, as the monitoring target voltage described above, the divided voltage DIV21 is input to the non-inverting input terminal (+) of the comparator 422*a* at the time of non-BIST, and the power supply voltage VCC2 is input thereto at the time of BIST.

The switch SW23 is connected between the application end of a divided voltage DIV22 (=divided voltage of the power supply voltage VCC2) and the inverting input terminal (−) of the comparator 422*b*. The switch SW23 is turned off at the time of BIST and is turned on at the time of non-BIST. On the other hand, the switch SW24 is connected between the application end of a ground voltage GND2 and the inverting input terminal (−) of the comparator 422*b*. The switch SW24 is turned on at the time of BIST and is turned off at the time of non-BIST. In other words, as the monitoring target voltage described above, the divided voltage DIV22 is input to the inverting input terminal (−) of the comparator 422*b* at the time of non-BIST, and the ground voltage GND2 is input thereto at the time of BIST.

The switch SW25 is connected between the application end of the short circuit detection voltage SCPIN (=terminal voltage of the SCPIN terminal) and the non-inverting input terminal (+) of the comparator 424. The switch SW25 is turned off at the time of BIST and is turned on at the time of non-BIST. On the other hand, the switch SW26 is connected between the application end of an internal voltage VREG and the non-inverting input terminal (+) of the comparator 424. The switch SW24 is turned on at the time of BIST and is turned off at the time of non-BIST. In other words, as the monitoring target voltage described above, the short circuit detection voltage SCPIN is input to the non-inverting input terminal (+) of the comparator 424 at the time of non-BIST, and the internal voltage VREG is input thereto at the time of BIST. At the time of BIST, the NMOSFET 427 is turned off.

The switch SW27 is connected between the application end of the overheating detection voltage TO_VH (=terminal voltage of the overheating/load power supply abnormality detection terminal TO_VH) and the inverting input terminal (−) of the comparator 423. The switch SW27 is turned off at the time of BIST and is turned on at the time of non-BIST. On the other hand, the switch SW27 is connected between the application end of the ground voltage GND2 and the inverting input terminal (−) of the comparator 423. The switch SW27 is turned on at the time of BIST and is turned off at the time of non-BIST. In other words, as the monitoring target voltage described above, the overheating detection voltage TO_VH is input to the inverting input terminal (−) of the comparator 423 at the time of non-BIST, and the ground voltage GND2 is input thereto at the time of BIST.

Each of the switches SW21 to SW28 is turned on and off according to the secondary side self-diagnosis signal BIST2. For example, the secondary side self-diagnosis signal BIST2 is turned low at the time of BIST and is turned high at the time of non-BIST.

The self-diagnosis circuit B described above sets, to the diagnostic targets, the UVLO/OVLO circuit 412 (comparators 412*a* and 412*b*), the UVLO/OVLO circuit 422 (comparators 422*a* and 422*b*), an overheating detection circuit (comparator 423) and a short circuit detection circuit (comparator 424), and also sets, to the diagnostic target, a first signal transmission path (the transformers TR1 and TR2 for RDY output and the transformer TR4 for FLT output) along which the result of the detection of an abnormality in the driver chip 420 is transmitted to the controller chip 410, with the result that it is possible to check whether the functional blocks of each of the diagnostic targets are operated normally.

For example, in order to diagnose whether each of the comparators 412*a* and 412*b*, the comparators 422*a* and 422*b* and the comparators 423 and 424 is operated properly, it is preferable to apply, as the monitoring target voltage input to each of them, a test voltage (for example, the power supply voltages VCC1 and VCC2, the ground voltages GND1 and GND2 or the internal voltage VREG) outside a normal input range to check whether the abnormality detection signal (OV1/UV1, OV2/UV2, SC or OT) of each of them is high (=logic level when an abnormality is detected).

In order to diagnose whether the first signal transmission path (the transformers TR1 and TR2 for RDY output and the transformer TR4 for FLT output) is operated properly, it is preferable to check whether the ready signal RDY and the fault signal FLT are turned low (=logic level when an abnormality is detected) by the logic units 411*a* and 411*d*, that is, whether the gate signals S411*a* and S411*d* are high.

When all the diagnostic targets are operated properly, all the five signals (S411*a*, S411*e*, S411*f*, OV1 and UV1) input to the NAND gate 411*g* are high (=logic level when an abnormality is detected), and thus the NAND signal S411*g* is low. Hence, when the self-diagnosis on signal BISTON is turned high, the NMOSFET 415 is turned off, and thus the self-diagnosis output signal BISTOUT has a high impedance (=logic level when the self-diagnosis is OK).

On the other hand, when at least one of the diagnostic targets described above are not operated properly, at least one of the five signals (S411*a*, S411*e*, S411*f*, OV1 and UV1) input to the NAND gate 411*g* are low (=logic level when no abnormality is detected), and thus the NAND signal S411*g* is high. Hence, when the self-diagnosis on signal BISTON is turned high, the NMOSFET 415 is turned on, and thus the self-diagnosis output signal BISTOUT is turned low (=logic level when the self-diagnosis is not good).

As described above, the signal transmission device 400 of the present configuration example includes: a first abnormality detection circuit (UVLO/OVLO circuit 412) configured to detect an abnormality in the controller chip 410 provided in the primary circuit system 400*p*; a second abnormality detection circuit (the UVLO/OVLO circuit 422, the comparator 423 for overheating detection and the comparator 424 for short circuit detection) configured to detect an abnormality in the driver chip 420 provided in the secondary circuit system 400*s*; the first signal transmission path (TR1, TR2 and TR4) configured to transmit the result of the detection (OV2, UV2, OT and SC) performed by the second abnormality detection circuit from the secondary circuit system 400*s* to the primary circuit system 400*p* while isolating between the primary circuit system 400*p* and the secondary circuit system 400*p*; and the self-diagnosis circuit B which is configured to perform self-diagnosis on each of the first abnormality detection circuit (412), the second abnormality detection circuit (422, 423 and 424) and the first signal transmission path (TR1, TR2 and TR4).

The self-diagnosis circuit B includes a second signal transmission path (421*d*, 421*e* and TR5) which is configured to transmit, while isolating between the controller chip 410 of the primary circuit system 400*p* and the driver chip 420 of the secondary circuit system 400*s*, the result of the self-diagnosis performed by the second abnormality detection circuit (422, 423 and 424) from the driver chip 420 of the secondary circuit system 400*s* to the controller chip 410 of the primary circuit system 400*p*.

With reference to the figure, the second signal transmission path is preferably configured to transmit the result of the detection (OV2, UV2, OT and SC) in the driver chip 420 as a single pulse signal S421*e* to the controller chip 410 using the AND gate 421*d*, the oscillator 421*e* and the transformer TR5.

<Self-Diagnostic Operation (First Embodiment)>

Figure 13:
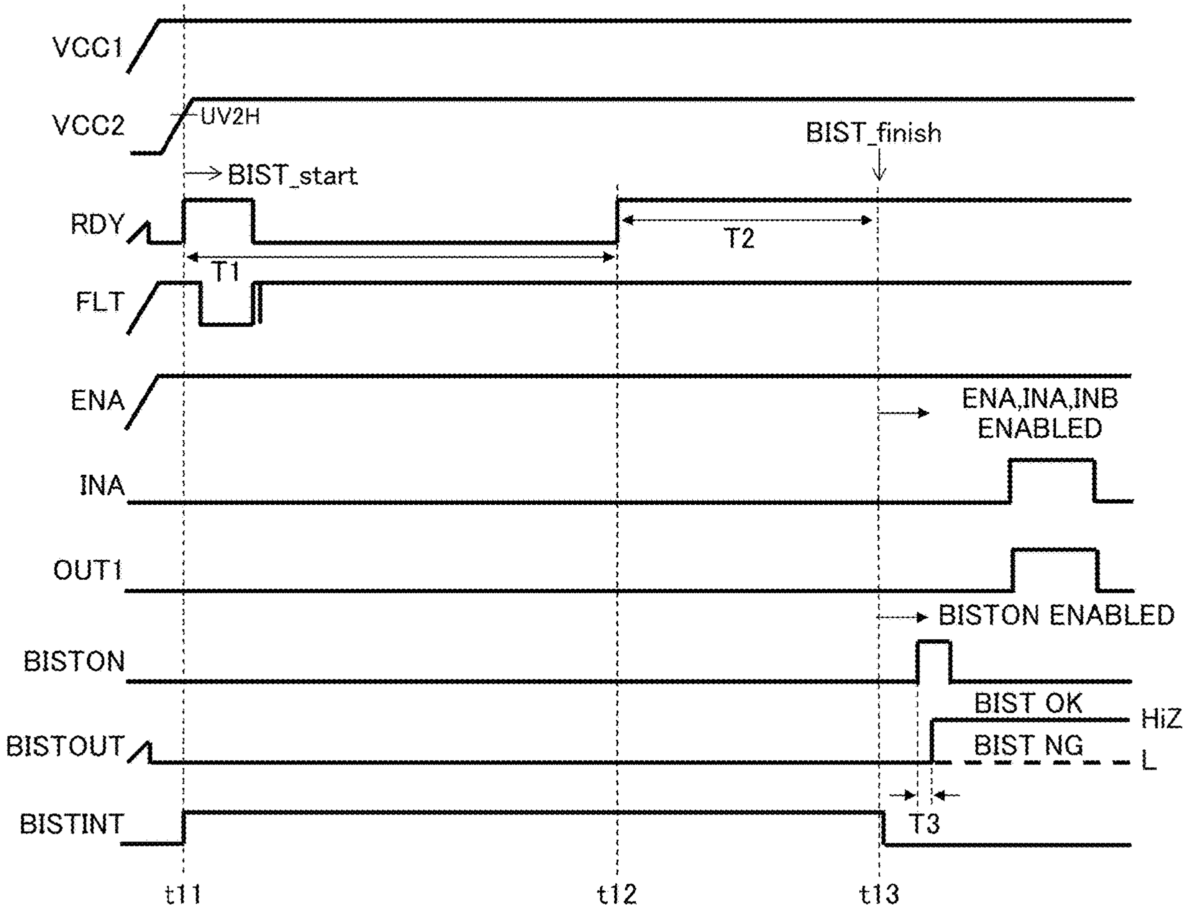
FIG. 13 is a diagram showing a first example (when power is turned on) of a self-diagnostic operation in the first embodiment.

FIG. 13 is a diagram showing a first example (when power is turned on) of a self-diagnostic operation in the first embodiment (FIG. 10 to FIG. 12). The figure shows, sequentially from above, the power supply voltages VCC1 and VCC2, the ready signal RDY, the fault signal FLT, the enable signal ENA, the input pulse signal INA, an output pulse signal OUT1 (corresponding to the output pulse signal OUT1H described previously), the self-diagnosis on signal BISTON, the self-diagnosis output signal BISTOUT and an internal BIST signal BISTINT (=logic signal generated inside the logic circuit 411 to set a total self-diagnosis period).

After power is turned on, when the UVLO of the power supply voltages VCC1 and VCC2 is cancelled at time t11, and the ready signal RDY is turned from low to high (=state where the ready terminal RDY has a high impedance), the internal BIST signal BISTINT is turned high, and thus the self-diagnostic operation is started.

Here, the switches SW11 and SW13 and the switches SW21, SW23, SW25 and SW27 are turned off, and the switches SW12 and SW14 and the switches SW22, SW24, SW26 and SW28 are turned on.

In other words, as the monitoring target voltage input to each of the comparators 412*a* and 412*b*, the comparators 422*a* and 422*b* and the comparators 423 and 424, the test voltage (for example, the power supply voltages VCC1 and VCC2, the ground voltages GND1 and GND2 or the internal voltage VREG) outside the normal input range is applied thereto.

Preferably, the internal BIST signal BISTINT does not depend on the enable signal ENA and the like and depends on only the rising edge of the ready signal RDY. Preferably, the high-level period (corresponding to the total self-diagnosis period) of the internal BIST signal BISTINT is previously set by an internal timer. In the present configuration, a completion flag in the self-diagnostic operation is not needed.

During the self-diagnostic operation, the input pulse signals INA and INB and the enable signal ENA are preferably disabled. In other words, preferably, during the self-diagnostic operation, the output pulse signal OUT1 (OUT1H and OUT1L described previously) is fixed at a low level, and the power transistor is kept in an off state.

Likewise, during the self-diagnostic operation, the self-diagnosis on signal BISTON (hence, the self-diagnosis output signal BISTOUT) is preferably disabled. For example, the self-diagnosis on signal BISTON is preferably masked. Hence, even when the self-diagnosis on signal BISTON is turned high during the self-diagnostic operation, the self-diagnosis output signal BISTOUT is kept fixed at a low level.

During the self-diagnostic operation, the ready signal RDY and the fault signal FLT are at logic levels corresponding to the internal state of the signal transmission device 400 without being fixed. In this way, it is possible to check, from outside the device, whether the self-diagnostic operation is performed.

When at time t12, a predetermined period T1 (for example, the maximum of 150 μs) has elapsed since the start of the self-diagnostic operation (time t11), the switches SW11 and SW13 and the switches SW21, SW23, SW25 and SW27 are turned on, and the switches SW12 and SW14 and the switches SW22, SW24, SW26 and SW28 are turned off.

In other words, the original monitoring target voltages (the divided voltages DIV11 and DIV12, the divided voltages DIV21 and DIV22, the overheating detection voltage TO_VH and the short circuit detection terminal SCPIN) are input to the comparators 412*a* and 412*b*, the comparators 422*a* and 422*b* and the comparators 423 and 424.

Here, although the ready signal RDY is turned high, during the high-level period of the internal BIST signal BISTINT, the rising edge of the ready signal RDY is preferably ignored so that the self-diagnostic operation is not started again. In other words, even when RDY=L→HiZ during the self-diagnostic operation, the internal timer for counting the high-level period of the internal BIST signal BISTINT is prevented from being reset.

Thereafter, when at time t13, a predetermined period T2 (for example, the maximum of 250 μs) has elapsed since the switching of the switches described above (time t12), the internal BIST signal BISTINT is turned low, and thus the series of steps in the self-diagnostic operation described above are completed. Thereafter, the input pulse signals INA and INB, the enable signal ENA and the self-diagnosis on signal BISTON each are enabled.

For example, when the self-diagnosis on signal BISTON is turned high at an arbitrary timing, after a predetermined period T3 has elapsed, the result of the self-diagnosis at that time is latched, and is output as the self-diagnosis output signal BISTOUT. Here, when the result of the self-diagnosis is not good, BISTOUT=L (dashed line) whereas when the result of the self-diagnosis is OK, BISTOUT=HiZ (solid line). The latching of the self-diagnosis output signal BISTOUT is preferably reset by the falling edge of the ready signal RDY.

When the comparator 412*b* or 422*b* is faulty, and the ready signal RDY is not turned high even after power is turned on, the self-diagnostic operation cannot be started. However, since it is clear that any abnormality has occurred in the signal transmission device 400 when the ready signal RDY is kept at a low level even after power is turned on, there is no particular problem even if the self-diagnostic operation cannot be started.

Figure 14:
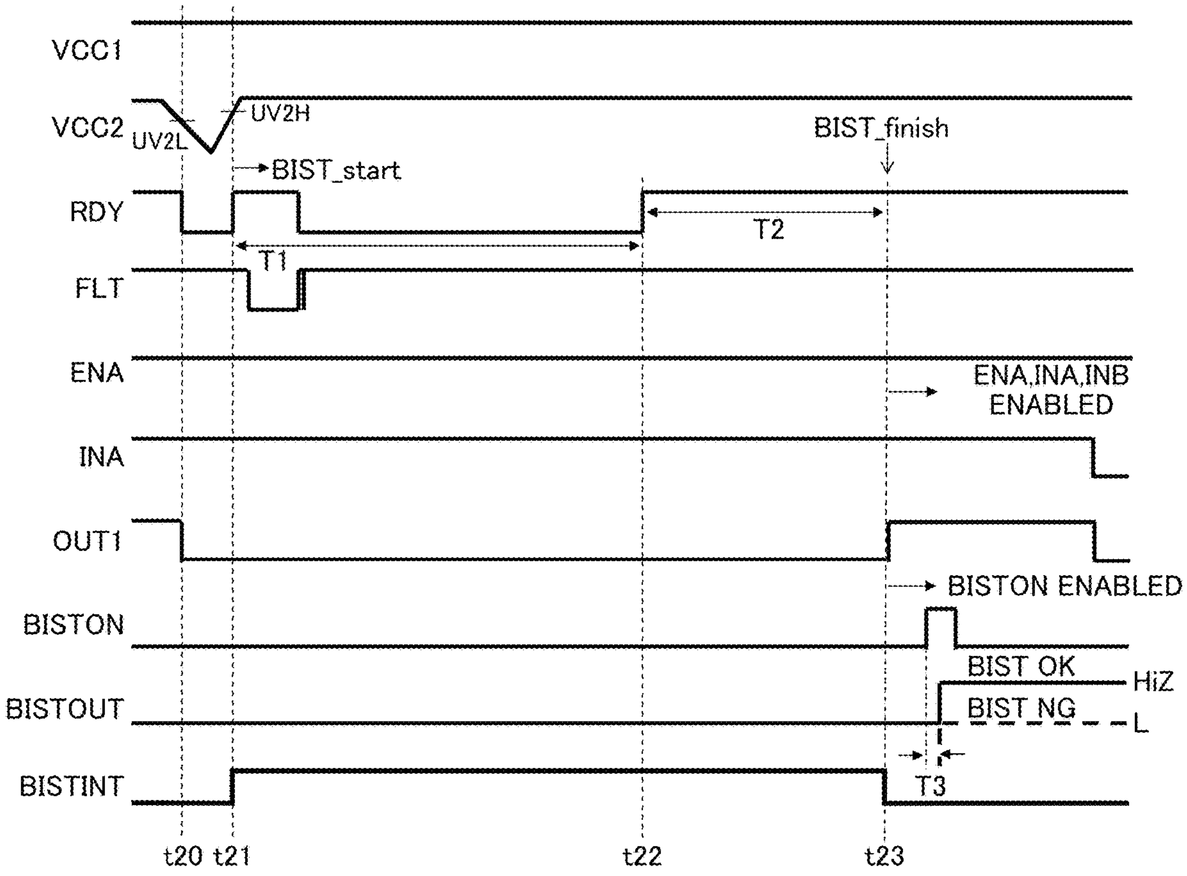
FIG. 14 is a diagram showing a second example (UV2 detection→at the time of cancellation) of the self-diagnostic operation in the first embodiment.

FIG. 14 is a diagram showing a second example (UV2 detection→at the time of cancellation) of the self-diagnostic operation in the first embodiment (FIG. 10 to FIG. 12). As with FIG. 13, the figure shows, sequentially from above, the power supply voltages VCC1 and VCC2, the ready signal RDY, the fault signal FLT, the enable signal ENA, the input pulse signal INA, the output pulse signal OUT1 (corresponding to the output pulse signal OUT1H described previously), the self-diagnosis on signal BISTON, the self-diagnosis output signal BISTOUT and the internal BIST signal BISTINT.

As shown in the figure, the self-diagnostic operation described above is performed not only when power is turned on (FIG. 13) but also, for example, after the detection of the UVLO of the power supply voltage VCC2 at time t20 and when the UVLO is cancelled at time t21. The self-diagnostic operation after time t21 is the same as that after time t11 in FIG. 13, and thus repeated description is omitted.

<Signal Transmission Device (Second Embodiment)>

Figure 15:
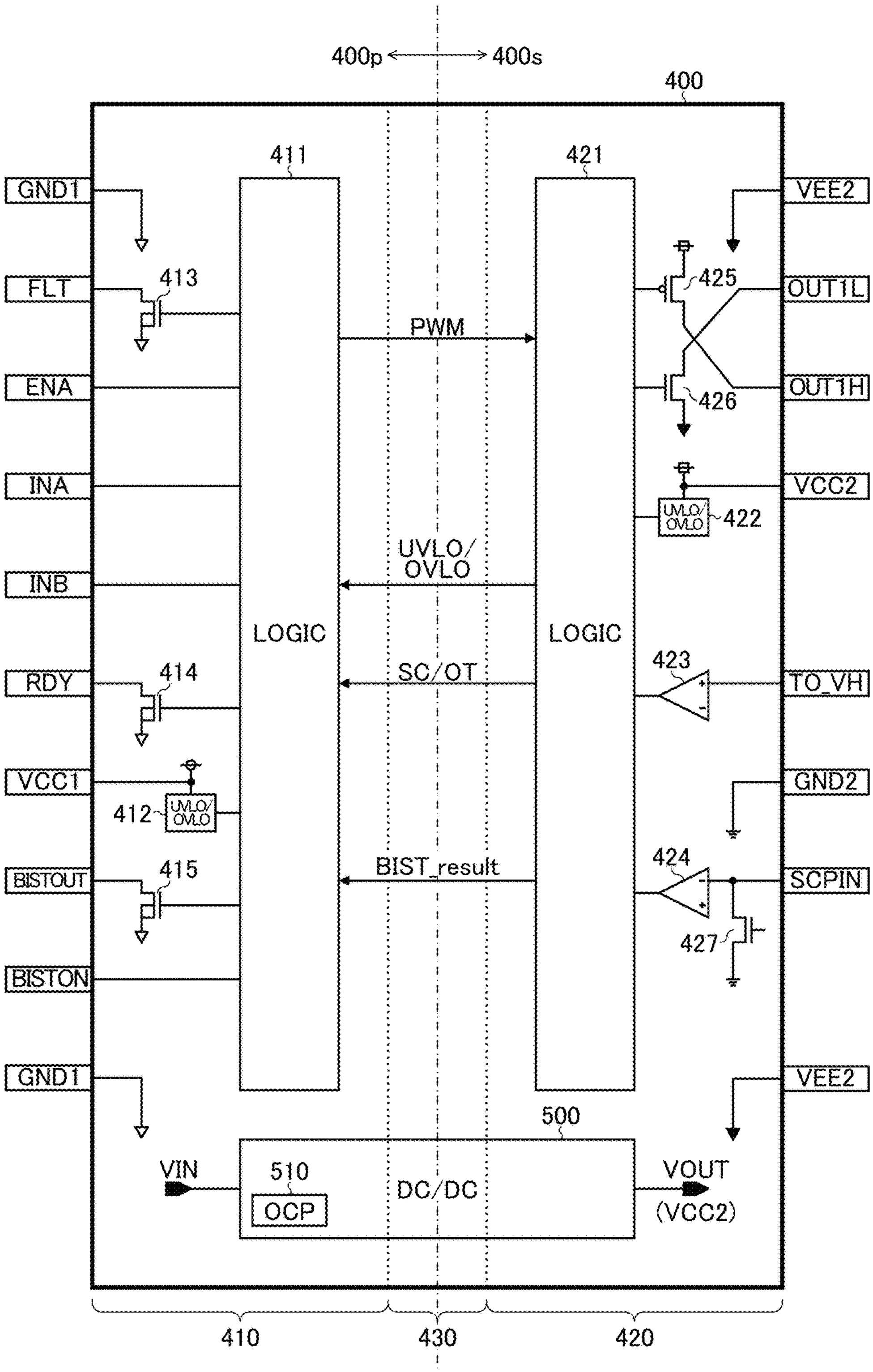
FIG. 15 is a diagram showing a second embodiment of the signal transmission device.

FIG. 15 is a diagram showing a second embodiment of the signal transmission device. The signal transmission device 400 of the second embodiment further includes a power supply circuit 500 based on the first embodiment (FIG. 10 to FIG. 12) described above.

The power supply circuit 500 generates the desired output voltage VOUT (=for example, the power supply voltage VCC2 of the secondary circuit system 400*s*) from an input voltage VIN while isolating between the primary circuit system 400*p* and the secondary circuit system 400*s*. The power supply circuit 500 may include an overcurrent protection circuit 510 which is provided in the primary circuit system 400*p* (details of which will be described later).

As described above, in the signal transmission device 400 including the isolating power supply circuit 500, as a means for generating the power supply voltage VCC2 of the secondary circuit system 400*s*, an additional power supply IC is not needed.

<Power Supply Circuit>

Figure 16:
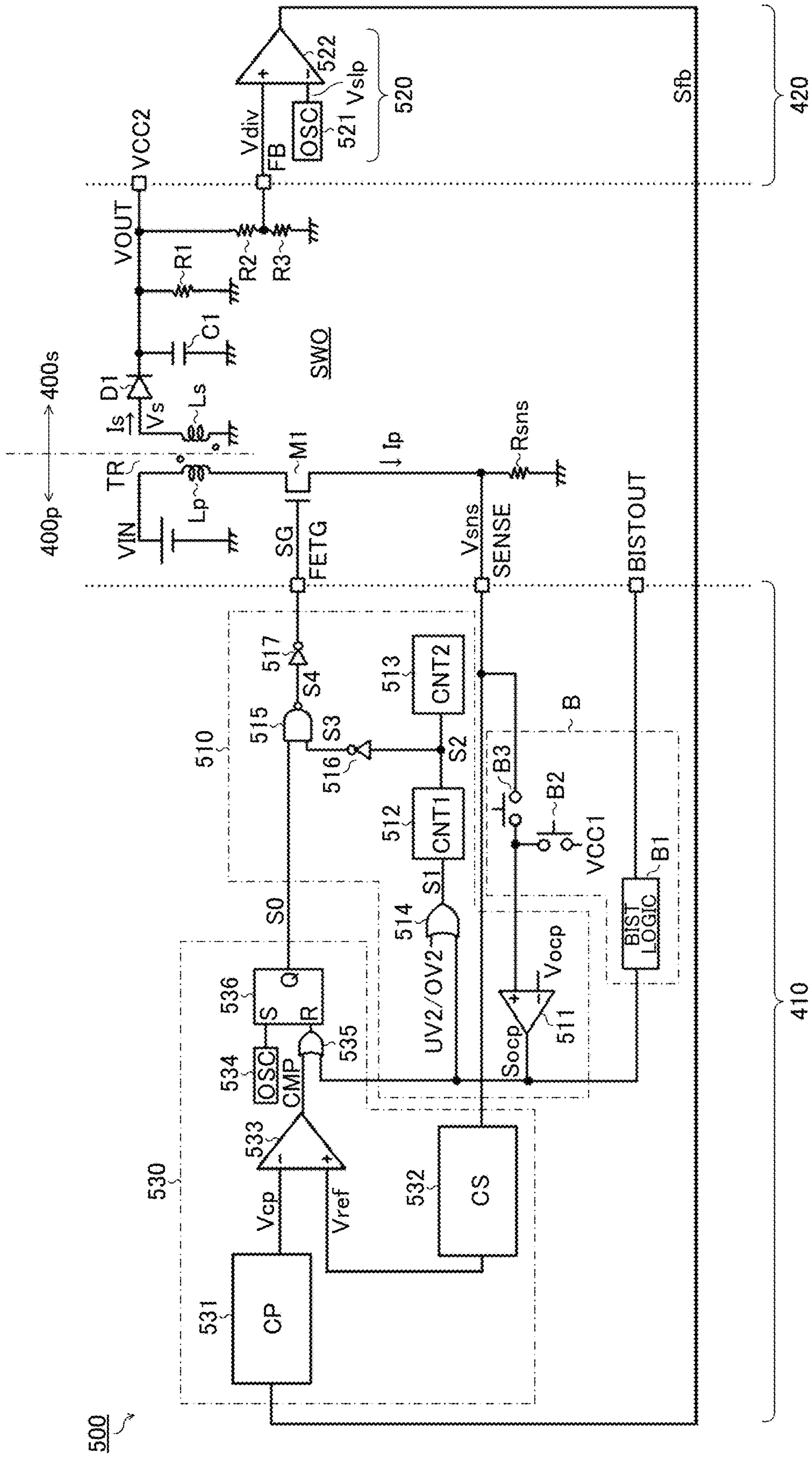
FIG. 16 is a diagram showing one configuration example of a power supply circuit.

FIG. 16 is a diagram showing one configuration example of the power supply circuit 500. The power supply circuit 500 of the present configuration example includes the overcurrent protection circuit 510, a feedback signal generation circuit 520, a feedback control circuit 530 and various discrete components (a transformer TR, an output transistor M1, a diode D1, a capacitor C1, resistors R1 to R3 and a sense resistor Rsns).

The transformer TR includes a primary coil Lp (the number of turns Np) and a secondary coil Ls (the number of turns Ns) which are magnetically coupled to each other while electrically isolating between the primary circuit system 400*p* and the secondary circuit system 400*s*.

The first end (winding start end) of the primary coil Lp is connected to the application end of the input voltage VIN. The second end (winding completion end) of the primary coil Lp is connected to the drain of the output transistor M1 (in the figure, the NMOSFET). The gate of the output transistor M1 is connected to the application end of a gate drive signal SG. Both the source of the output transistor M1 and the first end of the sense resistor Rsns are connected to the application end of the sense voltage Vsns. The second end of the sense resistor Rsns is connected to the ground end of the primary circuit system 400*p*.

The output transistor M1 connected as described above functions as a switch element for turning on and off a primary current Ip according to the gate drive signal SG. In a case where the NMOSFET is used as the output transistor M1, the output transistor M1 is in an on state when the gate drive signal SG is high and is in an off state when the gate drive signal SG is low.

The sense resistor Rsns functions as a current/voltage conversion element which generates the sense voltage Vsns (=Ip×Rsns) corresponding to the primary current Ip flowing through the primary coil Lp of the transformer TR via the output transistor M1.

Both the first end (winding start end) of the secondary coil Ls and the anode of the diode D1 are connected to the application end of a secondary voltage Vs. The cathode of the diode D1 and the first ends of the capacitor C1 and the resistor R1 each are connected to the application end of the output voltage VOUT (=power supply voltage VCC2). The second end (winding completion end) of the secondary coil Ls and the second ends of the capacitor C1 and the resistor R1 each are connected to the ground end of the secondary circuit system 400*s*.

Among the constituent elements described above, the output transistor M1, the transformer TR, the diode D1 and the capacitor C1 form a flyback type switch output stage SWO in order to generate the output voltage VOUT (=power supply voltage VCC2) of the secondary circuit system 400*s* from the input voltage VIN of the primary circuit system 400*p*.

The basic operation of the switch output stage SWO will be described. The switch output stage SWO drives the primary current Ip flowing through the primary coil Lp of the transformer TR to generate the output voltage VOUT from the secondary voltage Vs induced in the secondary coil Ls of the transformer TR.

Specifically, during the on period Ton of the output transistor M1, the primary current Ip flows from the application end of the input voltage VIN via the primary coil Lp and the output transistor M1. Hence, electrical energy is stored in the primary coil Lp. Thereafter, when the output transistor M1 is turned off, the secondary voltage Vs is induced in the secondary coil Ls magnetically coupled to the primary coil Lp. The secondary voltage Vs is rectified and smoothed via the diode D1 and the capacitor C1. By the rectification/smoothing operation as described above, the output voltage VOUT (=power supply voltage VCC2) is generated from the secondary voltage Vs. Thereafter, the output transistor M1 is turned on and off, and thus the same switching output operation as described above is repeated.

Preferably, the number of turns Np and the number of turns Ns in the transformer TR are arbitrarily adjusted such that the desired output voltage VOUT (=VIN×(Ns/Np)×(Ton/Toff) where Ton and Toff are the on time and the off time of the output transistor M1) is obtained. For example, as the number of turns Np is increased or as the number of turns Ns is decreased, the output voltage VOUT (=power supply voltage VCC2) is lowered. By contrast, as the number of turns Np is decreased or as the number of turns Ns is increased, the output voltage VOUT (=power supply voltage VCC2) is increased.

The first end of the resistor R2 is connected to the application end of the output voltage VOUT (=power supply voltage VCC2). Both the second end of the resistor R2 and the first end of the resistor R3 are connected to the application end of a divided voltage Vdiv. The second end of the resistor R3 is connected to the ground end of the secondary circuit system 400*s*.

The resistors R2 and R3 connected as described above function as a voltage divider circuit which generates the divided voltage Vdiv (=VOUT×R3/(R2+R3)) corresponding to the output voltage VOUT (=power supply voltage VCC2).

The overcurrent protection circuit 510 is one of power supply abnormality detection units which restrict the primary current Ip flowing through the primary coil Lp of the transformer TR via the output transistor M1 to an overcurrent detection value Iocp or less. The overcurrent protection circuit 510 is one of the diagnostic targets performed by the self-diagnosis circuit B as with the UVLO/OVLO circuits 412 and 422, the comparators 423 and 424 and the first signal transmission path (TR1, TR2 and TR4) described above.

With reference to the figure, the overcurrent protection circuit 510 includes a comparator 511, counters 512 and 513, an OR gate 514, a NAND gate 515 and inverters 516 and 517.

At the time of non-BIST, the comparator 511 compares the sense voltage Vsns input to the non-inverting input terminal (+) and a predetermined threshold voltage Vocp input to the inverting input terminal (−) to generate an overcurrent detection signal Socp.

When the sense voltage Vsns is higher than the threshold voltage Vocp, the overcurrent detection signal Socp is high (=logic level when an overcurrent is detected). On the other hand, when the sense voltage Vsns is lower than the threshold voltage Vocp, the overcurrent detection signal Socp is low (=logic level when no overcurrent is detected).

In other words, when the primary current Ip is higher than the overcurrent detection value Iocp, the overcurrent detection signal Socp is high (=logic level when an overcurrent is detected). On the other hand, when the primary current Ip is lower than the overcurrent detection value Iocp, the overcurrent detection signal Socp is low (=logic level when an overcurrent is detected).

The counter 512 receives an input of an internal signal S1 to output an internal signal S2. For example, the internal signal S1 is turned high (=logic level when an abnormality is detected), and this triggers the counter 512 to turn the internal signal S2 high (=logic level when a forced stop is made) without delay. On the other hand, the internal signal S1 is turned low (=logic level when no abnormality is detected), and this triggers the counter 512 to start counting a waiting time Tw (for example, 40 ms) and to turn the internal signal S2 low (=logic level when a forced stop is cancelled) when the counting is completed.

However, during a soft start operation (details of which will be described later), the counter 512 turns the internal signal S2 low immediately when the internal signal S1 is turned low without starting counting the waiting time Tw.

The internal signal S2 is turned low (=logic level when a forced stop is cancelled), and this triggers the counter 513 to count a soft start period Tss (for example, 12.5 ms). The soft start period Tss is used for the soft start operation (=variable control of the threshold voltage Vocp) performed by the overcurrent protection circuit 510. The details of the soft start operation will be described later.

The OR gate 514 generates the internal signal S1 by performing a logical OR operation on the overcurrent detection signal Socp and the result of detection of a driver abnormality (overvoltage detection signal OV2/low voltage detection signal UV2). When at least one of the overcurrent detection signal Socp and the result of the detection of the driver abnormality (OV2/UV2) are high (=logic level when an abnormality is detected), the internal signal S1 is high (=logic level when an abnormality is detected). On the other hand, when both the overcurrent detection signal Socp and the result of the detection of the driver abnormality (OV2/UV2) are low (=logic level when no abnormality is detected), the internal signal S1 is low (=logic level when no abnormality is detected).

The NAND gate 515 generates an internal signal S4 by performing a negative AND operation on a gate control signal S0 and the internal signal S3. When at least one of the gate control signal S0 and the internal signal S3 are low, the internal signal S4 is high. On the other hand, when both the gate control signal S0 and the internal signal S3 are high, the internal signal S4 is low.

In other words, when the internal signal S3 is high, a signal obtained by inverting the logic level of the gate control signal S0 is output as the internal signal S4. On the other hand, when the internal signal S3 is low, the internal signal S4 is fixed at a high level (=logic level when a forced stop is made) without depending on the logic level of the gate control signal S0.

The inverter 516 inverts the logic level of the internal signal S2 to generate the internal signal S3. Hence, when the internal signal S2 is high, the internal signal S3 is low whereas when the internal signal S2 is low, the internal signal S3 is high.

The inverter 517 inverts the logic level of the internal signal S4 to generate the gate drive signal SG. Hence, when the internal signal S4 is high, the gate drive signal SG is low whereas when the internal signal S4 is low, the gate drive signal SG is high. As described above, the inverter 517 also functions as a driver for generating the gate drive signal SG.

Examples of the power supply abnormality detection unit for detecting an abnormality in the power supply circuit 500 include, in addition to the overcurrent protection circuit 510, an overvoltage protection circuit which restricts the output voltage VOUT (=power supply voltage VCC2) to an overvoltage detection value Vovp or less and the like.

The feedback signal generation circuit 520 generates a feedback signal Sfb having pulse information corresponding to the output voltage VOUT (=power supply voltage VCC2) to output the feedback signal Sfb from the secondary circuit system 400*s* to the primary circuit system 400*p*. With reference to the figure, the feedback signal generation circuit 520 includes an oscillator 521 and a comparator 522. The feedback signal generation circuit 520 is provided in the secondary circuit system 400*s* (in particular, the driver chip 420).

The oscillator 521 generates a triangular or sawtooth slope voltage Vslp at a predetermined oscillation frequency.

The comparator 522 compares the divided voltage Vdiv input to the non-inverting input terminal (+) and the slope voltage Vslp input to the inverting input terminal (−) to generate the feedback signal Sfb. When the divided voltage Vdiv is higher than the slope voltage Vslp, the feedback signal Sfb is high. On the other hand, when the divided voltage Vdiv is lower than the slope voltage Vslp, the feedback signal Sfb is low.

The feedback control circuit 530 receives the feedback signal Sfb, and performs duty cycle control on the gate control signal S0 (hence, the gate drive signal SG) such that the output voltage VOUT (=power supply voltage VCC2) matches a target value. In other words, the feedback control circuit 530 controls the switch output stage SWO so as to drive the primary current Ip according to the feedback signal Sfb. The feedback control circuit 530 is provided in the primary circuit system 400*p* (in particular, the controller chip 410).

With reference to the figure, the feedback control circuit 530 includes a charge pump 531, a current detection unit 532, a comparator 533, an oscillator 534, an OR gate 535 and a RS flip-flop 536.

The charge pump 531 outputs a charge pump voltage Vcp which is increased or decreased according to the feedback signal Sfb. For example, when the feedback signal Sfb is high, the charge pump voltage Vcp is increased whereas when the feedback signal Sfb is low, the charge pump voltage Vcp is decreased.

The current detection unit 532 outputs a triangular or sawtooth reference voltage Vref which has a DC bias value corresponding to the sense voltage Vsns.

The comparator 533 compares the charge pump voltage Vcp input to the inverting input terminal (−) and the reference voltage Vref input to the non-inverting input terminal (+) to output a comparison signal CMP. When the charge pump voltage Vcp is higher than the reference voltage Vref, the comparison signal CMP is low. On the other hand, when the charge pump voltage Vcp is lower than the reference voltage Vref, the comparison signal CMP is high.

The oscillator 534 generates a set signal S (=clock signal) which is pulse-driven at a predetermined switching period tsw.

The OR gate 535 generates a reset signal R by performing a logical OR operation on the comparison signal CMP and the overcurrent detection signal Socp. When at least one of the comparison signal CMP and the overcurrent detection signal Socp are high, the reset signal R is high (=logic level at the time of resetting). On the other hand, when both the comparison signal CMP and the overcurrent detection signal Socp are low, the reset signal R is low (=logic level when resetting is cancelled).

In other words, when the overcurrent detection signal Socp is low (=logic level when no overcurrent is detected), the comparison signal CMP is output as the reset signal R without being processed. On the other hand, when the overcurrent detection signal Socp is high (=logic level when an overcurrent is detected), the reset signal R is fixed at a high level (=logic level at the time of resetting) without depending on the logic level of the comparison signal CMP.

The RS flip-flop 536 determines the logic level of the gate control signal S0 according to the set signal S and the reset signal R. For example, when the set signal S is turned high, the RS flip-flop 536 sets the gate control signal S0 high (=logic level for bringing the output transistor M1 into an on state). On the other hand, when the reset signal R is turned low, the RS flip-flop 536 resets the gate control signal S0 low (=logic level for bringing the output transistor M1 into an off state). The overcurrent protection circuit 510 is provided in the primary circuit system 400*p* (in particular, the controller chip 410).

The self-diagnosis circuit B sets the overcurrent protection circuit 510 to the diagnostic target. With reference to the figure, the self-diagnosis circuit B includes a logic B1 and switches B2 and B3.

The logic B1 controls the switches B2 and B3. The switch B2 is connected between the non-inverting input terminal (+) of the comparator 511 and the application end of the test voltage. The test voltage may be a voltage (for example, the power supply voltage VCC1) outside the normal input range of the comparator 511. The switch B3 is connected between the non-inverting input terminal (+) of the comparator 511 and the application end of the sense voltage Vsns.

At the time of BIST, the logic B1 brings the switch B2 into an on state and brings the switch B3 into an off state. Hence, at the time of BIST, the test voltage (=power supply voltage VCC1) is applied to the non-inverting input terminal (+) of the comparator 511. On the other hand, at the time of non-BIST, the logic B1 brings the switch B2 into an off state and brings the switch B3 into an on state. Hence, at the time of non-BIST, the sense voltage Vsns is applied to the non-inverting input terminal (+) of the comparator 511.

The logic B1 monitors the overcurrent detection signal Socp at the time of BIST in the overcurrent protection circuit 510 to diagnose whether the comparator 511 is normal. Then, the logic B1 outputs the self-diagnosis output signal BISTOUT according to the result of BIST. The self-diagnostic operation as described above is the same as in the first embodiment described previously (FIG. 12 to FIG. 14).

<Abnormality Protection Operation>

Figure 17:
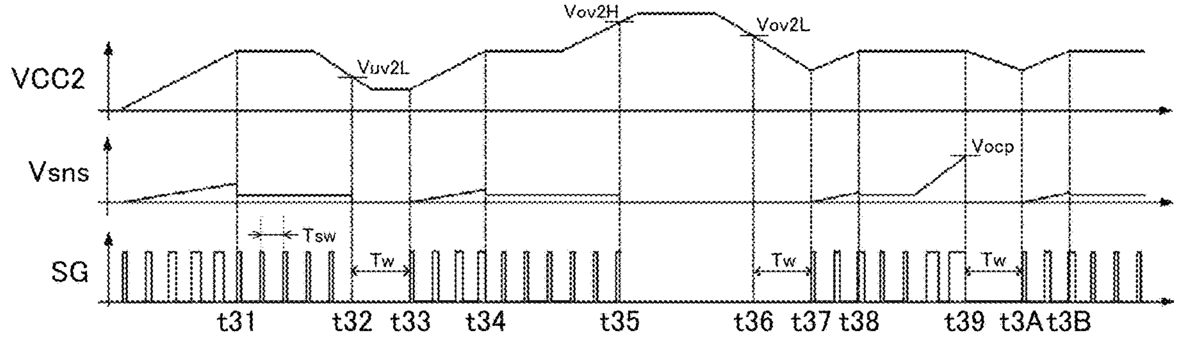
FIG. 17 is a diagram showing an abnormality protection operation performed by the power supply circuit.

FIG. 17 is a diagram showing an abnormality protection operation performed by the power supply circuit 500. The figure shows, sequentially from above, the power supply voltage VCC2, the sense voltage Vsns and the gate drive signal SG.

At time t31, the startup of the power supply voltage VCC2 (=output voltage VOUT) is completed. When the power supply voltage VCC2 is started, the soft start operation is performed by the overcurrent protection circuit 510 (details of which will be described later).

When at time t32, the power supply voltage VCC2 (=output voltage VOUT) falls below a low voltage detection threshold value Vuv2L, the output transistor M1 is forcibly brought into an off state. Here, the counting of the waiting time Tw (>Tsw) is started.

At time t33, since the counting of the waiting time Tw is completed, the switching control on the output transistor M1 is restarted, and the power supply voltage VCC2 is restarted.

At time t34, the restarting of the power supply voltage VCC2 (=output voltage VOUT) is completed. When the power supply voltage VCC2 is restarted after the cancellation of a low voltage protection operation, the soft start operation is also performed by the overcurrent protection circuit 510.

When at time t35, the power supply voltage VCC2 (=output voltage VOUT) exceeds an overvoltage detection threshold value Vov2H, the output transistor M1 is forcibly brought into an off state.

When at time t36, the power supply voltage VCC2 (=output voltage VOUT) falls below an overvoltage cancellation threshold value Vov2L (<Vov2H), the counting of the waiting time Tw is started.

At time t37, since the counting of the waiting time Tw is completed, the switching control on the output transistor M1 is restarted, and the power supply voltage VCC2 is restarted.

At time t38, the restarting of the power supply voltage VCC2 (=output voltage VOUT) is completed. When the power supply voltage VCC2 is restarted after the cancellation of an overvoltage protection operation, the soft start operation is also performed by the overcurrent protection circuit 510.

When at time t39, the primary current Ip is increased, and thus the sense voltage Vsns exceeds the threshold voltage Vocp, the output transistor M1 is forcibly brought into an off state. Here, the counting of the waiting time Tw is started. The fact that the sense voltage Vsns exceeds the threshold voltage Vocp means that the primary current Ip exceeds the overcurrent detection value Iocp.

At time t3A, since the counting of the waiting time Tw is completed, the switching control on the output transistor M1 is restarted, and the power supply voltage VCC2 is restarted.

At time t3B, the restarting of the power supply voltage VCC2 (=output voltage VOUT) is completed. When the power supply voltage VCC2 is restarted after the cancellation of an overcurrent protection operation, the soft start operation is also performed by the overcurrent protection circuit 510.

As described above, when the primary current Ip exceeds the overcurrent detection value Iocp after the start or the restart of the power supply voltage VCC2 (=output voltage VOUT), the overcurrent protection circuit 510 performs an off-latch type overcurrent protection operation so as to forcibly turn off the primary current Ip until the waiting time Tw longer than the switching period tsw of the primary current Ip has elapsed.

<Soft Start Operation>

Figure 18:
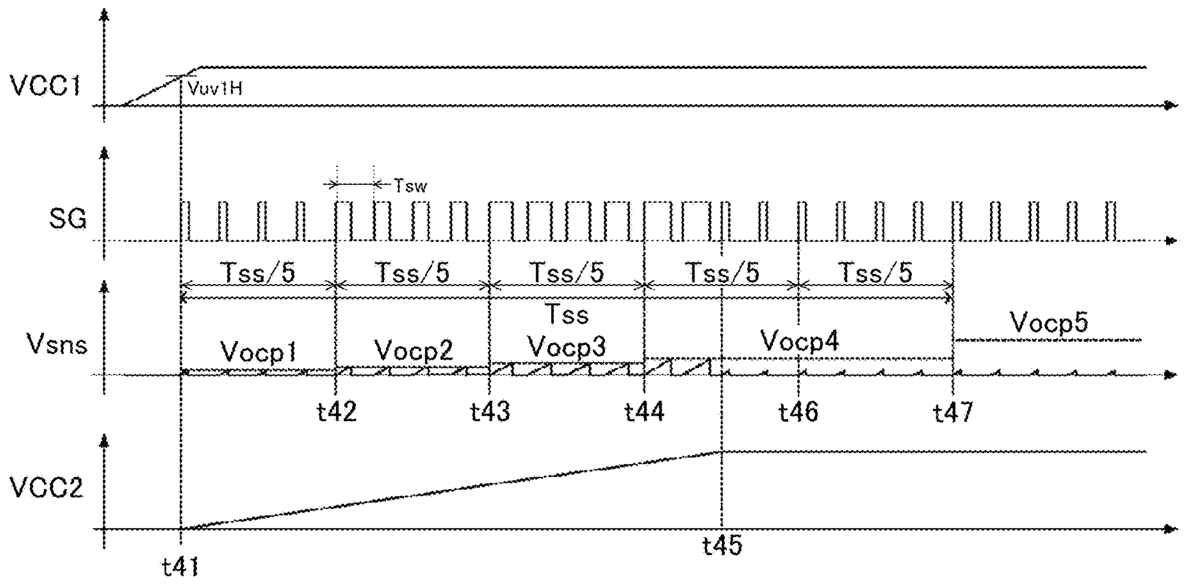
FIG. 18 is a diagram showing a soft start operation performed by the power supply circuit.

FIG. 18 is a diagram showing the soft start operation performed by the power supply circuit 500. The figure shows, sequentially from above, the power supply voltage VCC1, the gate drive signal SG, the sense voltage Vsns and the power supply voltage VCC2.

When at time t41, the power supply voltage VCC1 exceeds a low voltage cancellation threshold value Vuv1H, the switching control on the gate drive signal SG is started. Consequently, the power supply voltage VCC2 (=output voltage VOUT) starts to increase.

At time t41, the counting of the soft start period Tss (for example, 12.5 ms) is started. With reference to the figure, times t41 to t47 correspond to the soft start period Tss.

Here, the overcurrent protection circuit 510 stepwise increases the threshold voltage Vocp (hence, the overcurrent detection value Iocp) over the soft start period Tss.

For example, between times t41 and t42, the threshold voltage Vocp is set to the lowest first setting value Vocp1. The first setting value Vocp1 may be set to 40 mV. Times t41 to t42 may be set to one fifth of the soft start period Tss.

Between times t42 and t43, the threshold voltage Vocp is set to a second setting value Vocp2 which is one step higher than the first setting value Vocp1. The second setting value Vocp2 may be set to 60 mV. Times t42 to t43 may be set to one fifth of the soft start period Tss.

Between times t43 and t44, the threshold voltage Vocp is set to a third setting value Vocp3 which is one step higher than the second setting value Vocp2. The third setting value Vocp3 may be set to 80 mV. Times t43 to t44 may be set to one fifth of the soft start period Tss.

In each of a period between times t44 and t46 and a period between times t46 and t47, the threshold voltage Vocp is set to a fourth setting value Vocp4 which is one step higher than the third setting value Vocp3. The fourth setting value Vocp4 may be set to 100 mV. Each of the period between times t44 and t46 and the period between times t46 and t47 may be set to one fifth of the soft start period Tss.

After time t47 when the counting of the soft start period Tss is completed, the threshold voltage Vocp is set to a fifth setting value Vocp5 which is one step higher than the fourth setting value Vocp4. The fifth setting value Vocp5 may be set to 200 mV. The fifth setting value Vocp5 is set as necessary with consideration given to the normal range of the primary current Ip flowing through the power supply circuit 500 during normal operation.

When the sense voltage Vsns exceeds the threshold voltage Vocp during the startup of the power supply voltage VCC2 (=output voltage VOUT), that is, before the elapse of the soft start period Tss, the overcurrent protection circuit 510 performs a hiccup type overcurrent protection operation so as to forcibly turn off the primary current Ip until the subsequent on timing in the switching period tsw of the primary current Ip.

In the overcurrent protection operation described above, the switching control on the primary current Ip is performed such that the primary current Ip is gradually increased. Consequently, the power supply voltage VCC2 (=output voltage VOUT) is gradually increased over a period between times t41 and t45.

As described above, in the power supply circuit 500 of the present embodiment, the soft start operation of the power supply voltage VCC2 (=output voltage VOUT) can be realized without the power supply voltage VCC2 (=output voltage VOUT) generated by the driver chip 420 being directly monitored by the controller chip 410.

The soft start operation can be performed not only when the power supply voltage VCC2 (=output voltage VOUT) is started but also when the power supply voltage VCC2 (=output voltage VOUT) is restarted after the cancellation of the abnormality protection operation (see times t33 to t34, times t36 to t37 and times t39 to t3A in FIG. 17 described above).

<Considerations on Self-Diagnosis Sequence>

When the overcurrent protection circuit 510 incorporated in the power supply circuit 500 is not operated normally, an excessive primary current Ip continues to flow through the output transistor M1, with the result that heat generation, and a failure may occur in the output transistor M1. It is also likely that the soft start operation described above is not performed properly, thus an excessive inrush current flows when the power supply voltage VCC2 (=output voltage VOUT) is started or restarted and consequently, the capacitor C1 is broken.

Hence, it is desirable to provide a safety design which prevents the startup of the power supply circuit 500 when the overcurrent protection circuit 510 is not operated normally. More specifically, it is desirable to include the overcurrent protection circuit 510 in the diagnostic targets.

However, the output voltage VOUT generated in the power supply circuit 500 is utilized as the power supply voltage VCC2 of the secondary circuit system 400*s*. Hence, during the operation of the signal transmission device 400, the power supply circuit 500 also needs to be constantly operated. Therefore, the timing at which the overcurrent protection circuit 510 can be diagnosed by the self-diagnosis circuit B is limited to a state where the power supply circuit 500 is stopped, that is, a timing immediately after the startup of the power supply voltage VCC1.

In the first embodiment (FIG. 13 and FIG. 14) described above, the self-diagnostic operation is performed in a state (RDY=H) where both the power supply voltages VCC1 and VCC2 have been started up. However, for the reason described above, it is difficult to apply the self-diagnosis sequence in the first embodiment (FIG. 13 and FIG. 14) to the second embodiment without the self-diagnosis sequence being processed.

In view of the considerations described above, a self-diagnosis sequence suitable for the second embodiment (FIG. 15) will be proposed below.

<Self-Diagnostic Operation (Second Embodiment)>

Figure 19:
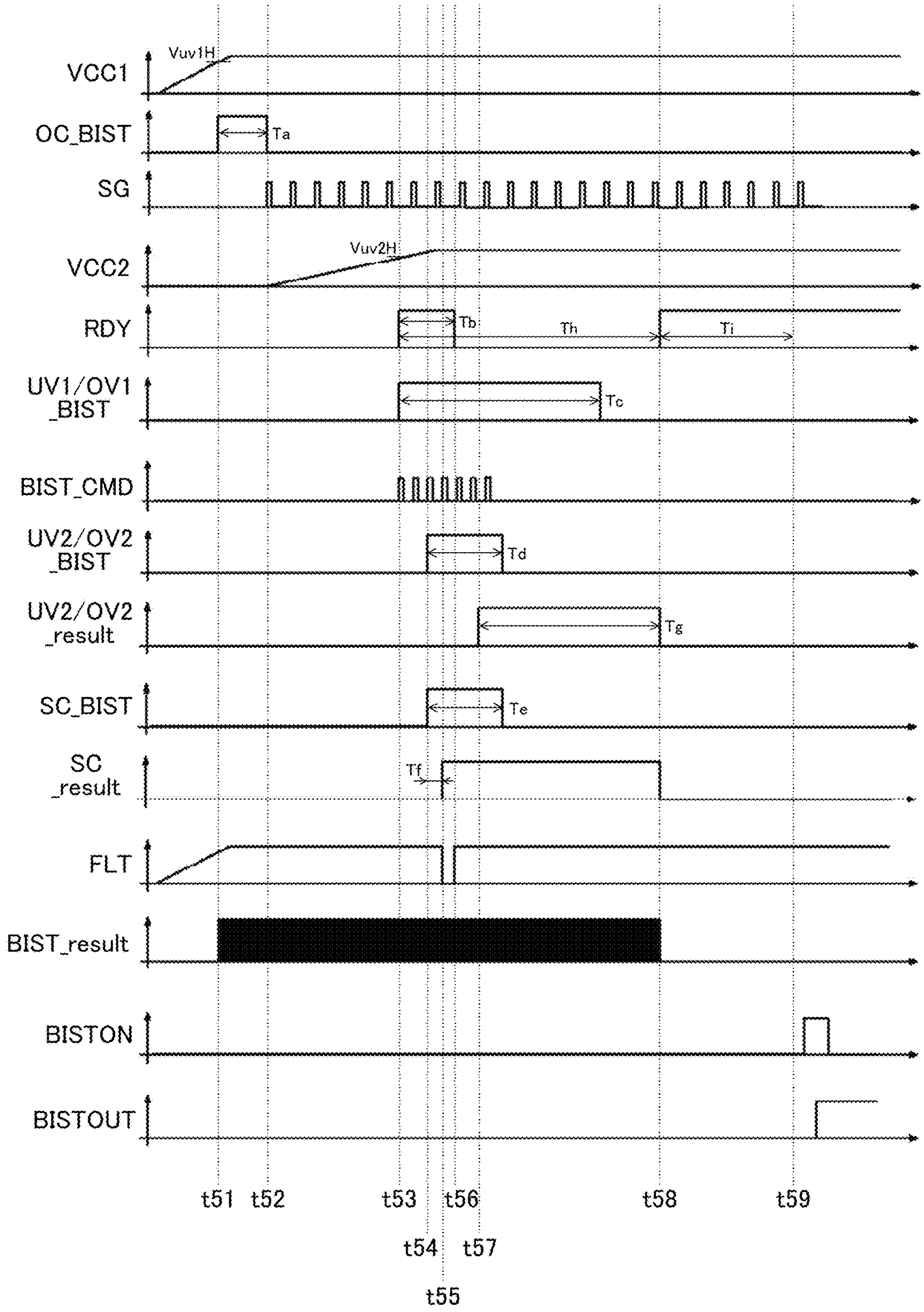
FIG. 19 is a diagram (time chart) showing an example of a self-diagnostic operation in the second embodiment.

FIG. 19 is a diagram (time chart) showing an example of a self-diagnostic operation in the second embodiment. The figure shows, sequentially from above, the power supply voltage VCC1, a BIST execution signal (OC_BIST) of the overcurrent protection circuit 510, the gate drive signal SG, the power supply voltage VCC2, the ready signal RDY, a BIST execution signal (UV1/OV1_BIST) of the UVLO/OVLO circuit 412, a self-diagnosis command (BIST_CMD) for the driver chip 420, a BIST execution signal (UV2/OV2_BIST) and a BIST result signal (UV2/OV2_result) of the UVLO/OVLO circuit 422, a BIST execution signal (SC_BIST) and a BIST result signal (SC_result) of the comparator 424 for short circuit detection, the fault signal FLT, a BIST result signal BIST_result, the self-diagnosis on signal BISTON and the self-diagnosis output signal BISTOUT.

When at time t51, the power supply voltage VCC1 exceeds the low voltage cancellation threshold value Vuv1H, the BIST execution signal (OC_BIST) of the overcurrent protection circuit 510 is turned from low to high. In this way, the self-diagnosis circuit B first performs, among a plurality of diagnostic targets, the self-diagnosis on the overcurrent protection circuit 510 which is one of the power supply abnormality detection units.

As the self-diagnostic operation of the overcurrent protection circuit 510, in a state where the test voltage (for example, the power supply voltage VCC1) is applied to the comparator 511, whether the overcurrent detection signal Socp as expected is output is preferably checked. The self-diagnostic operation of the overcurrent protection circuit 510 may be performed over a predetermined time Ta (for example, 50 μs).

When the result of the self-diagnosis performed by the overcurrent protection circuit 510 is OK, at time t52, the switching control on the gate drive signal SG is started. Here, the overcurrent protection circuit 510 performs the soft start operation described above. Hence, the power supply voltage VCC2 (=output voltage VOUT) generated by the power supply circuit 500 is gradually increased.

When at time t53, the power supply voltage VCC2 (=output voltage VOUT) exceeds a low voltage cancellation threshold value Vuv2H, the ready signal RDY is turned from low to high (=state where the ready signal RDY has a high impedance). After a predetermined time Tb (for example, 10 μs) has elapsed, the ready signal RDY may be turned from high to low at time t56.

At time t53, the rising edge of the ready signal RDY is used as a trigger to turn the BIST execution signal (UV1/OV1_BIST) of the UVLO/OVLO circuit 412 from low to high. In this way, the self-diagnosis circuit B performs the self-diagnosis on the UVLO/OVLO circuit 412 among a plurality of diagnostic targets. The self-diagnostic operation of the UVLO/OVLO circuit 412 may be performed over a predetermined time Tc (for example, 70 μs).

Furthermore, at time t53, the rising edge of the ready signal RDY is used as a trigger to pulse-drive, at a predetermined frequency (for example, 1 MHz), the self-diagnosis command (BIST_CMD) transmitted from the controller chip 410 to the driver chip 420. A configuration may be adopted in which if the result of the self-diagnosis performed by the overcurrent protection circuit 510 is not OK, the self-diagnosis command (BIST_CMD) to be transmitted to the driver chip 420 is not transmitted from the controller chip 410. The self-diagnosis command (BIST_CMD) corresponds to the pulse signal S411*c* described previously (FIG. 12).

At time t54, based on the self-diagnosis command (BIST_CMD) transmitted from the controller chip 410 to the driver chip 420, the BIST execution signal (UV2/OV2_BIST) of the UVLO/OVLO circuit 422 is turned from low to high. In this way, the self-diagnosis circuit B performs the self-diagnosis on the UVLO/OVLO circuit 422 among a plurality of diagnostic targets. The self-diagnostic operation of the UVLO/OVLO circuit 422 may be performed over a predetermined time Td (for example, 30 μs).

At time t54, based on the self-diagnosis command (BIST_CMD) transmitted from the controller chip 410 to the driver chip 420, the BIST execution signal (SC_BIST) of the comparator 424 for short circuit detection is turned from low to high. In this way, the self-diagnosis circuit B performs the self-diagnosis on the comparator 424 among a plurality of diagnostic targets. The self-diagnostic operation of the comparator 424 for short circuit detection may be performed over a predetermined time Te (for example, 30 μs).

When a predetermined time Tf (for example, 0.5 μs) has elapsed since the start of the self-diagnostic operation on the comparator 424 for short circuit detection, the BIST result signal (SC_result) is transmitted from the driver chip 420 to the controller chip 410.

Here, if the fault signal FLT is turned low (=logic level when an abnormality is detected) as expected, it is diagnosed that the signal transmission path (transformers TR1, TR2 and TR4) along which the result of the detection of an abnormality in the driver chip 420 is transmitted to the controller chip 410 is normal. The fault signal FLT may be turned from low to high at time t56 when the ready signal RDY is turned low.

When a predetermined time Tg has elapsed since the start of the self-diagnostic operation on the UVLO/OVLO circuit 422, the BIST result signal (UV2/OV2_result) is transmitted from the driver chip 420 to the controller chip 410 at time t57.

When a predetermined time Th (for example, 100 μs) has elapsed since the start of the self-diagnostic operation on the unit other than the overcurrent protection circuit 510, the results of the self-diagnosis which have been obtained so far are stored in the BIST result signal BIST_result. In a plurality of comparators which are set to the diagnostic targets, the inputs thereof are switched such that the original monitoring target voltages (such as the sense voltage Vsns) are applied instead of the test voltages. The rising edge of the ready signal RDY is ignored such that the self-diagnostic operation is not started again.

When a predetermined time Ti (for example, 100 μs) has further elapsed after time t58, the series of steps in the self-diagnostic operation described above are completed. Then, when the self-diagnosis on signal BISTON is turned high at an arbitrary timing, the result of the self-diagnosis at that time is latched and is output as the self-diagnosis output signal BISTOUT. Here, when the result of the self-diagnosis is not good, BISTOUT=L whereas when the result of the self-diagnosis is OK, BISTOUT=HiZ.

In summary, in the self-diagnosis sequence in the second embodiment, the self-diagnosis on the overcurrent protection circuit 510 is first performed. Then, when the result of the diagnosis on the overcurrent protection circuit 510 is OK, the diagnosis is sequentially performed on the units other than the overcurrent protection circuit 510 (the UVLO/OVLO circuit 412, the UVLO/OVLO circuit 422, the comparator 424 for short circuit detection and the signal transmission path from the driver chip 420 to the controller chip 410), and the results of the diagnosis thereof are stored.

As described above, the self-diagnosis circuit B preferably allows the operation of the power supply circuit 500 after diagnosing that the overcurrent protection circuit 510 is normal, and starts the diagnosis on the units other than the overcurrent protection circuit 510.

During the self-diagnostic operation, the function of the forced stop of the output transistor M1 using the detection of UV1 is preferably masked. Moreover, during the self-diagnostic operation, the function of the forced stop of a soft start clock using the detection of UV1 is preferably masked.

Figure 20:
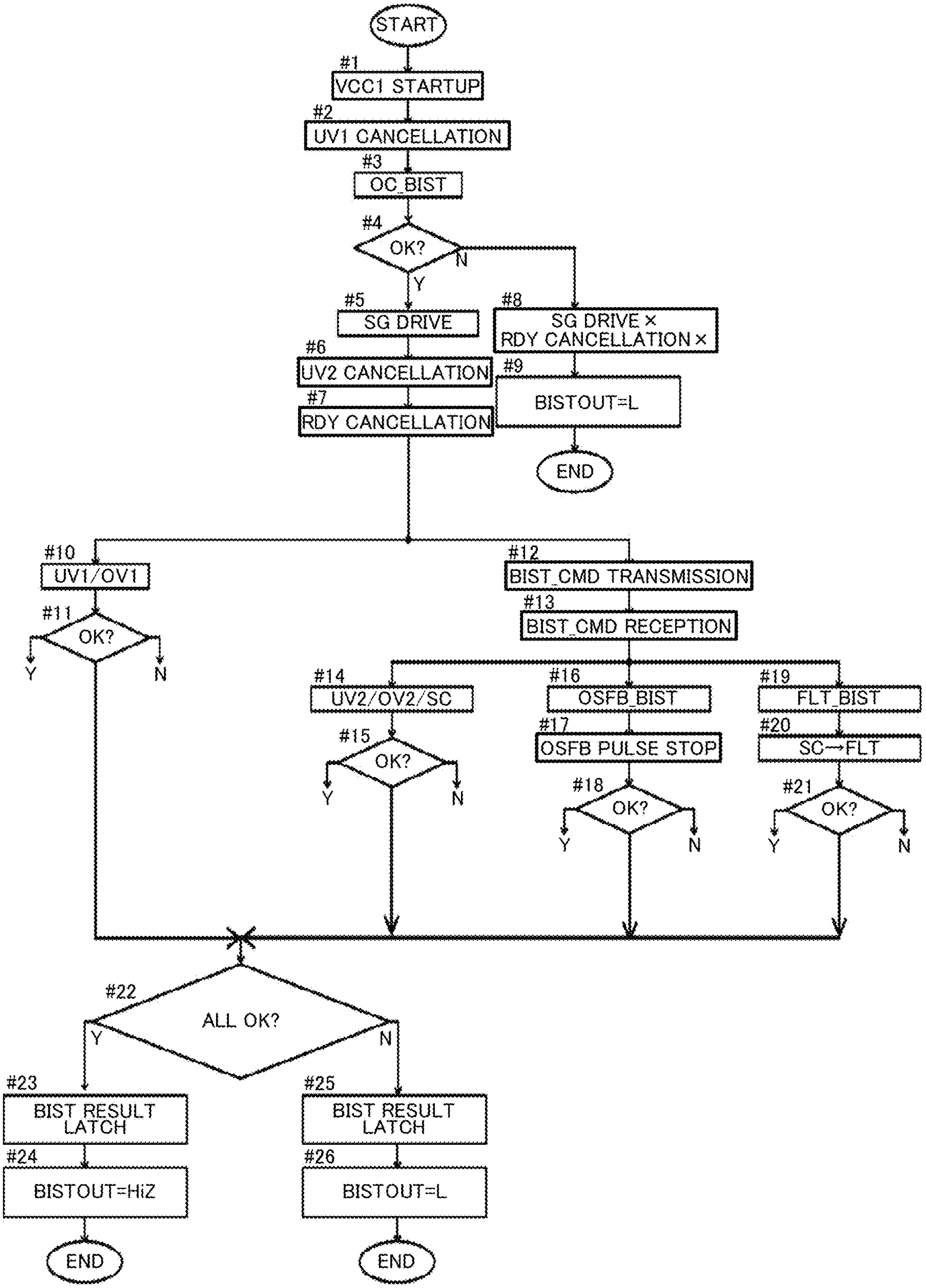
FIG. 20 is a diagram (flowchart) showing an example of the self-diagnostic operation in the second embodiment.

FIG. 20 is a diagram (flowchart) showing an example of the self-diagnostic operation in the second embodiment. In step #1, the power supply voltage VCC1 is started, and thereafter, when in step #2, the power supply voltage VCC1 exceeds the low voltage cancellation threshold value Vuv1H, in step #3, the self-diagnostic operation of the overcurrent protection circuit 510 is started.

In step #4, whether the result of the diagnosis on the overcurrent protection circuit 510 is OK is determined. Here, when a determination of yes is made, the flow proceeds to step #5. On the other hand, when a determination of no is made, the flow proceeds to step #8.

When the determination of yes is made in step #4, in step #5, the switching control on the gate drive signal SG is started. Consequently, the power supply voltage VCC2 is gradually increased. Thereafter, when in step #6, the power supply voltage VCC2 exceeds the low voltage cancellation threshold value Vuv2H, in step #7, the ready signal RDY is turned high.

On the other hand, when the determination of no is made in step #4, in step #8, the switching control on the gate drive signal SG is not allowed, and thus the ready signal RDY is kept at a low level. Then, in step #9, the self-diagnosis output signal BISTOUT is turned low (=logic level when the result of diagnosis is not good), the series of steps in the self-diagnostic operation are completed.

When in step #7 described above, the ready signal RDY is turned high, the flow proceeds to step #10. In step #10, the self-diagnostic operation on the UVLO/OVLO circuit 412 is started.

Then, in step #11, whether the result of the diagnosis on the UVLO/OVLO circuit 412 is OK is determined. Here, when a determination of yes is made, a BIST result signal (UV1_BIST=OV1_BIST=H) indicating that the diagnosis is OK is acquired. On the other hand, when a determination of no is made, a BIST result signal (UV1_BIST=L or OV1_BIST=L) indicating that the diagnosis is not good is acquired. After the completion of step #11, the flow proceeds to step #22.

When in step #7 described above, the ready signal RDY is turned high, the flow proceeds to step #12. In step #12, the controller chip 410 transmits the self-diagnosis command (BIST_CMD) to the driver chip 420. Then, in step #13, the self-diagnosis command (BIST_CMD) transmitted from the controller chip 410 is received by the driver chip 420.

When in step #13, the driver chip 420 receives the self-diagnosis command (BIST_CMD), in step #14, the self-diagnostic operation on the UVLO/OVLO circuit 422 and the self-diagnostic operation on the comparator 424 for short circuit detection are started.

Then, in step #15, whether the result of the diagnosis on the UVLO/OVLO circuit 422 and the result of the diagnosis on the comparator 424 for short circuit detection are OK is determined. Here, when a determination of yes is made, a BIST result signal (DRV_BIST=H) indicating that the diagnosis is OK is acquired. On the other hand, when a determination of no is made, a BIST result signal (DRV_BIST=L) indicating that the diagnosis is not good is acquired. After the completion of step #15, the flow proceeds to step #22.

When in step #13 described above, the driver chip 420 receives the self-diagnosis command (BIST_CMD), in step #16, the self-diagnostic operation on an OSFB signal transmission path is started. The OSFB signal transmission path is a signal transmission path for transmitting the result of the detection of an abnormality in the UVLO/OVLO circuit 422 from the driver chip 420 to the controller chip 410. In the self-diagnostic operation on the OSFB signal transmission path, an OSFB pulse is stopped in step #17.

Then, in step #18, whether the result of the diagnosis on the OSFB signal transmission path is OK is determined. Here, when a determination of yes is made, a BIST result signal (OSFB_BIST=H) indicating that the diagnosis is OK is acquired. On the other hand, when a determination of no is made, a BIST result signal (OSFB_BIST=L) indicating that the diagnosis is not good is acquired. After the completion of step #18, the flow proceeds to step #22.

When in step #13 described above, the driver chip 420 receives the self-diagnosis command (BIST_CMD), in step #19, the self-diagnostic operation on an FLT signal transmission path is started. The FLT signal transmission path is a signal transmission path for transmitting the result of the detection of an abnormality in the comparator 424 for short circuit detection from the driver chip 420 to the controller chip 410. In the self-diagnostic operation on the FLT signal transmission path, in step #20, the comparator 424 is intentionally brought into a short circuit detection state (=state where the fault signal FLT needs to be turned low).

Then, in step #21, whether the result of the diagnosis on the FLT signal transmission path is OK is determined. Here, when a determination of yes is made, a BIST result signal (FLT_BIST=H) indicating that the diagnosis is OK is acquired. On the other hand, when a determination of no is made, a BIST result signal (FLT_BIST=L) indicating that the diagnosis is not good is acquired. After the completion of step #21, the flow proceeds to step #22.

As described above, if the result of the diagnosis on the overcurrent protection circuit 510 is not OK, the self-diagnostic operation (steps #10, #14, #15 and #19) on the units other than the overcurrent protection circuit 510 is not performed.

After the series of steps in the self-diagnostic operation are performed, in step #22, whether all the results of the self-diagnosis are OK is determined. Here, when a determination of yes is made, the flow proceeds to step #23. On the other hand, when a determination of no is made, the flow proceeds to step #25.

When the determination of yes is made in step #22, in step #23, the results of the self-diagnosis (the diagnosis is OK) which have been obtained so far are latched. Then, in step #24, the self-diagnosis output signal BISTOUT is output according to the pulse input of the self-diagnosis on signal BISTON, and the series of steps in the self-diagnostic operation are completed. In step #24, the results of the self-diagnosis are OK, and thus BISTOUT=HiZ.

On the other hand, when the determination of no is made in step #22, in step #25, the results of the self-diagnosis (the diagnosis is not good) which have been obtained so far are latched. Then, in step #26, the self-diagnosis output signal BISTOUT is output according to the pulse input of the self-diagnosis on signal BISTON, and the series of steps in the self-diagnostic operation are completed. In step #26, the results of the self-diagnosis are not good, and thus BISTOUT=L.

<Application to Vehicle>

Figure 21:
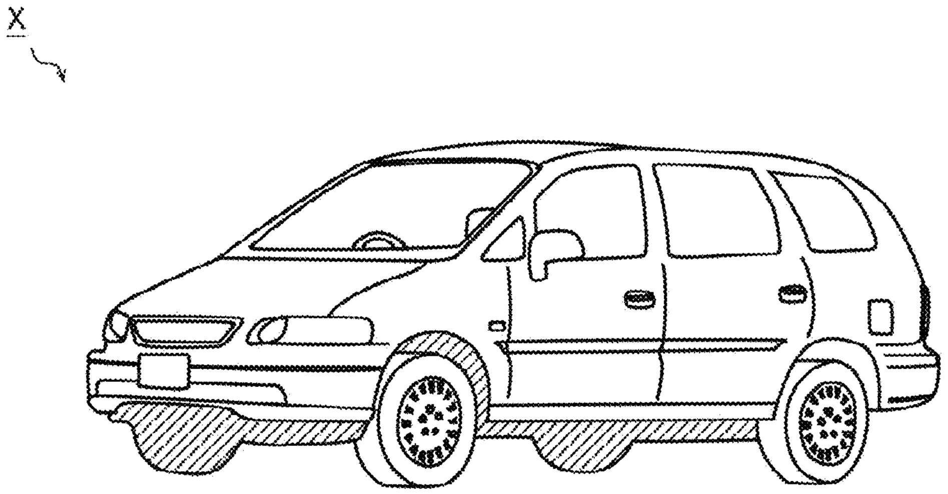
FIG. 21 is a diagram showing an appearance of a vehicle incorporating an electronic device.

FIG. 21 is a diagram showing an appearance of a vehicle. The vehicle X of the present configuration example incorporates various electronic devices which are operated by receiving power supply from a battery.

Examples of the vehicle X include not only engine vehicles but also electric vehicles (xEVs such as a BEV [battery electric vehicle], a HEV [hybrid electric vehicle], a PHEV/PHV [plug-in hybrid electric vehicle/plug-in hybrid vehicle] and an FCEV/FCV [fuel cell electric vehicle/fuel cell vehicle]).

The signal transmission device 200 or 400 described above can be installed in any one of the electronic devices incorporated in the vehicle X.

<Additional Notes>

An overall description will be given below of the various embodiments described above.

For example, a signal transmission device disclosed in the present specification includes: a signal transmission circuit configured to transmit a pulse signal from a primary circuit system to a secondary circuit system while isolating between the primary circuit system and the secondary circuit system; a power supply circuit configured to generate an output voltage of the secondary circuit system from an input voltage of the primary circuit system while isolating between the primary circuit system and the secondary circuit system; a first abnormality detection circuit configured to detect an abnormality in the primary circuit system; a second abnormality detection circuit configured to detect an abnormality in the secondary circuit system; a signal transmission path configured to transmit a result of the detection performed by the second abnormality detection circuit from the secondary circuit system to the primary circuit system while isolating between the primary circuit system and the secondary circuit system; and a self-diagnosis circuit configured to perform self-diagnosis on each of the first abnormality detection circuit, the second abnormality detection circuit and the signal transmission path, the first abnormality detection circuit includes, as a diagnostic target of the self-diagnosis circuit, a power supply abnormality detection unit configured to detect an abnormality in the power supply circuit and the self-diagnosis circuit first performs the self-diagnosis on the power supply abnormality detection unit (first configuration). According to this configulation, a self-diagnosis function can be implemented in a signal transmission device in which an isolated power supply circuit is introduced.

In the signal transmission device of the first configuration, the self-diagnosis circuit may diagnose the power supply abnormality detection unit as normal to allow an operation of the power supply circuit, and start the diagnosis on units other than the power supply abnormality detection unit (second configuration).

In the signal transmission device of the first or second configuration, the power supply circuit may drive a primary current flowing through a primary coil of a transformer to induce a secondary voltage in a secondary coil of the transformer, and generate the output voltage from the secondary voltage (third configuration).

In the signal transmission device of the third configuration, the power supply abnormality detection unit may include an overcurrent protection circuit configured to restrict the primary current to an overcurrent detection value or less (fourth configuration).

In the signal transmission device of the fourth configuration, the overcurrent protection circuit may include a comparator configured to compare a sense voltage corresponding to the primary current and a predetermined threshold voltage to generate an overcurrent detection signal, and the self-diagnosis circuit may monitor the overcurrent detection signal in a state where a predetermined test voltage is input instead of the sense voltage to diagnose whether the comparator is normal (fifth configuration).

In the signal transmission device of the fourth or fifth configuration, the overcurrent protection circuit may increase the overcurrent detection value over a predetermined soft start period when the output voltage is started or restarted (sixth configuration).

In the signal transmission device of any one of the first to sixth configurations, the first abnormality detection circuit may include, as the diagnostic target of the self-diagnosis circuit: a first comparator configured to detect a low voltage abnormality in a first power supply voltage of the primary circuit system; and a second comparator configured to detect an overvoltage abnormality in the first power supply voltage, and the second abnormality detection circuit may include, as the diagnostic target of the self-diagnosis circuit: a third comparator configured to detect a low voltage abnormality in a second power supply voltage of the secondary circuit system; a fourth comparator configured to detect an overvoltage abnormality in the second power supply voltage; a fifth comparator configured to detect an overheating abnormality; and a sixth comparator configured to detect a short circuit abnormality (seventh configuration).

In the signal transmission device of any one of the first to seventh configurations, the signal transmission device may seal, in a single package: a first chip in which a circuit element in the primary circuit system is integrated; a second chip in which a circuit element in the secondary circuit system is integrated; and a third chip in which an isolation element isolating between the primary circuit system and the secondary circuit system is integrated (eighth configuration).

For example, an electronic device disclosed in the present specification may include: a power transistor; and a gate driver IC configured to drive a gate of the power transistor, and the gate driver IC may be the signal transmission device of any one of the first to eighth configurations (ninth configuration).

For example, a vehicle disclosed in the present specification may include: the electronic device of the ninth configuration (tenth configuration).

For example, a power supply circuit disclosed in the present specification includes: a feedback control circuit configured to control a switch output stage for generating an output voltage of a secondary circuit system from an input voltage of a primary circuit system while isolating between the primary circuit system and the secondary circuit system; and an overcurrent protection circuit configured to restrict a primary current of the switch output stage to a predetermined overcurrent detection value or less. The overcurrent protection circuit stepwise increases the overcurrent detection value over a soft start period when the output voltage is started or restarted (eleventh configuration). According to this configuration, a soft start function can be implemented in an isolated power supply circuit.

In the power supply circuit of the eleventh configuration, the switch output stage may drive the primary current flowing through a primary coil of a transformer to induce a secondary voltage in a secondary coil of the transformer, and generate the output voltage from the secondary voltage (twelfth configuration).

In the power supply circuit of the eleventh or twelfth configuration, the overcurrent protection circuit may include a comparator configured to compare a sense voltage corresponding to the primary current and a predetermined threshold voltage to generate an overcurrent detection signal, and stepwise increase the threshold voltage over the soft start period when the output voltage is started or restarted (thirteenth configuration).

In the power supply circuit of any one of the eleventh to thirteenth configurations, when the primary current exceeds the overcurrent detection value while the output voltage is being started or restarted, the overcurrent protection circuit may perform a hiccup type overcurrent protection operation so as to forcibly turn off the primary current until a subsequent on-timing in a switching period of the primary current (fourteenth configuration).

In the power supply circuit of the fourteenth configuration, when the primary current exceeds the overcurrent detection value after the output voltage is started or restarted, the overcurrent protection circuit may perform an off-latch type overcurrent protection operation so as to forcibly turn off the primary current until a waiting time longer than the switching period of the primary current has elapsed (fifteenth configuration).

The power supply circuit of any one of the eleventh to fifteenth configurations may further include a feedback signal generation circuit configured to generate a feedback signal having pulse information corresponding to the output voltage to output the feedback signal from the secondary circuit system to the primary circuit system, and the feedback control circuit may drive the primary current according to the feedback signal (sixteenth configuration).

For example, a signal transmission device disclosed in the present specification includes: the power supply circuit according to any one of the eleventh to sixteenth configurations; and a signal transmission circuit configured to transmit a pulse signal from the primary circuit system to the secondary circuit system while isolating between the primary circuit system and the secondary circuit system (seventeenth configuration).

In the signal transmission device of the seventeen configuration, the signal transmission device may seal, in a single package: a first chip in which a circuit element in the primary circuit system is integrated; a second chip in which a circuit element in the secondary circuit system is integrated; and a third chip in which an isolation element isolating between the primary circuit system and the secondary circuit system is integrated (eighteenth configuration).

For example, an electronic device disclosed in the present specification may include: a power transistor; and a gate driver IC configured to drive a gate of the power transistor, and the gate driver IC may be the signal transmission device of the eighteenth configuration (nineteen configuration).

For example, a vehicle disclosed in the present specification may include the electronic device of the nineteen configuration (twentieth configuration).

<Other Variations>

In addition to the embodiments described above, various changes can be made in various technical features disclosed in the present specification without departing from the spirit of the technical creation thereof. In other words, it should be considered that the embodiments are illustrative in all respects, and not restrictive, and it should be understood that the technical scope of the present invention is not limited to the embodiments, and includes all changes in meanings and a scope equivalent to the scope of claims.

The invention claimed is:

1. A power supply circuit comprising:

a feedback control circuit configured to control a switch output stage for generating an output voltage of a secondary circuit system from an input voltage of a primary circuit system while isolating between the primary circuit system and the secondary circuit system; and an overcurrent protection circuit configured to restrict a primary current of the switch output stage to a predetermined overcurrent detection value or less, wherein the overcurrent protection circuit stepwise increases the overcurrent detection value over a soft start period when the output voltage is started or restarted.

2. The power supply circuit according to claim 1, wherein the switch output stage drives the primary current flowing through a primary coil of a transformer to induce a secondary voltage in a secondary coil of the transformer and generates the output voltage from the secondary voltage.

3. The power supply circuit according to claim 1, wherein the overcurrent protection circuit includes a comparator configured to compare a sense voltage corresponding to the primary current and a predetermined threshold voltage to generate an overcurrent detection signal, and stepwise increases the threshold voltage over the soft start period when the output voltage is started or restarted.

4. The power supply circuit according to claim 1, wherein when the primary current exceeds the overcurrent detection value while the output voltage is being started or restarted, the overcurrent protection circuit performs a hiccup type overcurrent protection operation so as to forcibly turn off the primary current until a subsequent on-timing in a switching period of the primary current.

5. The power supply circuit according to claim 4, wherein when the primary current exceeds the overcurrent detection value after the output voltage is started or restarted, the overcurrent protection circuit performs an off-latch type overcurrent protection operation so as to forcibly turn off the primary current until a waiting time longer than the switching period of the primary current has elapsed.

6. The power supply circuit according to claim 1 further comprising:

a feedback signal generation circuit configured to generate a feedback signal having pulse information corresponding to the output voltage to output the feedback signal from the secondary circuit system to the primary circuit system, wherein the feedback control circuit drives the primary current according to the feedback signal.

7. A signal transmission device comprising:

the power supply circuit according to claim 1; and a signal transmission circuit configured to transmit a pulse signal from the primary circuit system to the secondary circuit system while isolating between the primary circuit system and the secondary circuit system.

8. The signal transmission device according to claim 7, wherein the signal transmission device seals, in a single package:

a first chip in which a circuit element in the primary circuit system is integrated;

a second chip in which a circuit element in the secondary circuit system is integrated; and a third chip in which an isolation element isolating between the primary circuit system and the secondary circuit system is integrated.

9. An electronic device comprising:

a power transistor; and a gate driver IC configured to drive a gate of the power transistor, wherein the gate driver IC is the signal transmission device according to claim 8.

10. A vehicle comprising:

the electronic device according to claim 9.

* * * * *